US008861279B2

(12) United States Patent
Hishida et al.

(10) Patent No.: US 8,861,279 B2
(45) Date of Patent: Oct. 14, 2014

(54) SEMICONDUCTOR STORAGE DEVICE

(75) Inventors: Tomoo Hishida, Kanagawa-ken (JP);
Yoshihisa Iwata, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 47 days.

(21) Appl. No.: 13/605,840

(22) Filed: Sep. 6, 2012

(65) Prior Publication Data

US 2013/0250676 A1    Sep. 26, 2013

(30) Foreign Application Priority Data

Mar. 22, 2012  (JP) ................ P2012-066236

(51) Int. Cl.
*G11C 11/34* (2006.01)

(52) U.S. Cl.
USPC .................. 365/185.2; 365/185.18

(58) Field of Classification Search
USPC .......................... 365/185.2, 185.18
See application file for complete search history.

(56) References Cited

U.S. PATENT DOCUMENTS

2005/0099844 A1 * 5/2005 Witcraft et al. ............... 365/158
2010/0155906 A1   6/2010 Lee et al.

FOREIGN PATENT DOCUMENTS

| JP | 7-83009 | 9/1995 |
|----|---------|--------|
| JP | 2008-277857 | 11/2008 |
| JP | 2010-153872 A | 7/2010 |

* cited by examiner

*Primary Examiner* — Huan Hoang
(74) *Attorney, Agent, or Firm* — Patterson & Sheridan, LLP

(57) ABSTRACT

A semiconductor storage device has a nonvolatile storage region, a voltage generating circuit that generates an operational voltage for the storage region, and a control circuit that sends the voltage generated by the voltage generating circuit to the storage region. The voltage generating circuit has a transistor, a first resistance element, a second resistance element, and a comparator. The first resistance element and the second resistance element have wiring structure for resistance. The resistance wiring in the wiring structure has the same line width as the finest line width in the wiring formed in the storage region.

18 Claims, 71 Drawing Sheets

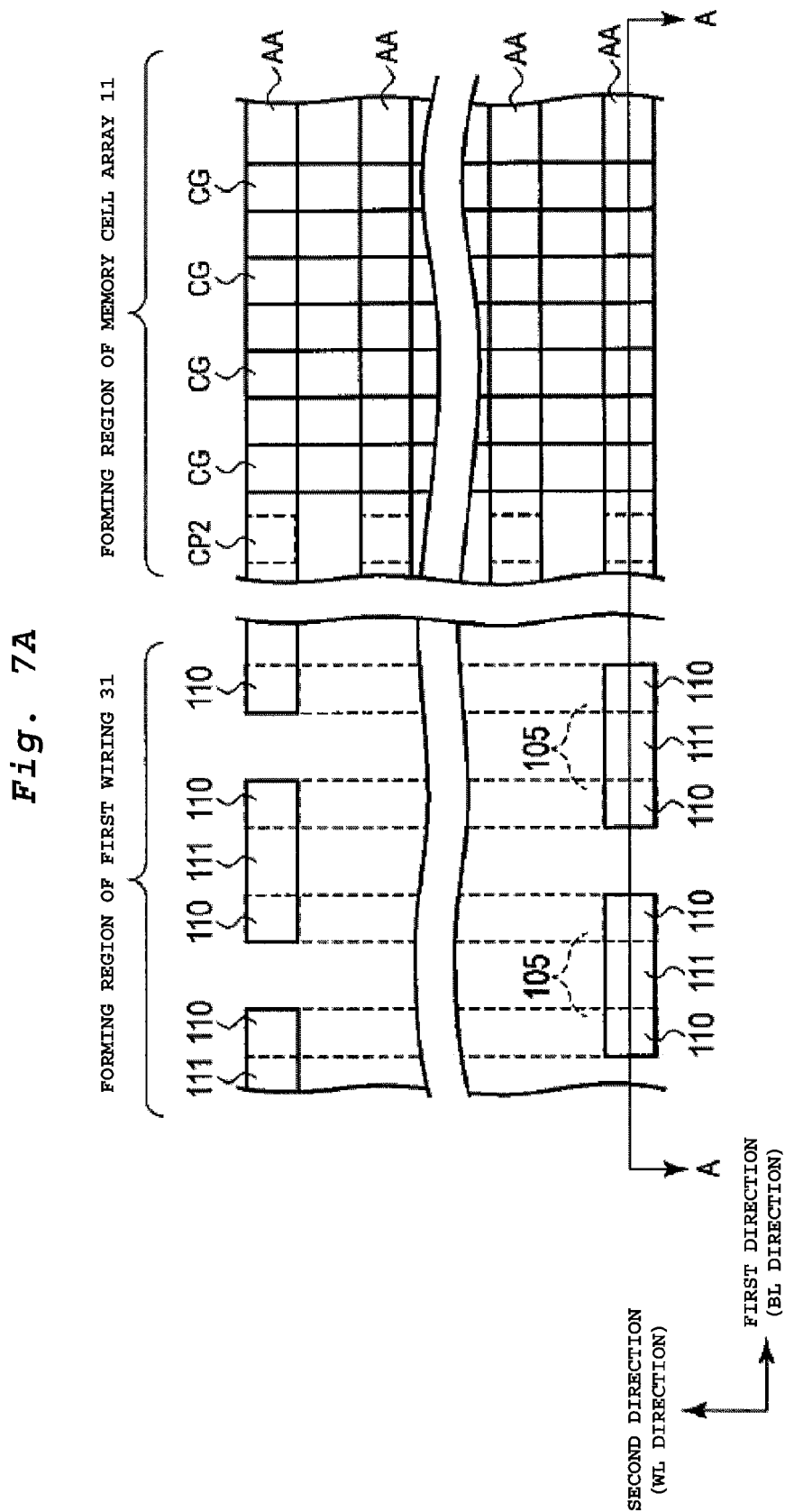

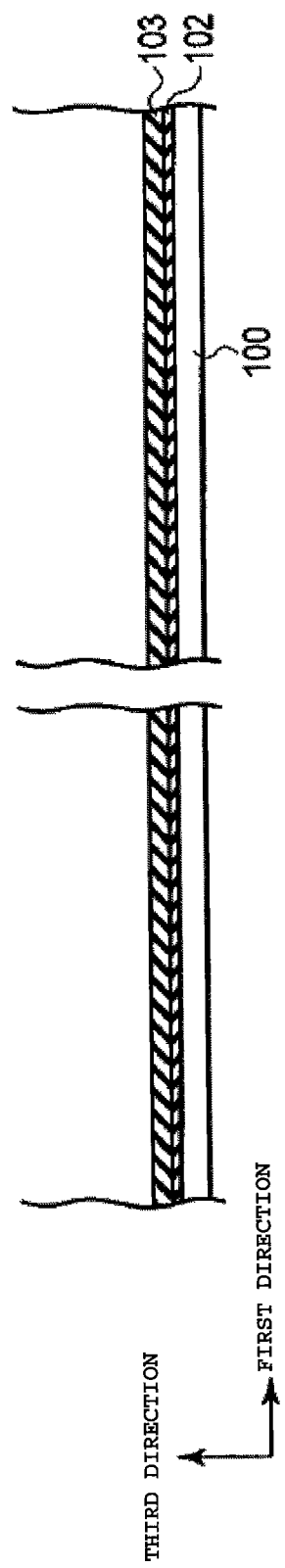

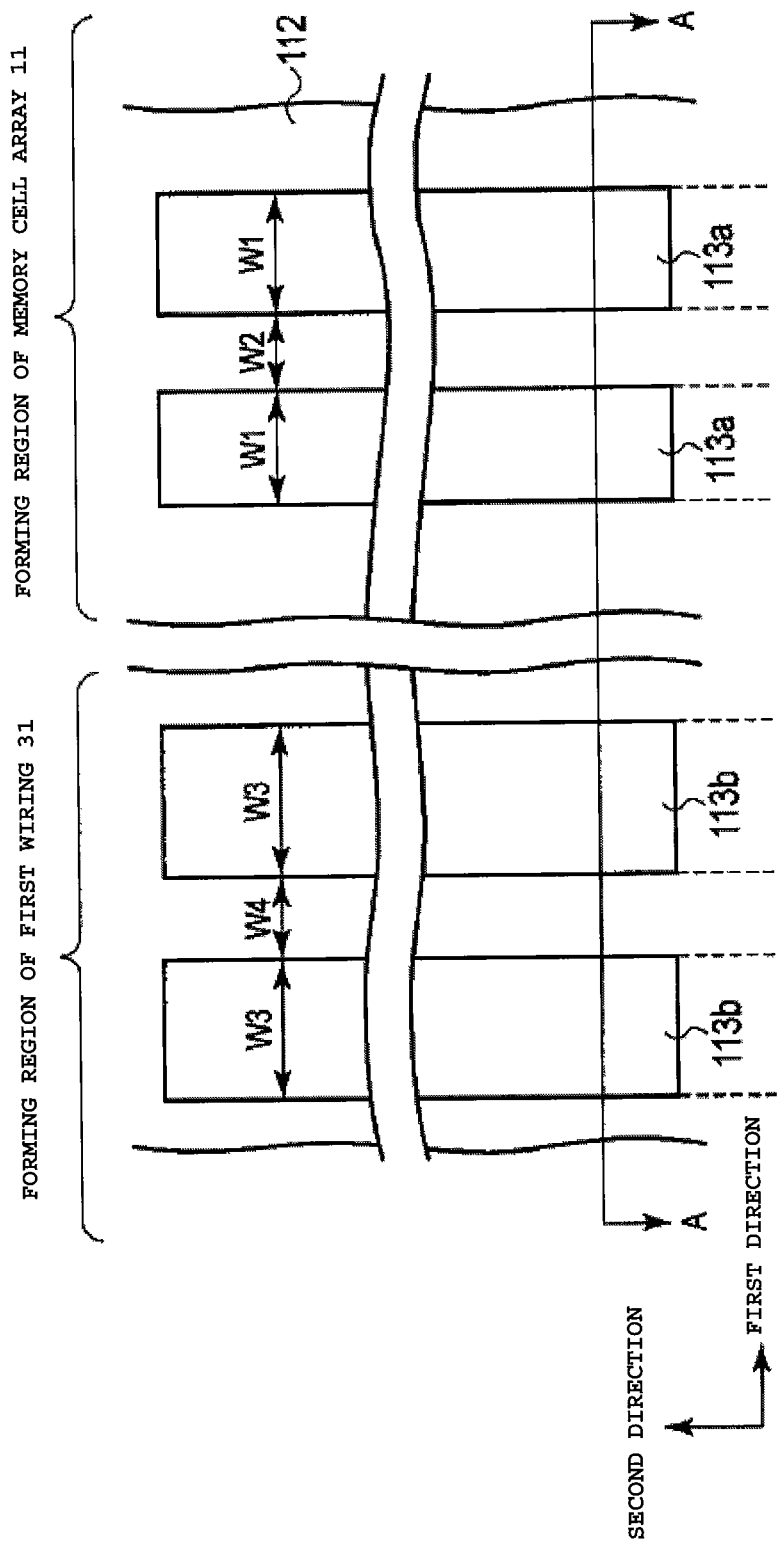

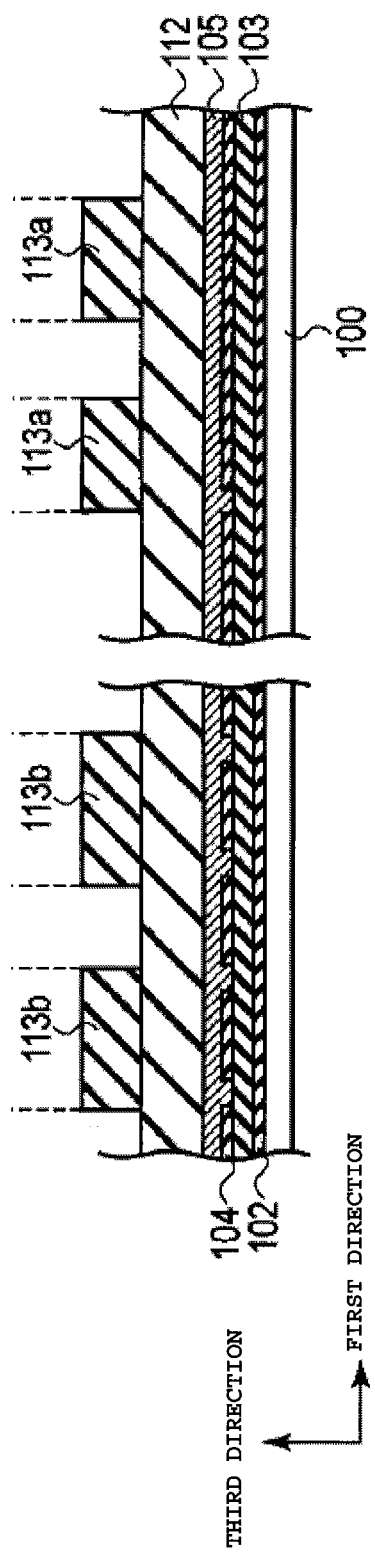

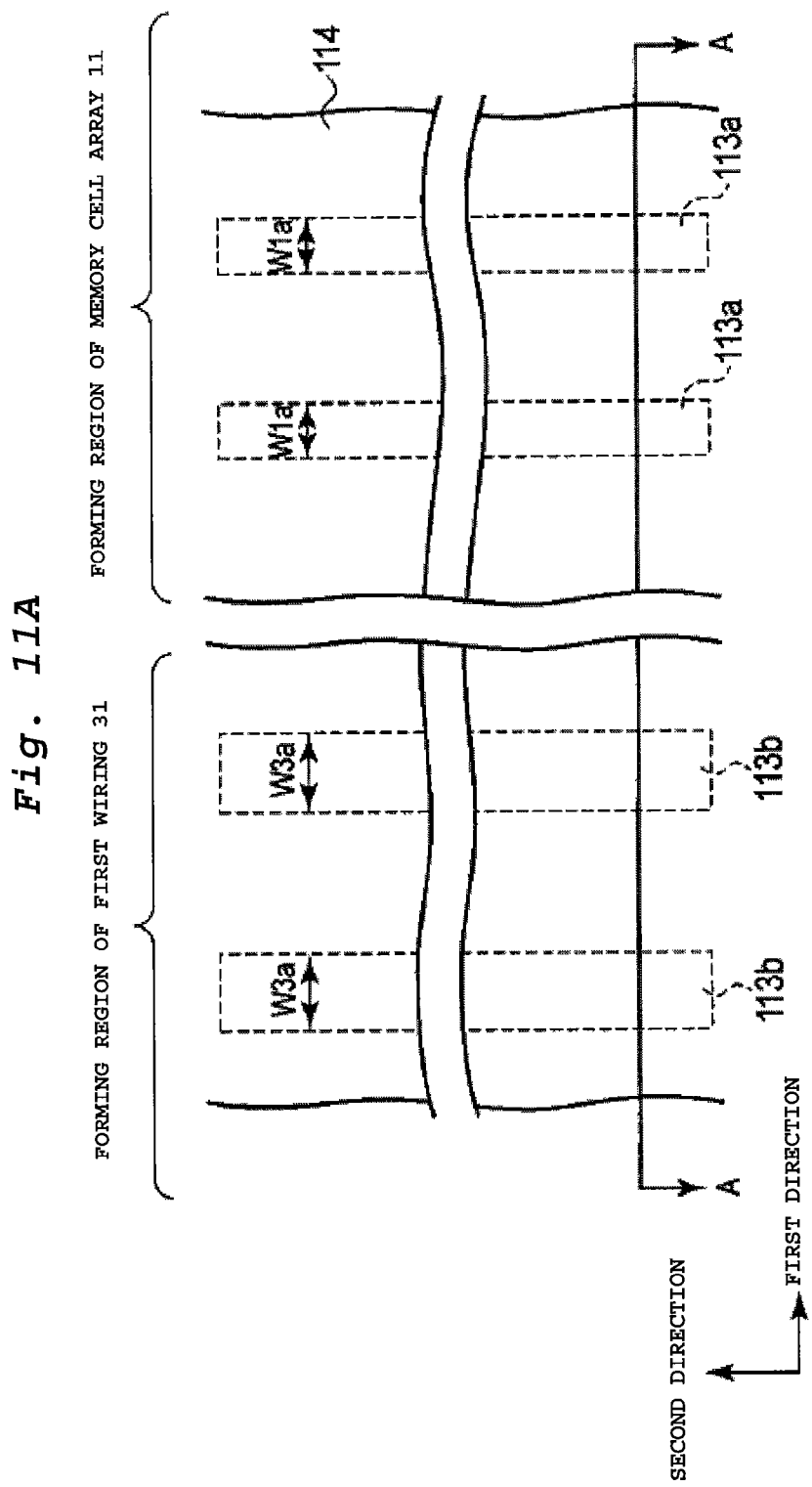

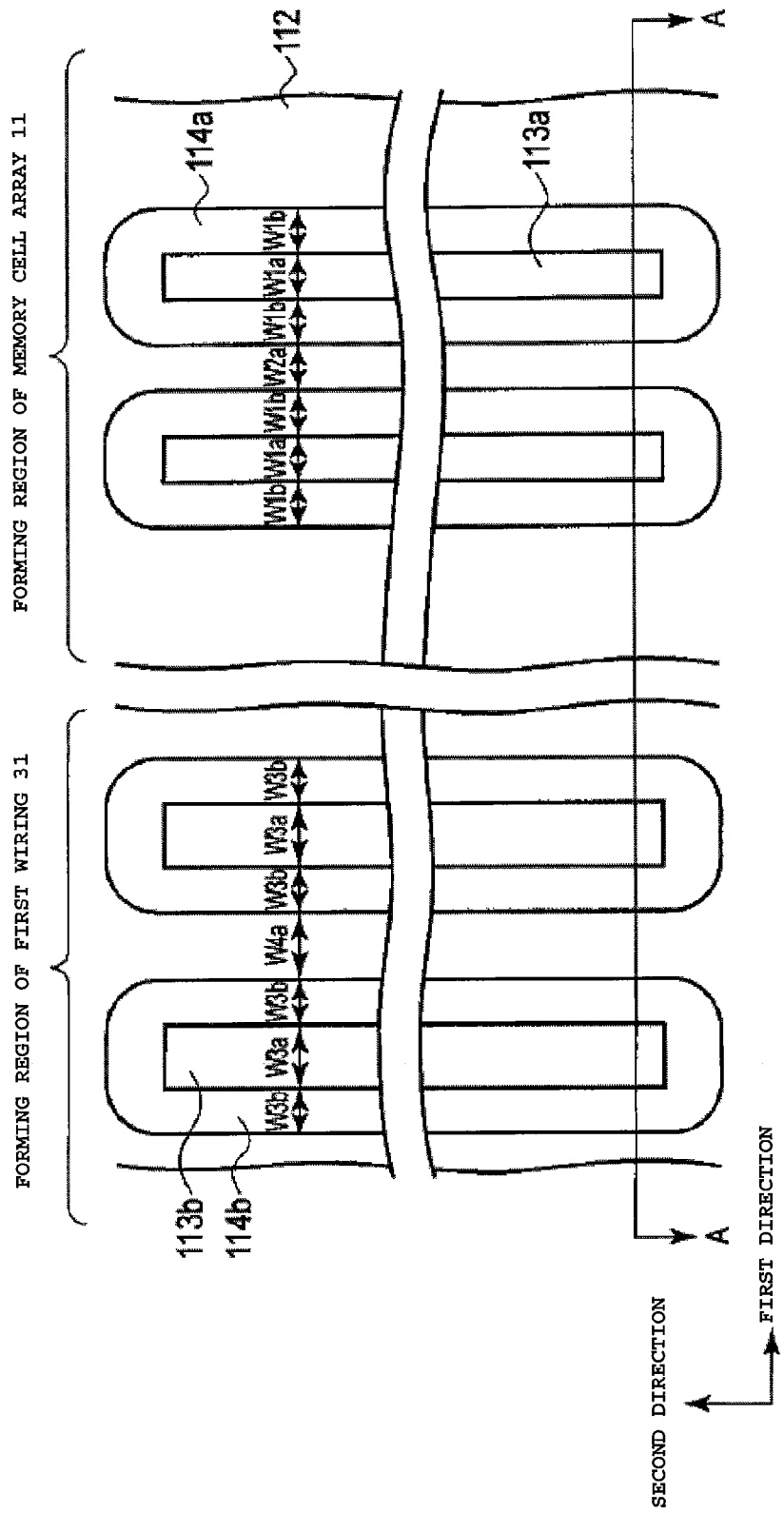

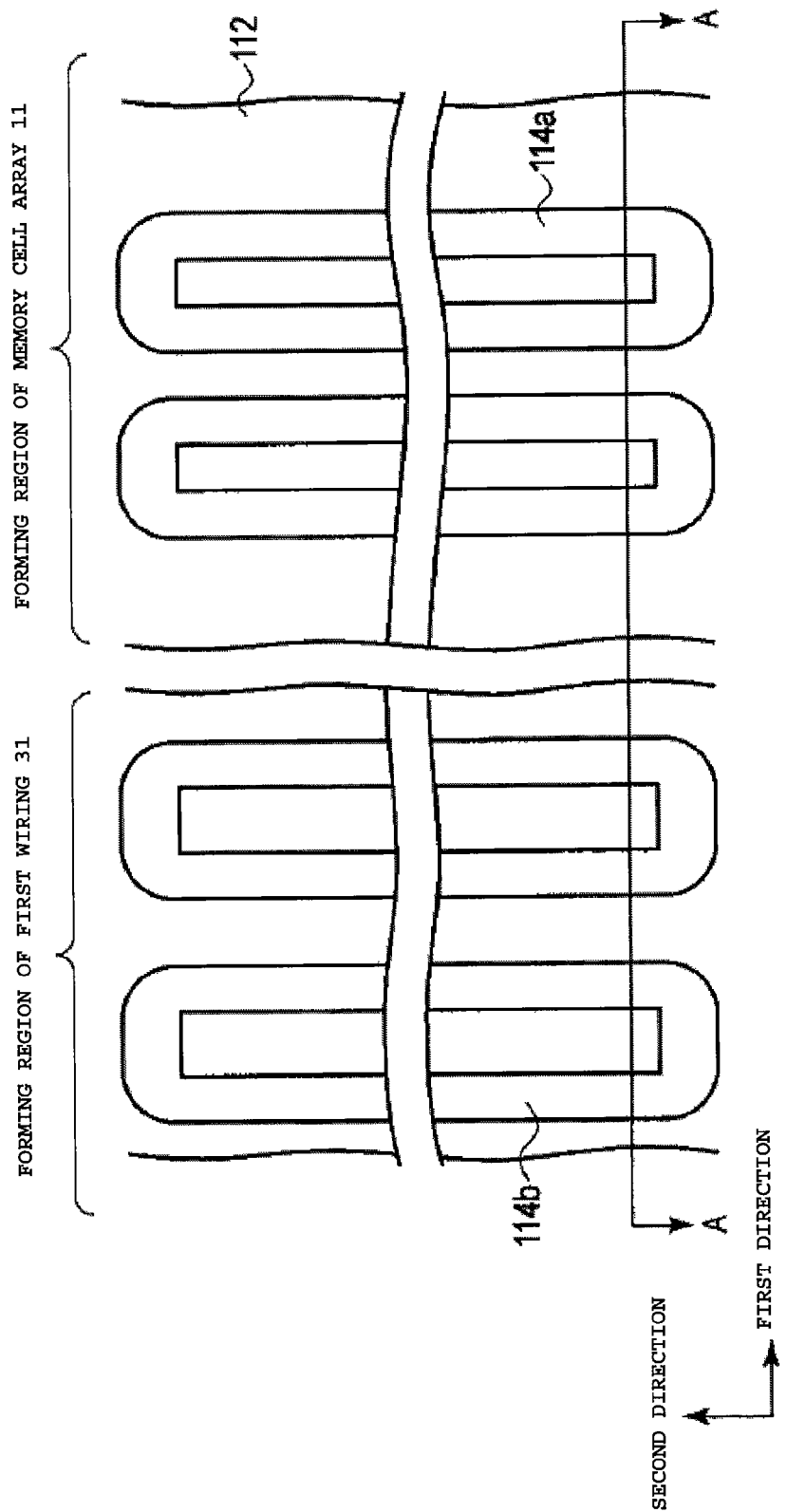

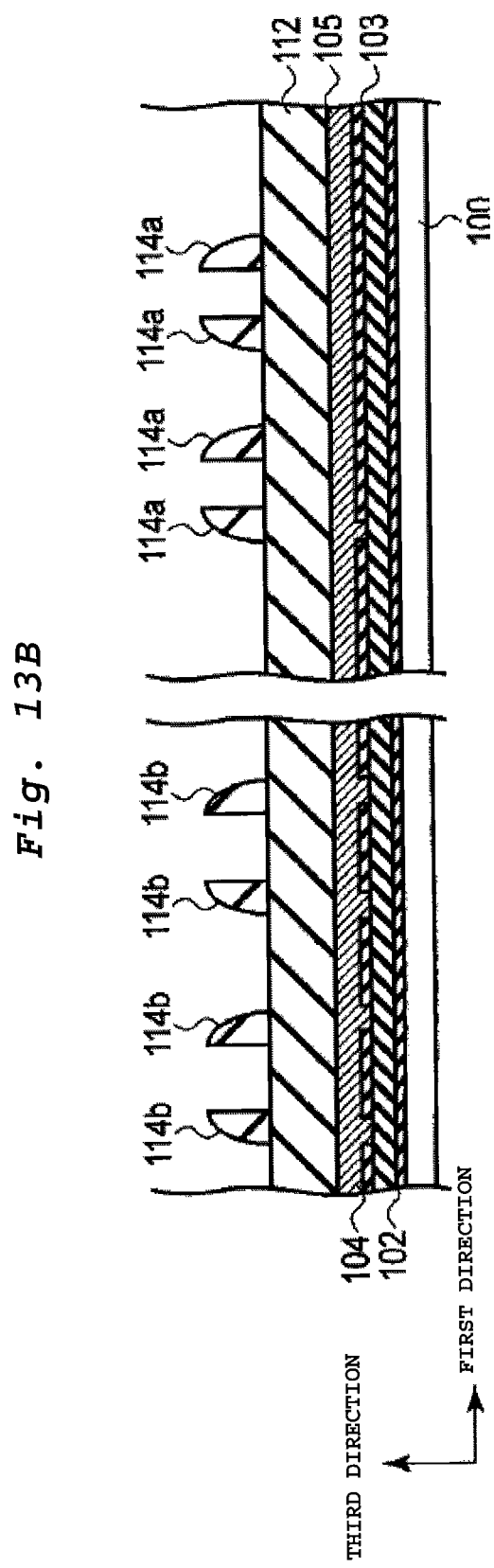

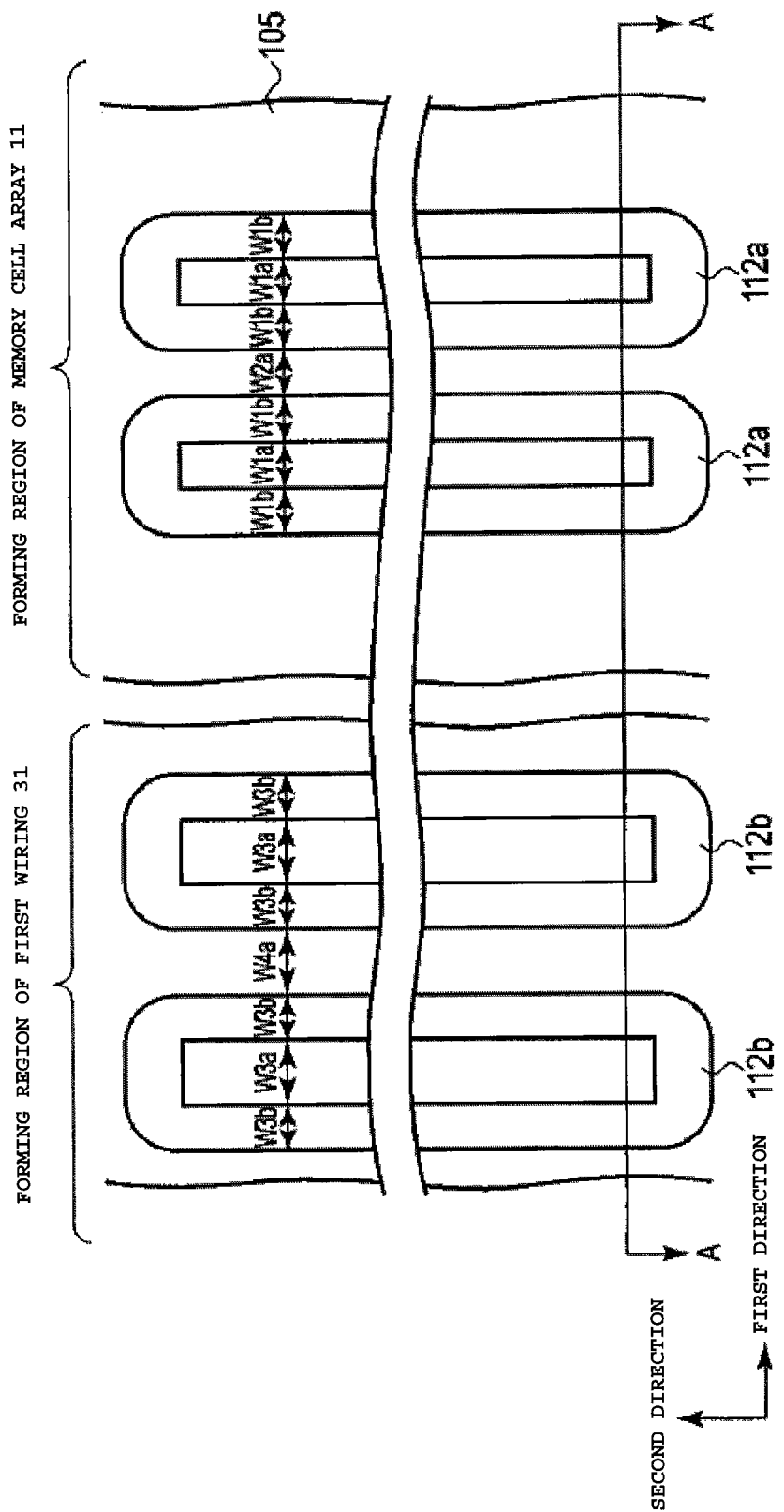

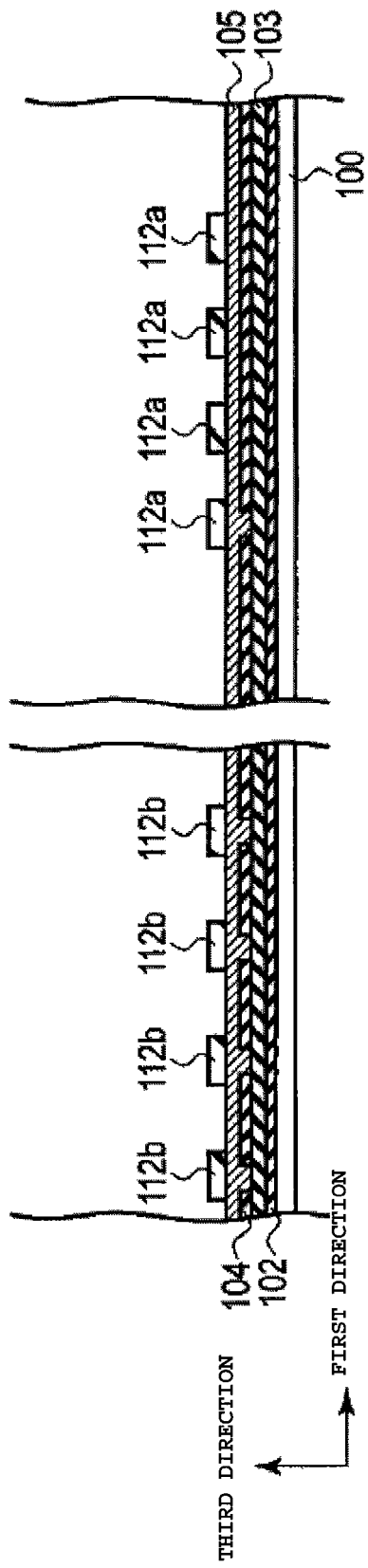

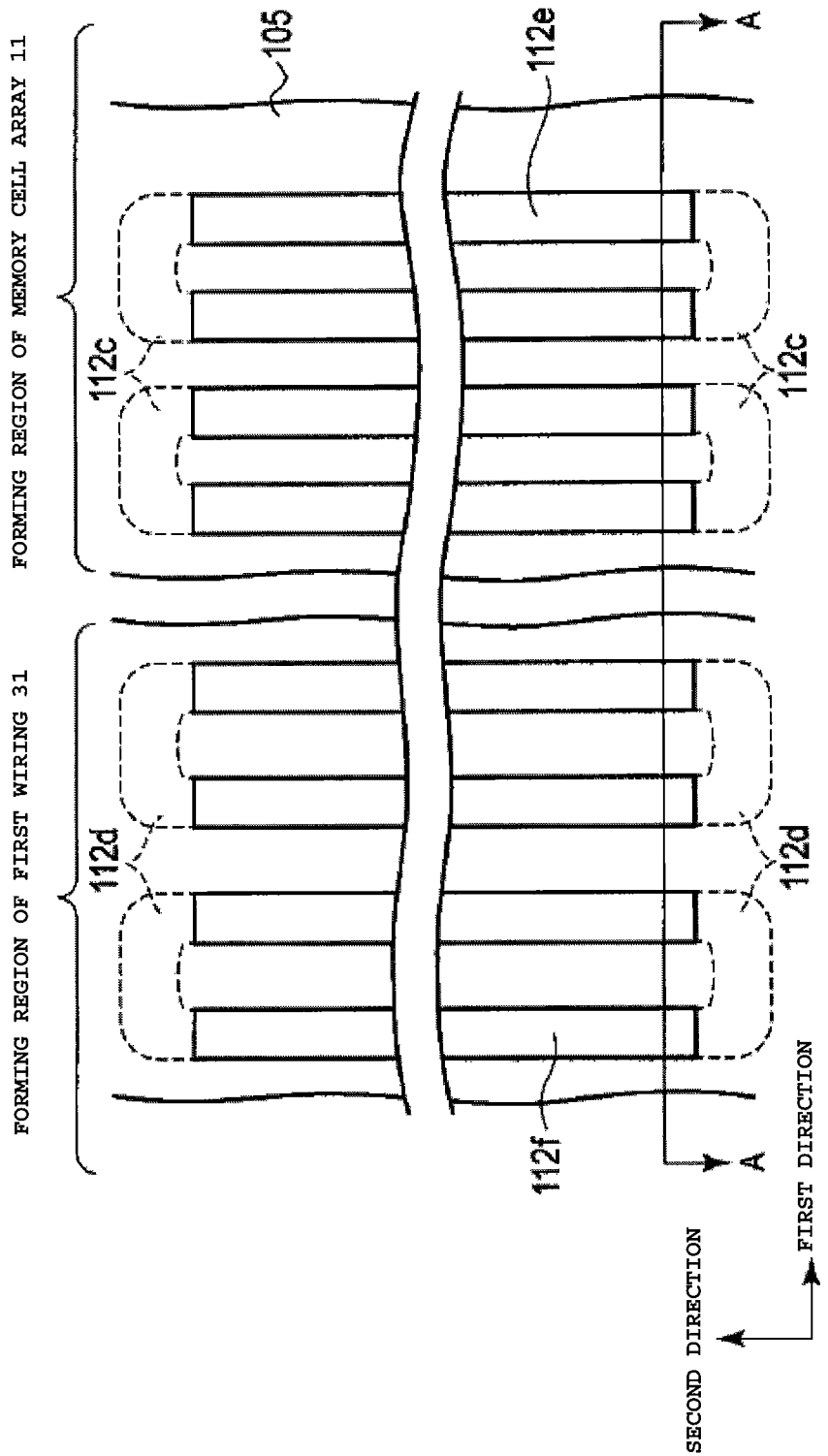

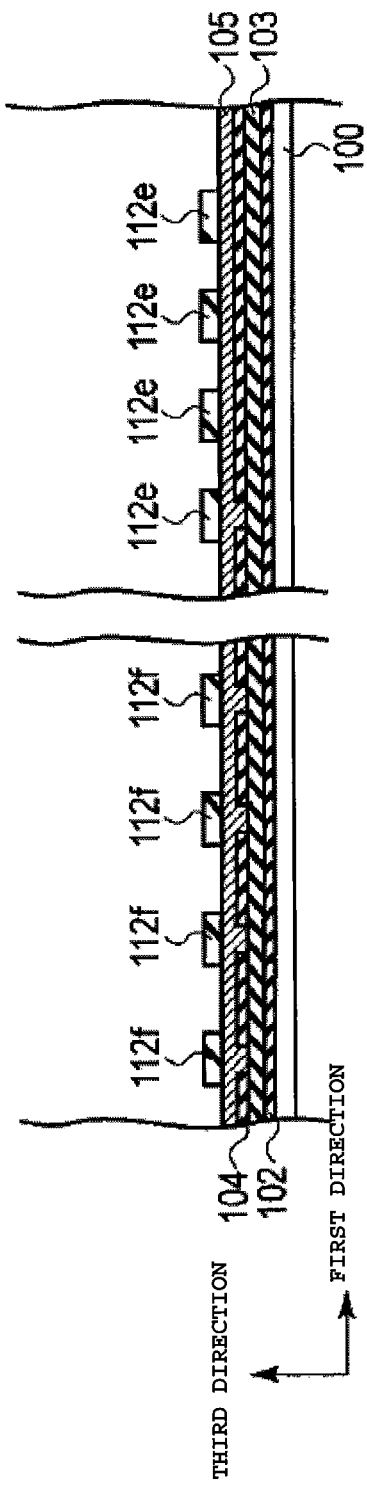

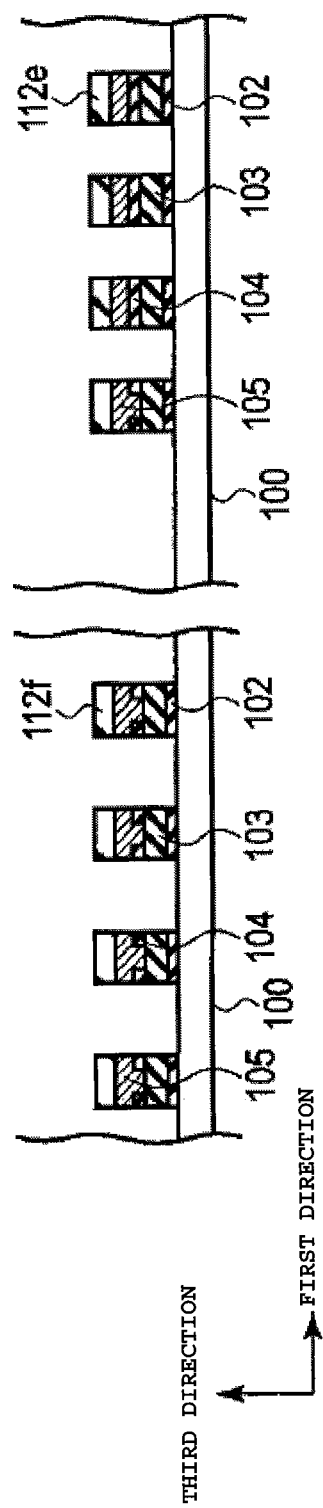

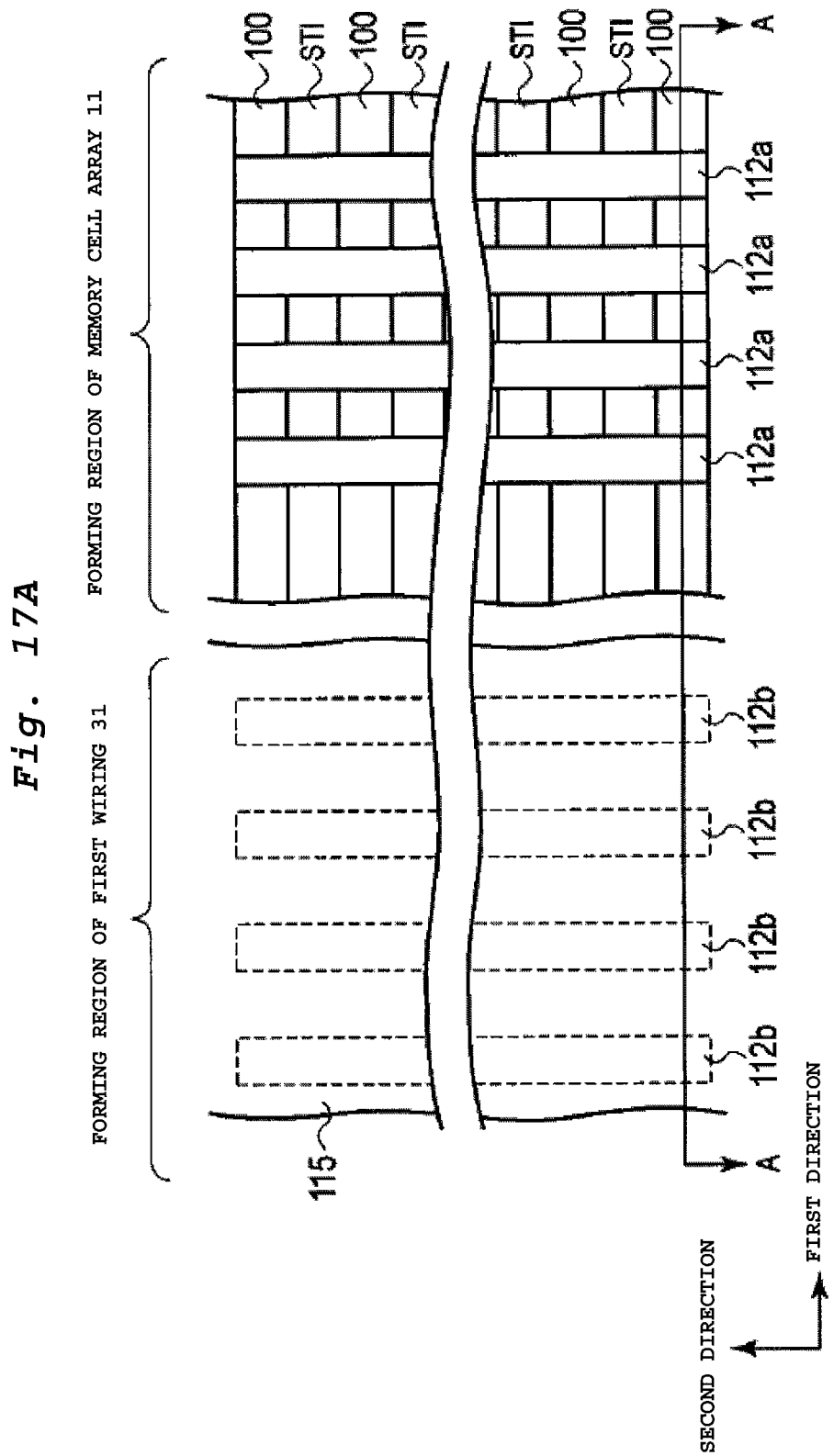

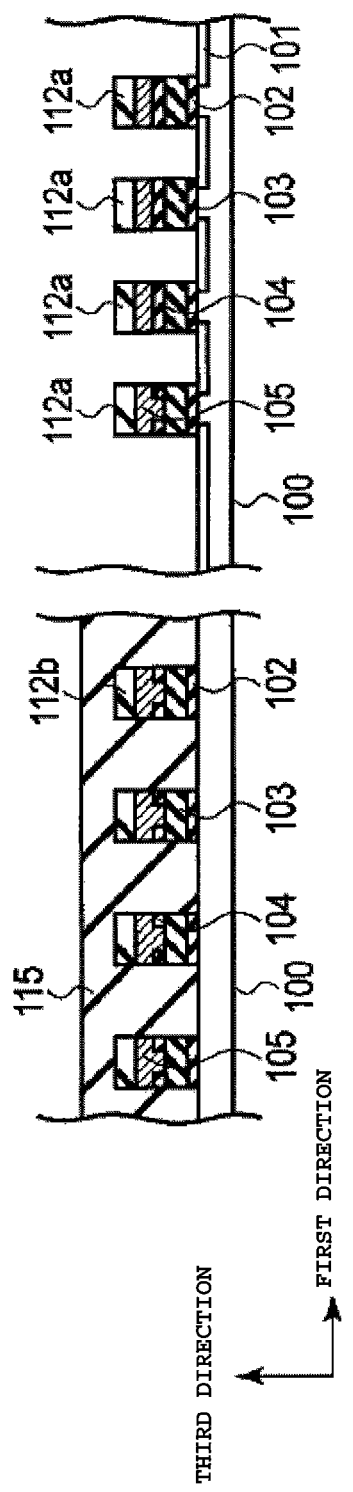

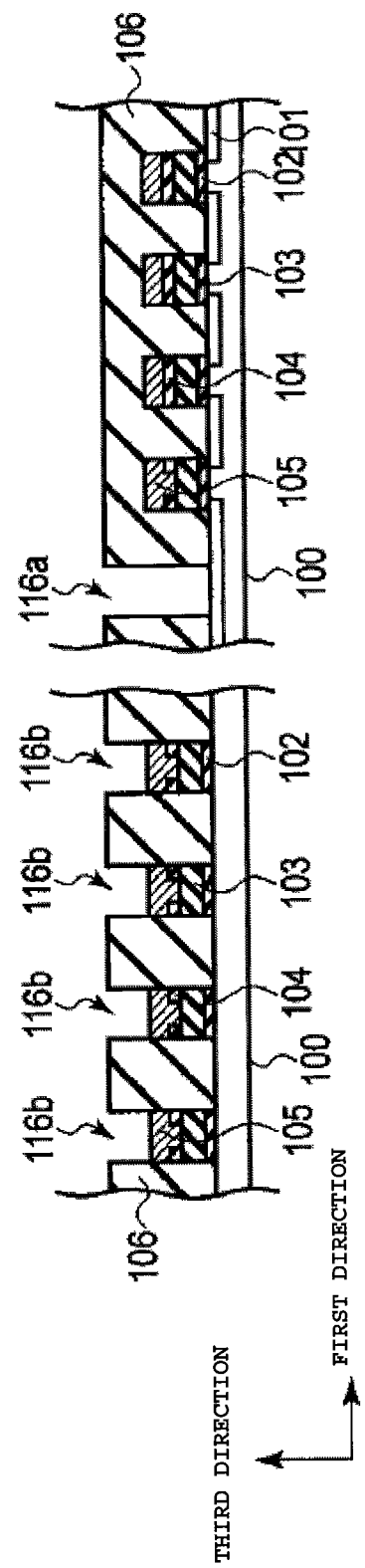

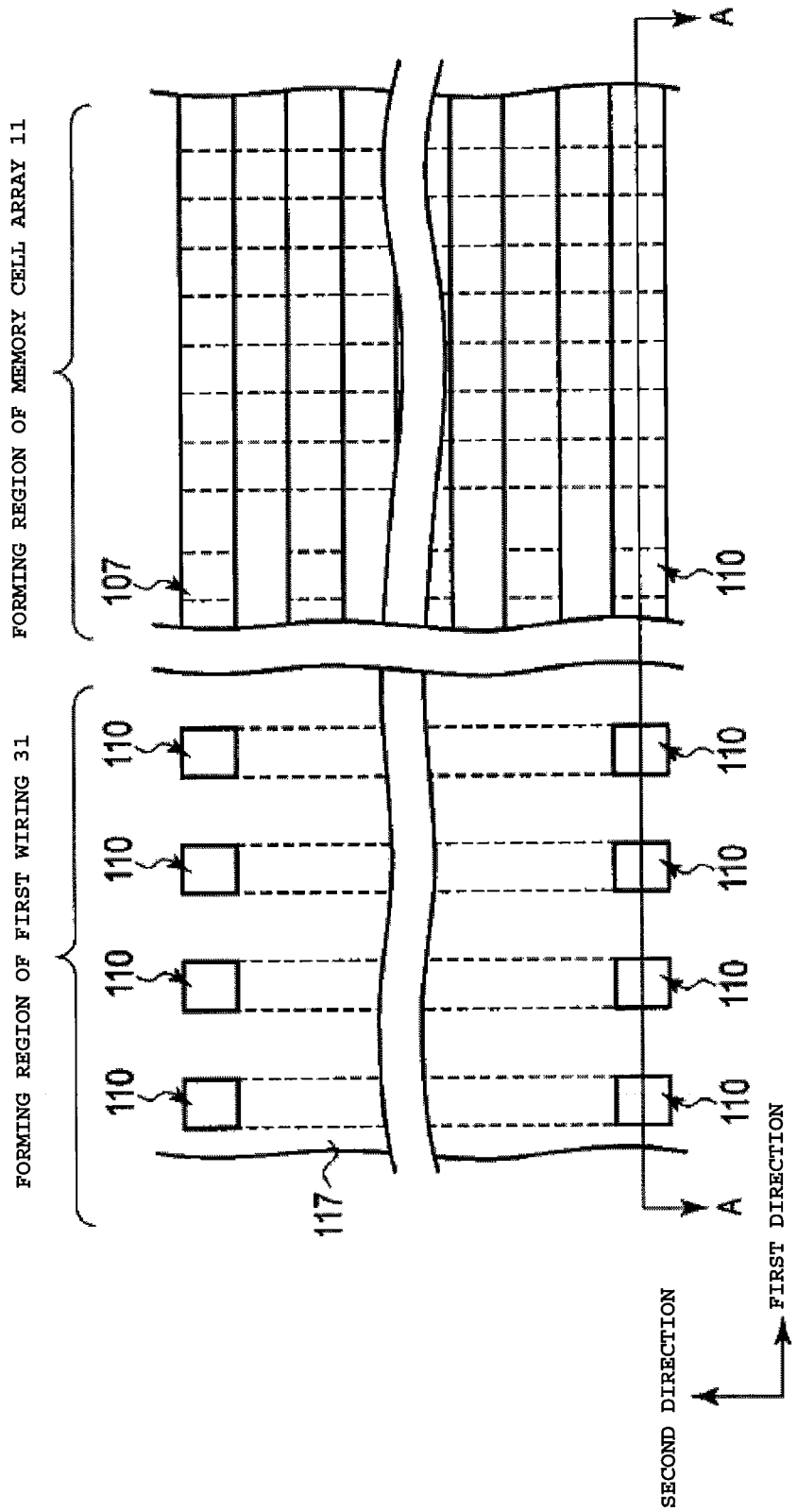

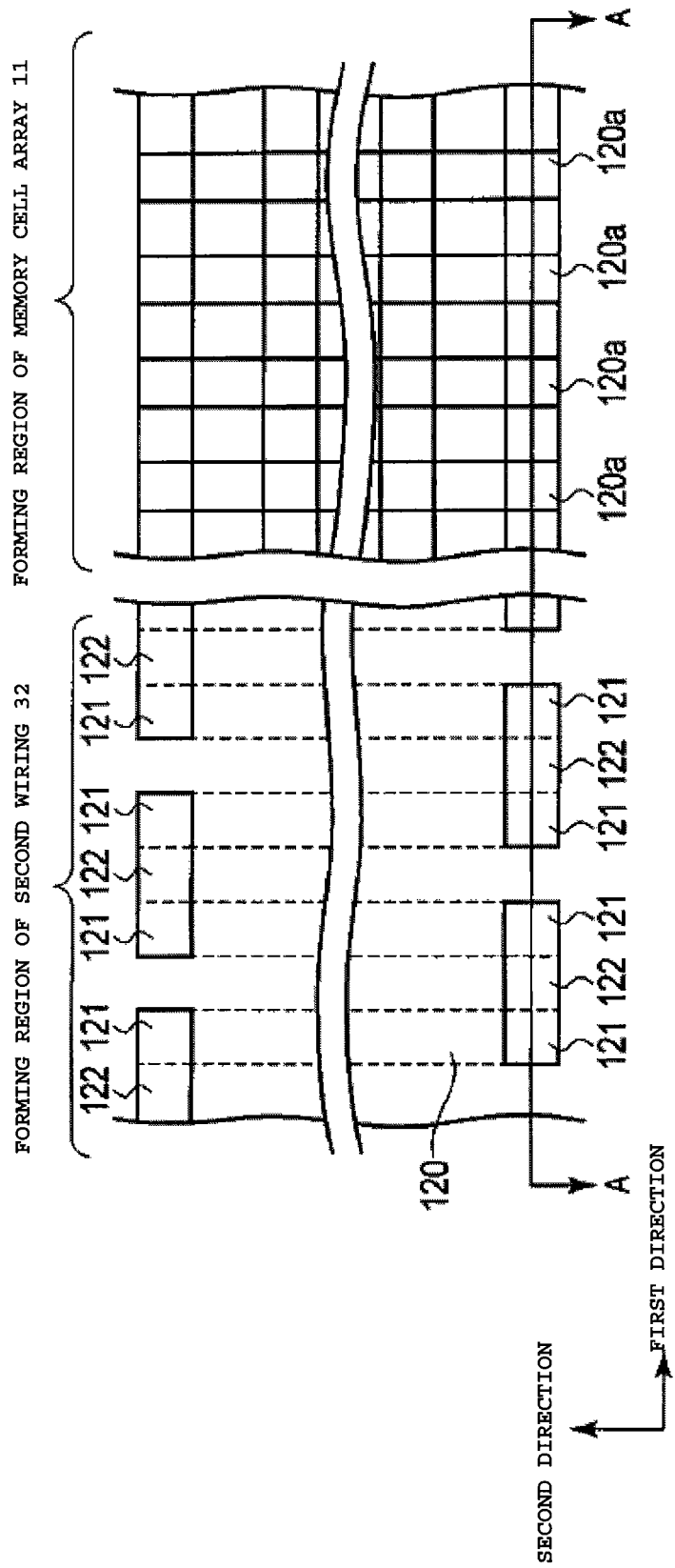

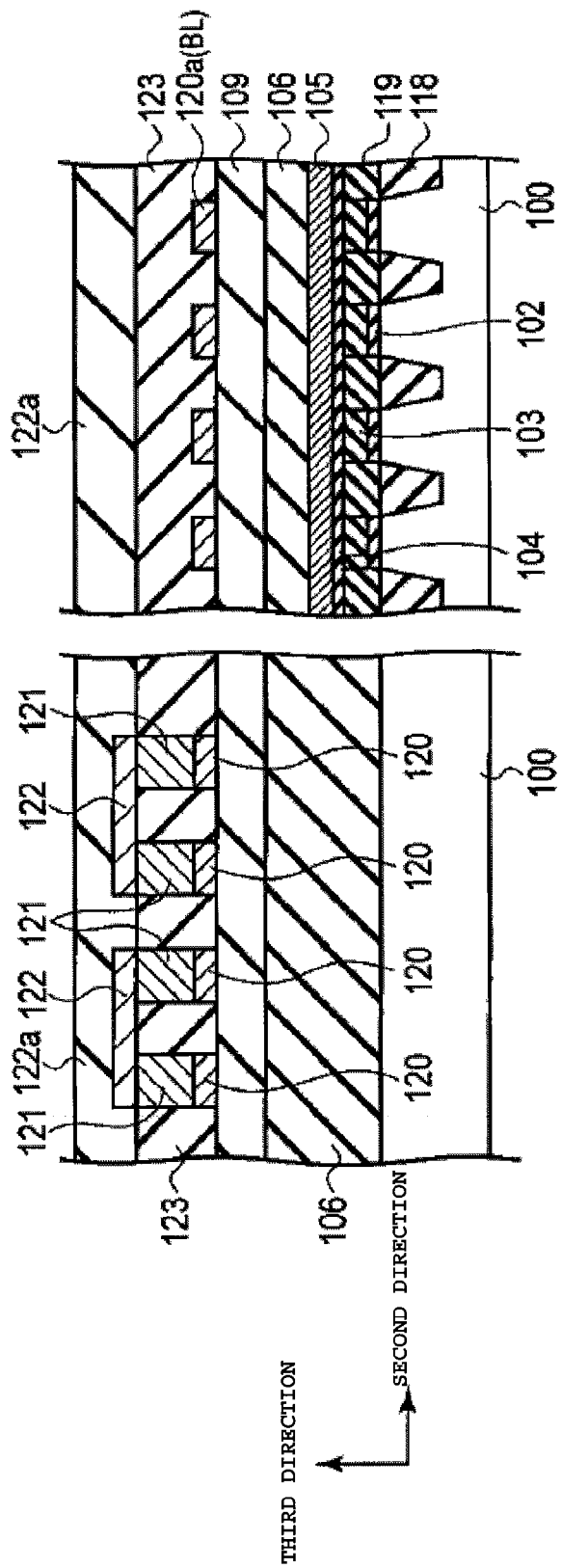

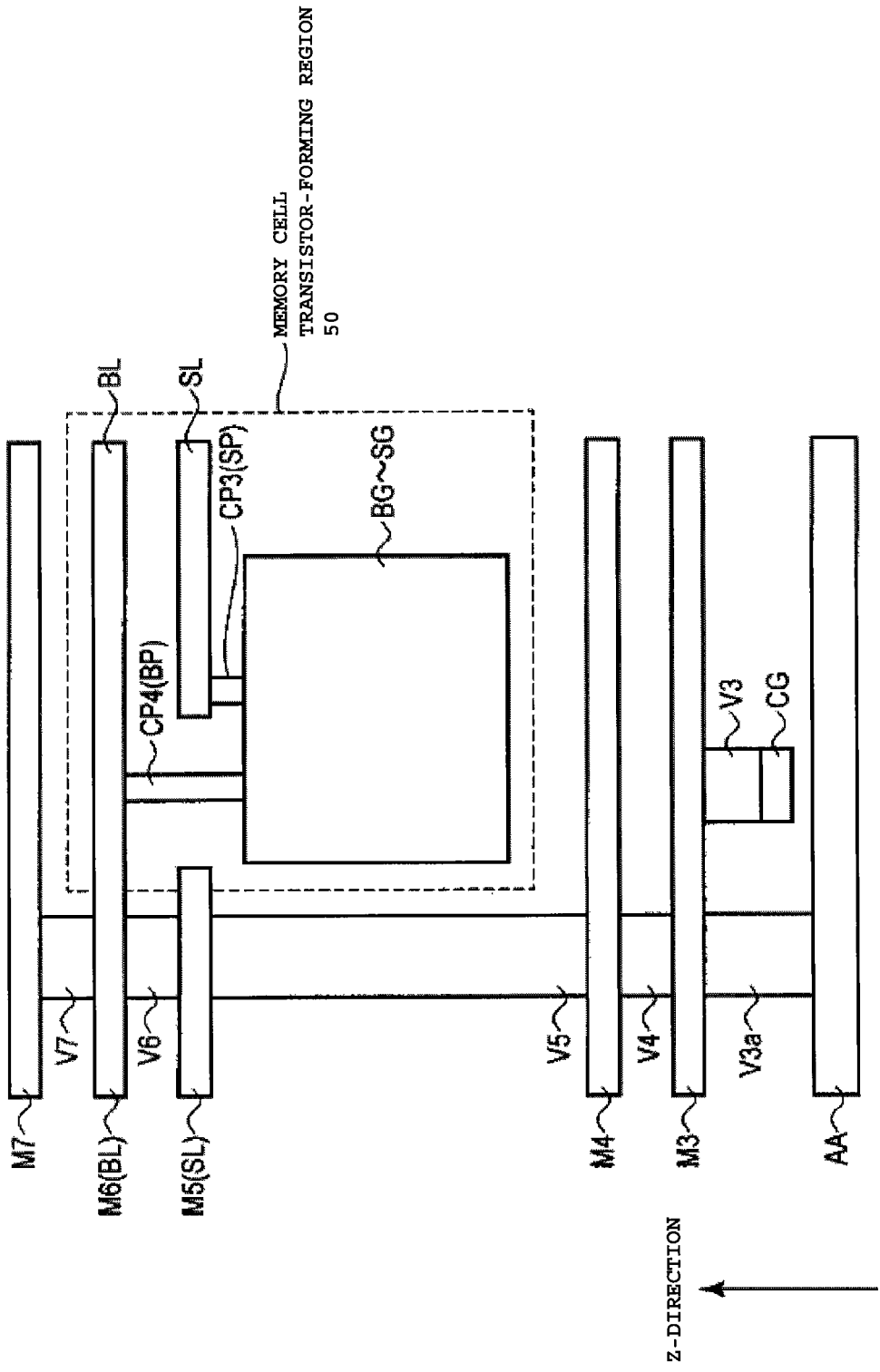

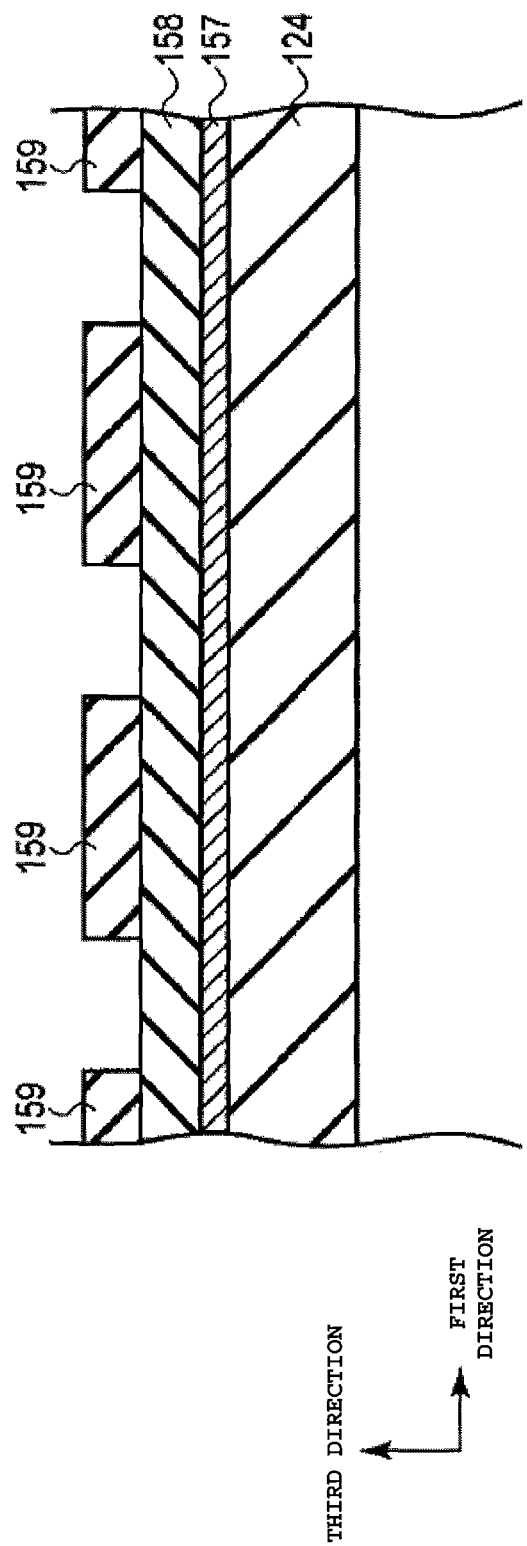

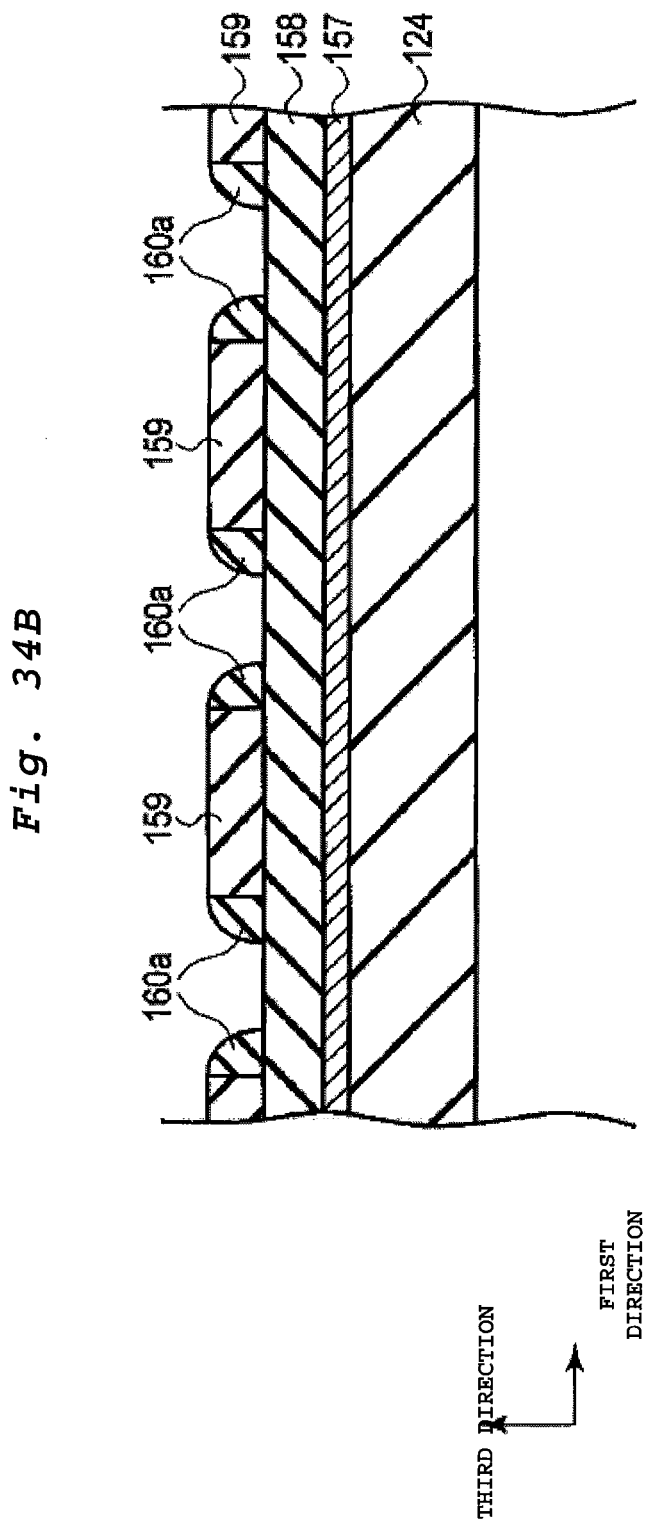

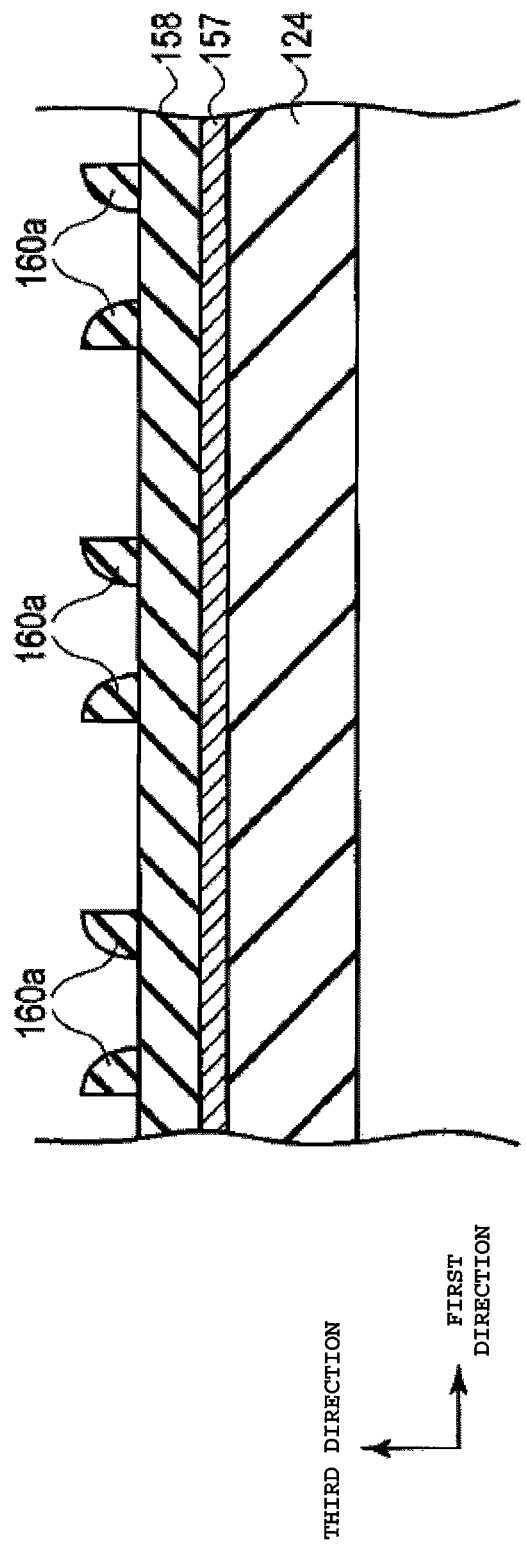

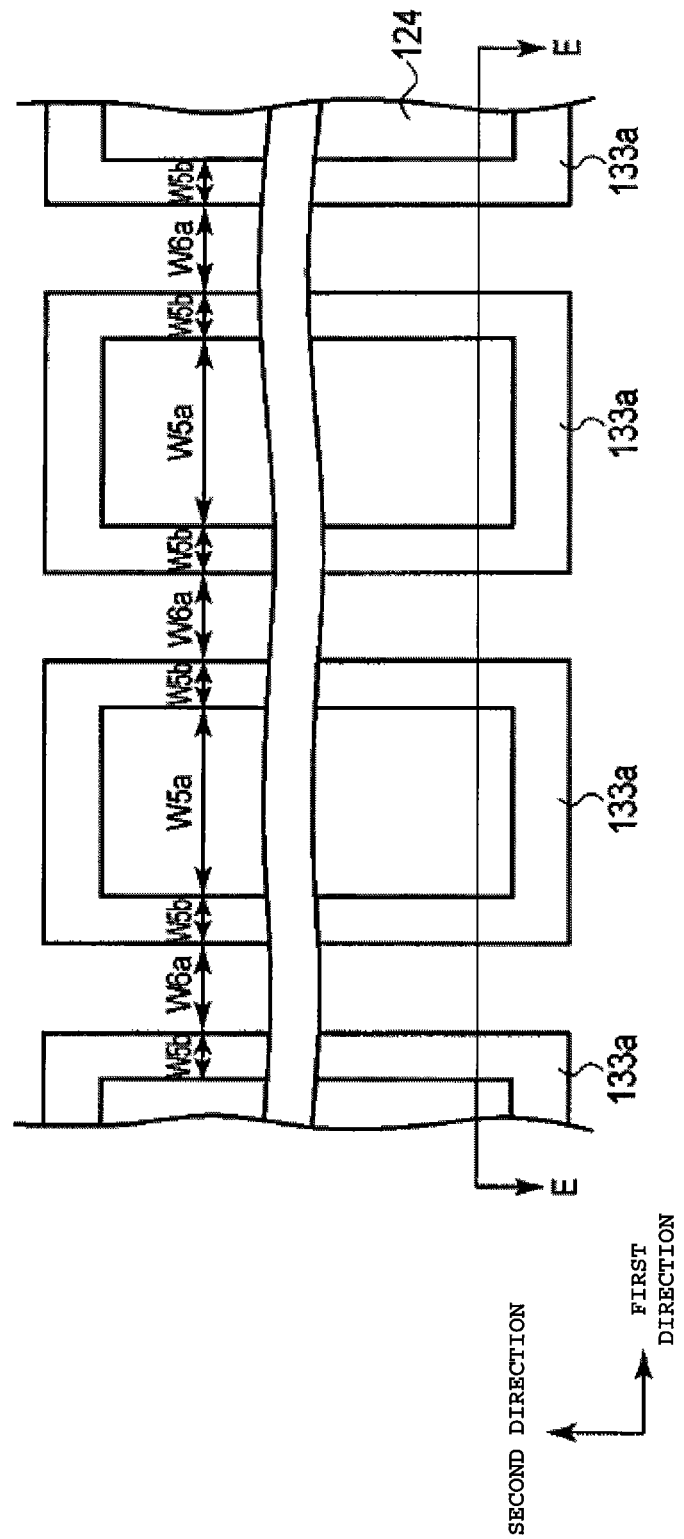

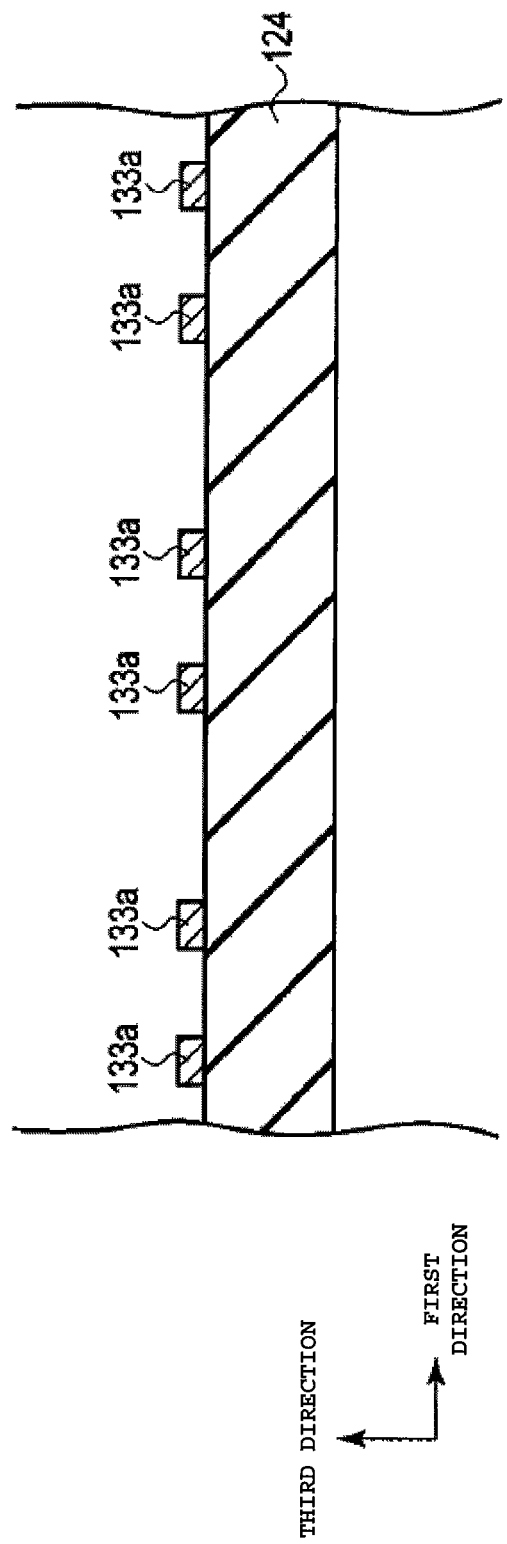

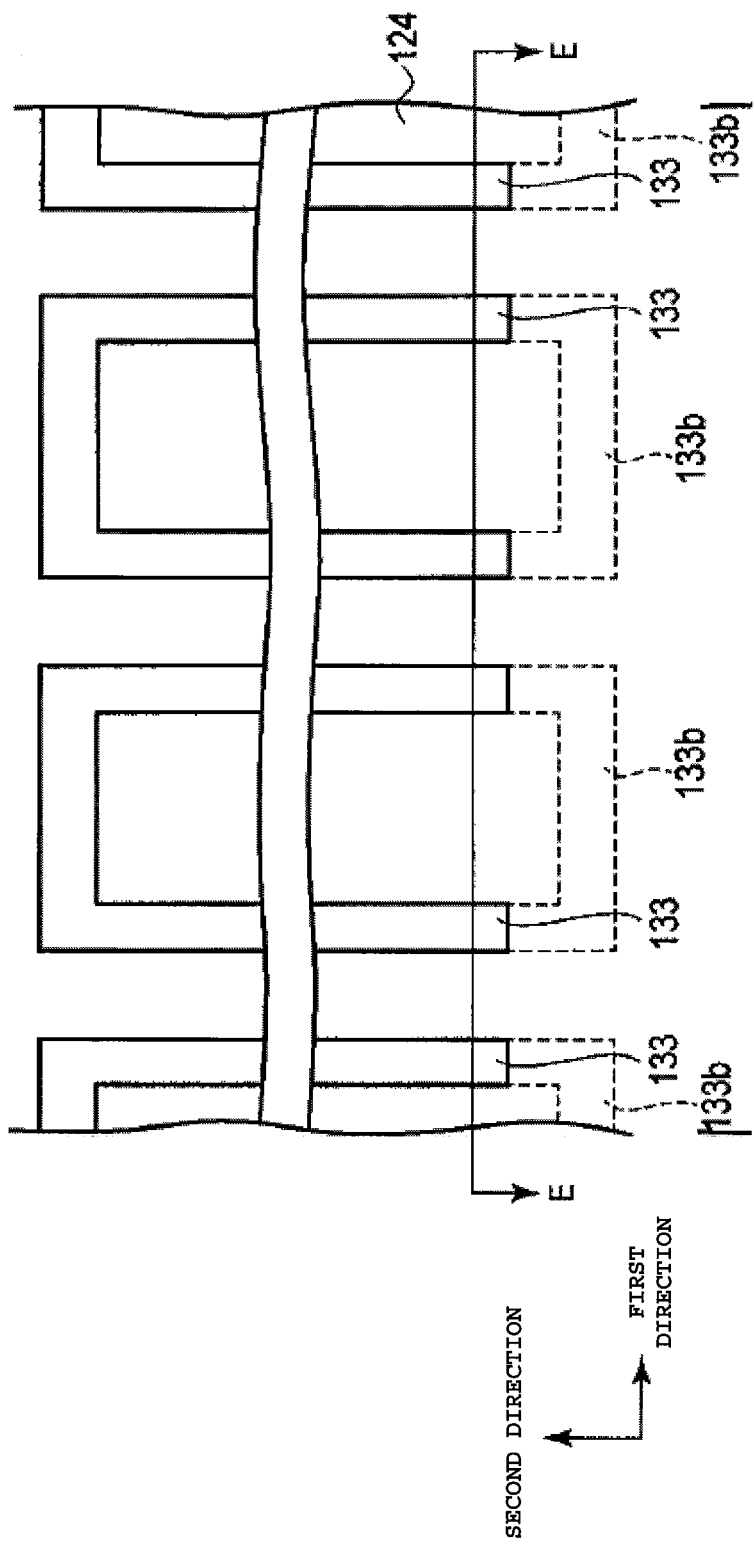

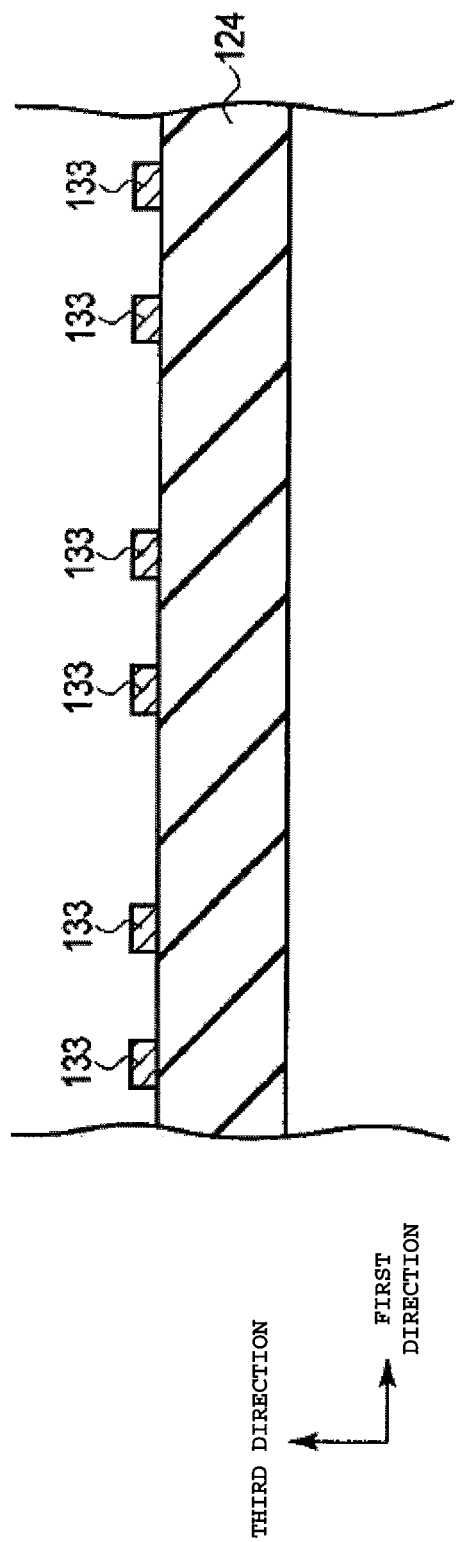

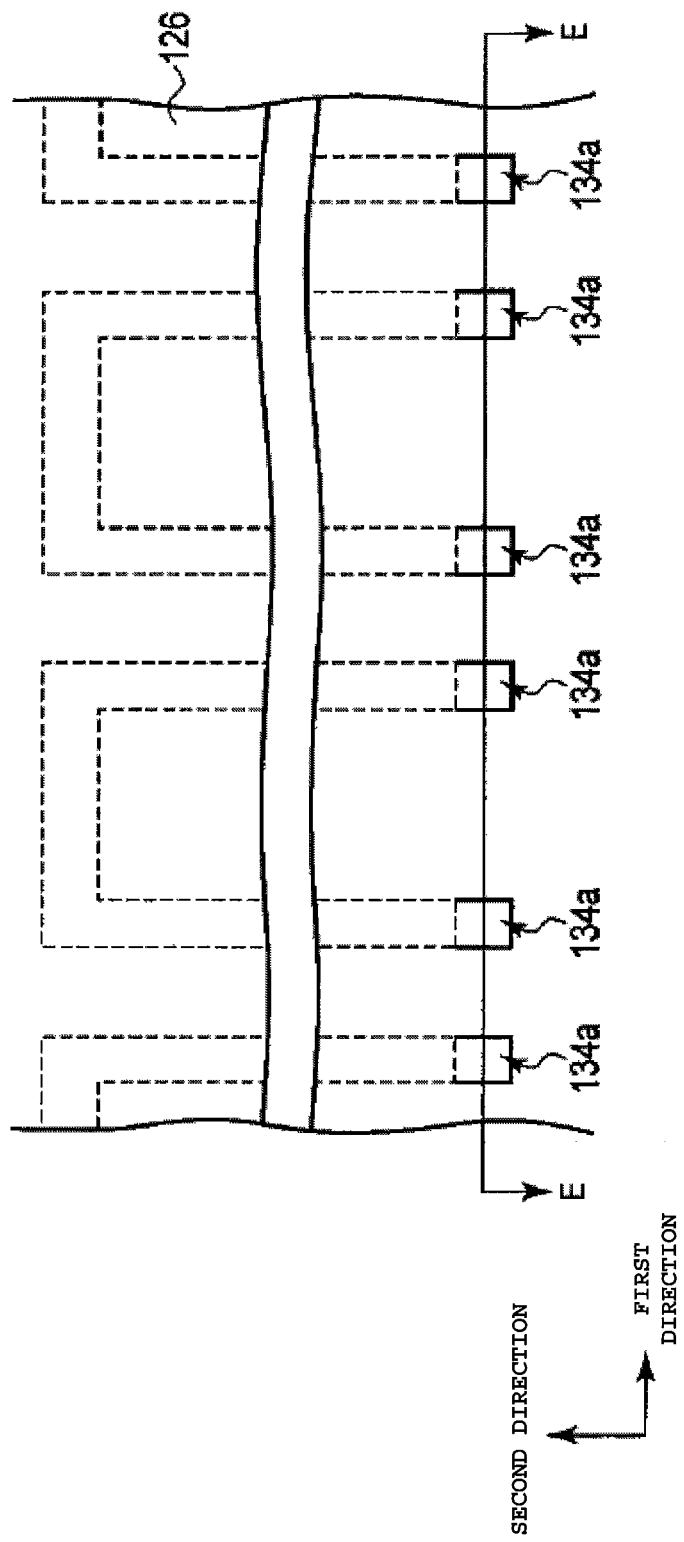

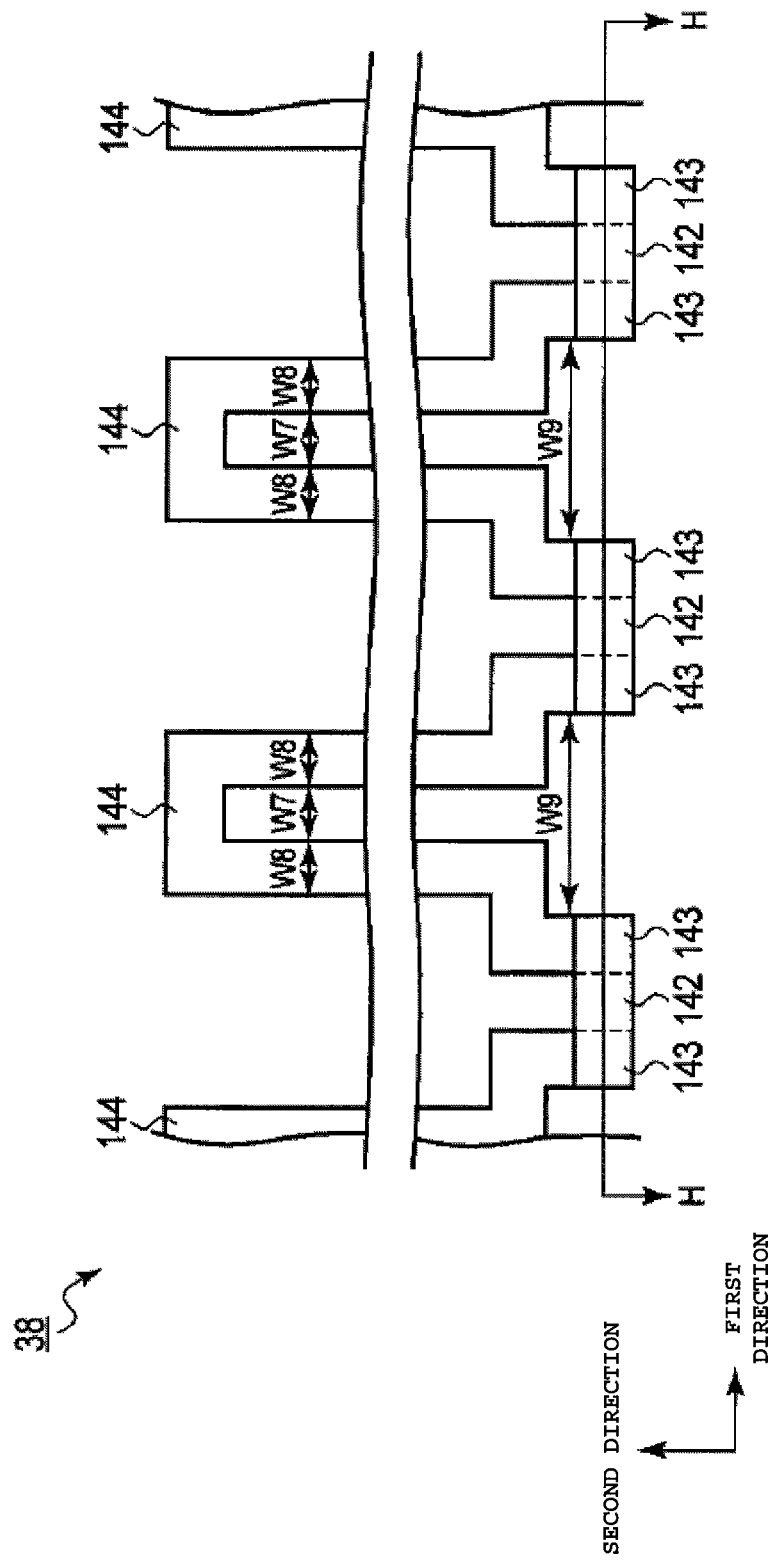

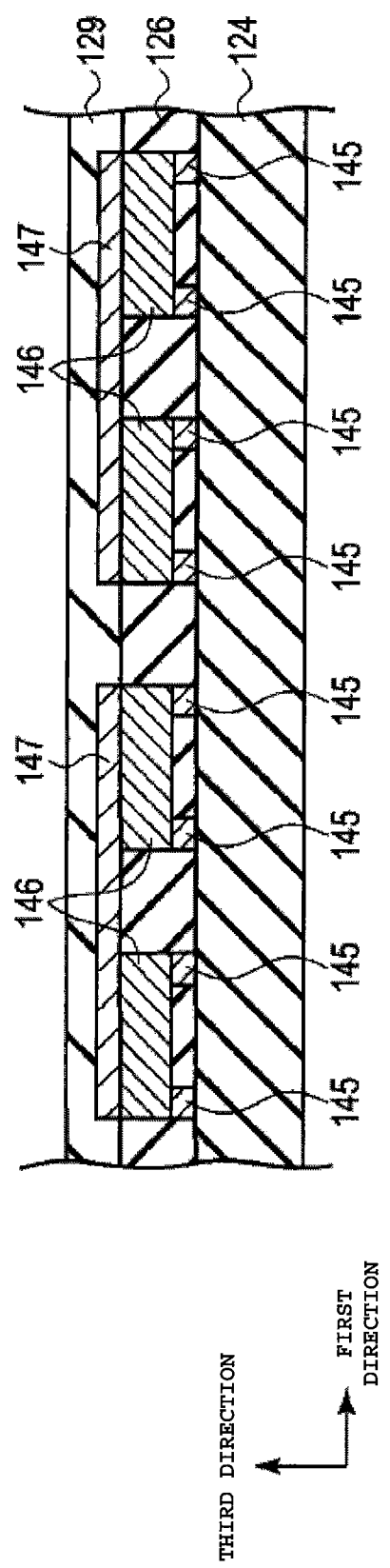

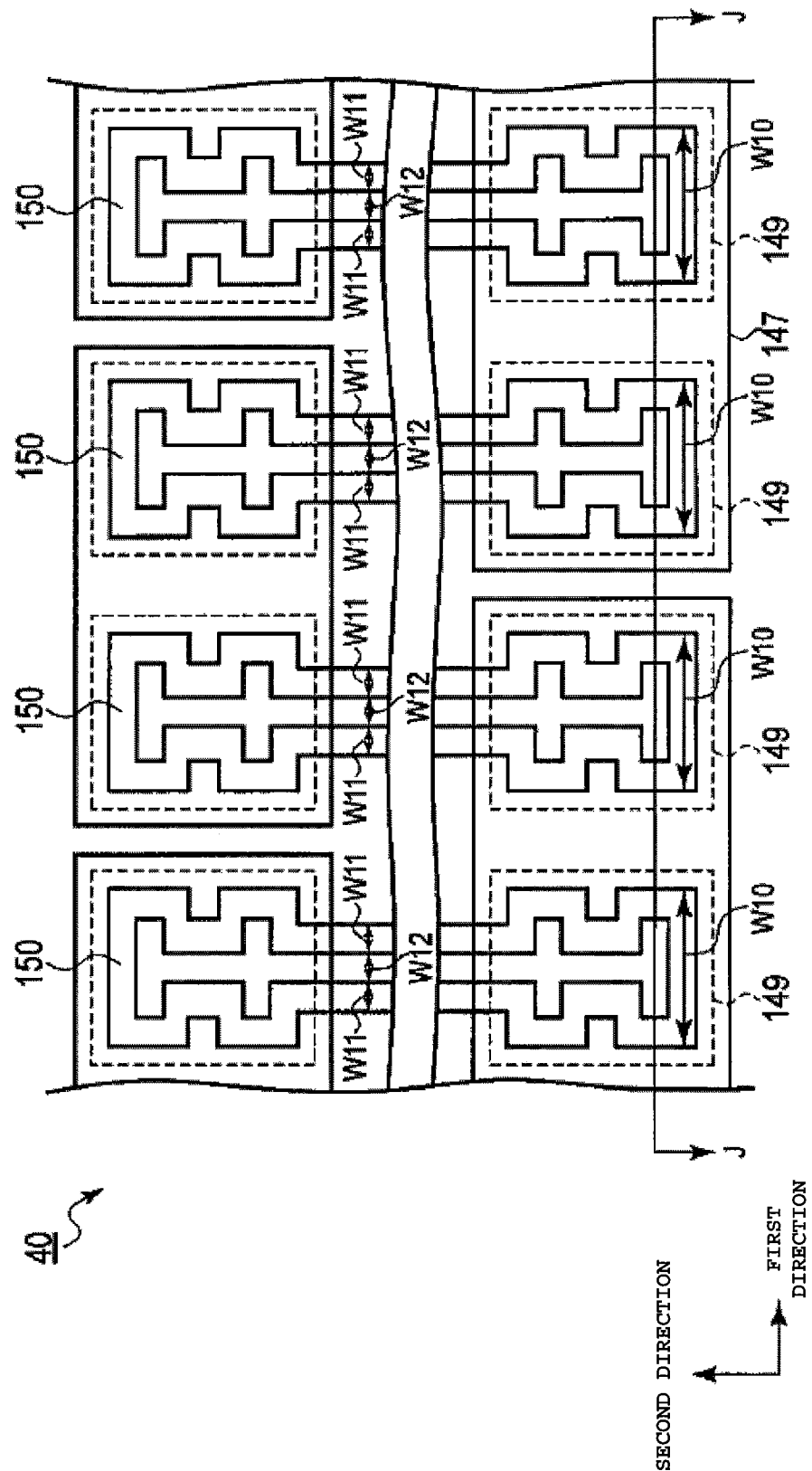

SEMICONDUCTOR STORAGE DEVICE

CROSS-REFERENCE TO RELATED APPLICATION

This application is based upon and claims the benefit of priority from Japanese Patent Application No. 2012-066236, filed Mar. 22, 2012; the entire contents of which are incorporated herein by reference.

FIELD

Embodiments described herein relate to a semiconductor storage device.

BACKGROUND

In recent years, progress has been made in developing finer and finer nonvolatile semiconductor storage devices. With this trend, there has been a need to suppress the area of a voltage generating circuit that generates voltage inside such semiconductor storage devices.

DESCRIPTION OF THE DRAWINGS

FIG. 7A is a plane view illustrating the memory cell array and a first wiring structure.

FIG. 9B is a cross-sectional view taken across A-A of FIG. 9A.

FIG. 10A is a schematic plane view illustrating the semiconductor device of the first embodiment during manufacturing. FIG. 10B is a cross-sectional view taken across A-A of FIG. 10A.

FIG. 11A is a schematic plane view illustrating the semiconductor device of the first embodiment during manufacturing.

FIG. 12A is a schematic plane view illustrating the semiconductor device of the first embodiment during manufacturing.

FIG. 13A is a schematic plane view illustrating the semiconductor device of the first embodiment during manufacturing. FIG. 13B is a cross-sectional view taken across A-A of FIG. 13A.

FIG. 14A is a schematic plane view illustrating the semiconductor device of the first embodiment during manufacturing. FIG. 14B is a cross-sectional view taken across A-A of FIG. 14A.

FIG. 15A is a schematic plane view illustrating the semiconductor device of the first embodiment during manufacturing. FIG. 15B is a cross-sectional view taken across A-A of FIG. 15A.

FIG. 16B is a cross-sectional view taken across A-A of FIG. 16A.

FIG. 17A is a schematic plane view illustrating the semiconductor device of the first embodiment during manufacturing. FIG. 17B is a cross-sectional view taken across A-A of FIG. 17A.

FIG. 18B is a cross-sectional view taken across A-A of FIG. 18A.

FIG. 19A is a schematic plane view illustrating the semiconductor device of the first embodiment during manufacturing.

FIG. 20A is a plane view illustrating a memory cell array and a second wiring structure, according to a second embodiment. FIG. 20B is a cross-sectional view taken across B-B of FIG. 20A.

FIG. 27 is a cross-sectional view illustrating the three-dimensional laminated NAND flash memory of the third embodiment.

FIG. 32B is a cross-sectional view taken across E-E of FIG. 32A.

FIG. 34B is a cross-sectional view taken across E-E of FIG. 34A.

FIG. 35B is a cross-sectional view taken across E-E of FIG. 35A.

FIG. 36A is a schematic plane view illustrating the basic components of the semiconductor device of the fifth embodiment. FIG. 36B is a cross-sectional view taken across E-E of FIG. 36A.

FIG. 37A is a schematic plane view illustrating the basic components of the semiconductor device of the fifth embodiment. FIG. 37B is a cross-sectional view taken across E-E of FIG. 37A.

FIG. 38A is a schematic plane view illustrating the basic components of the semiconductor device of the fifth embodiment.

FIG. 41A is a schematic plane view illustrating the basic components of the semiconductor device of the sixth embodiment.

FIG. 42B is a cross-sectional view taken across I-I of FIG. 42A.

FIG. 43A is a schematic plane view illustrating the basic components of the semiconductor device of the seventh embodiment.

DETAILED DESCRIPTION

Figure 1:
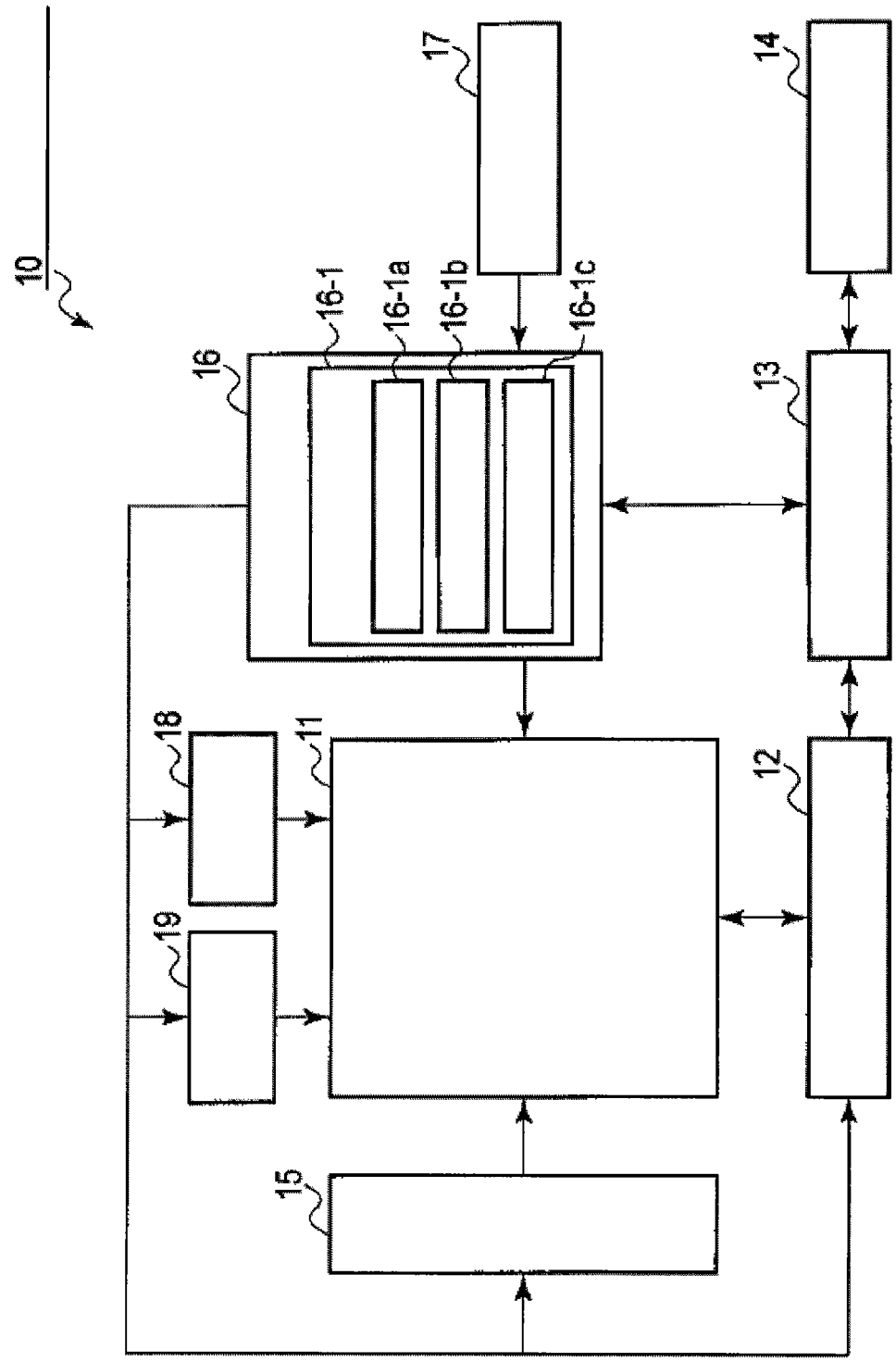
FIG. 1 is a schematic block diagram illustrating the basic components of a NAND type flash memory according to a first embodiment.

In general, examples of embodiments will be explained with reference to figures. The same keys are used throughout the following explanation for the structural elements having approximately the same function and constitution, and they will not be explained in detail repeatedly. The examples of devices and methods to be presented below are merely for specifying technical aspects of the embodiments and are not intended as limitations on the present disclosure. The technical aspects described in the present disclosure, such as the materials, shapes, structures, configurations, etc., of the structural parts are not limited to the examples to be presented below. Various modifications can be made without departing from the spirit of this disclosure. Also, it should be noted that the figures are merely schematic diagrams, and the relationship between the thickness and the planar dimensions, the ratio of the thicknesses of the various layers, etc., are not necessarily to scale or proportion. Consequently, for specific thickness and dimensions, different figures may contain portions with dimensional relationships and ratios differing from each other.

According to an embodiment, there is provided a semiconductor storage device having a high-quality power supply generating circuit.

The semiconductor storage device of an example embodiment has a nonvolatile storage region, a voltage generating circuit that generates a voltage for erasing the data of the storage region, and a control circuit that feeds the voltage generated by the voltage generating circuit to the storage region. The voltage generating circuit has a transistor that has the power supply voltage applied to one terminal of the current route, a first resistance element that has one terminal connected to the other terminal of the current route of the transistor, a second resistance element that has one terminal connected to the other terminal of the first resistance element and has the other terminal connected to the ground potential, and a comparator. The comparator has the reference potential input to its inverted input terminal and has the non-inverted input terminal connected to the other terminal of the first resistance element, compares the reference potential with the potential at the other terminal of the first resistance element, and outputs the comparison result to the gate of the transistor. The first resistance element and the second resistance element each have a wiring structure for resistance.

Wiring structures for resistance have resistance wiring portions arranged in a first direction and extend, longitudinally, in a second direction orthogonal to the first direction; end regions of the resistance wiring portion; and contact parts electrically connected to the end regions of the resistance wiring portions adjacent to each other in the first direction. The resistance wiring portions may have the same line width (as measured in the first direction) as the finest line width among the wiring portions (selection lines, word lines, bit lines, gate electrodes, etc.) formed in the storage region.

(Embodiment 1)

1.1 Constitution 1.1.1 Overall Components of the NAND Type Flash Memory

Referring to FIG. 1, the components of a NAND-type flash memory 10 related to Embodiment 1 will be explained schematically. FIG. 1 is a schematic block diagram illustrating the basic components of the NAND type flash memory 10 related to Embodiment 1.

The NAND-type flash memory 10 has a memory cell array 11, a column decoder 12, a data input/output buffer 13, a data input/output terminal 14, a row decoder 15, a control circuit 16, a control signal input terminal 17, a source line control circuit 18, and a well control circuit 19.

The memory cell array 11 has plural bit lines BL, plural word lines WL, and plural source lines SL. This memory cell array 11 includes plural blocks BLK, each of which has electrically rewritable memory cell transistors (also known as memory cells) MT arranged in a matrix configuration. Here, each of the memory cell transistors MT has a laminated gate containing a control gate electrode and a charge storage layer, and it stores 2-value or multi-value data according to the change in threshold of the transistor varying with the characteristic quantity injected into the charge storage layer. The memory cell transistors MT of this NAND-type flash memory 10 have a MONOS (metal-oxide-nitride-oxide-silicon) structure with electrons trapped in the nitride film.

The column decoder 12 has a sense amplifier (not shown in the figure) that amplifies the voltage of the bit lines BL in the memory cell array 11, as well as a data storage circuit (not shown in the figure) that latches the data for carrying out write operation. The column decoder 12 reads the data of the memory cell transistors MT in the memory cell array 11 via the bit lines BL, or detects the state of each memory cell transistors MT via the corresponding bit line BL, or applies a write control voltage to each memory cell transistor MT via the bit line BL to write in the memory cell transistor MT.

The column decoder 12 also selects the data storage circuit in the column decoder 12, and outputs the data of the memory cell transistor MT read in the data storage circuit via the data input/output buffer 13 to the outer side (host) from the data input/output terminal 14.

The data input/output buffer 13 receives the data from the data input/output terminal 14 and stores the data in the data storage circuit selected by the column decoder 12. Also, the data input/output buffer 13 outputs the data via the data input/output terminal 14.

In addition to the write data, the data input/output terminal 14 also receives various types of commands, such as write, read, erasure, status read, etc., and address.

When performing the data read operation, write operation, or erasure operation, the row decoder 15 selects a certain block BLK, while it sets the remaining blocks BLK as non-selected. That is, the row decoder 15 applies the necessary voltage for a read operation, write operation, or erasure operation on the word lines WL and selects gate lines VSGS, VSGD of the memory cell array 11.

The source line control circuit 18 is connected to the memory cell array 11. The source line control circuit 18 controls the voltage of the source line SL.

The well control circuit 19 is connected to the memory cell array 11. The well control circuit 19 controls the voltage of the semiconductor substrate (well) where the memory cell transistors MT are formed.

The control circuit 16 controls the memory cell array 11, column decoder 12, data input/output buffer 13, row decoder 15, source line control circuit 18, and well control circuit 19. For example, the control circuit 16 contains a voltage generating circuit 16-1 that boosts the power supply voltage. The control circuit 16 boosts the power supply voltage with voltage generating circuit 16-1 as needed, and applies the boosted voltage to the column decoder 12, data input/output buffer 13, row decoder 15, source line control circuit 18 and well control circuit 19.

The control circuit 16 carries out the control operation corresponding to the control signals (command latch enable signal CLE, address latch enable signal ALE, ready/busy signal RY/BY, etc.) input from the outside via the control signal input terminal 17 and the commands input from the data input/output terminal 14 via the data input/output buffer 13. That is, corresponding to the control signal and command, the control circuit 16 generates the desired voltage and feeds the generated voltage to the various parts of the memory cell array 11 for carrying out operations for data program, verify, read, and erasure.

The voltage generating circuit 16-1 has first voltage driver 16-1a, second voltage driver 16-1b, and third voltage driver 16-1c for generating the various voltages. The detailed operation of the voltage generating circuit 16-1 will be explained later.

1.1.2 A Brief Account of the Memory Cell Array

Figure 2:
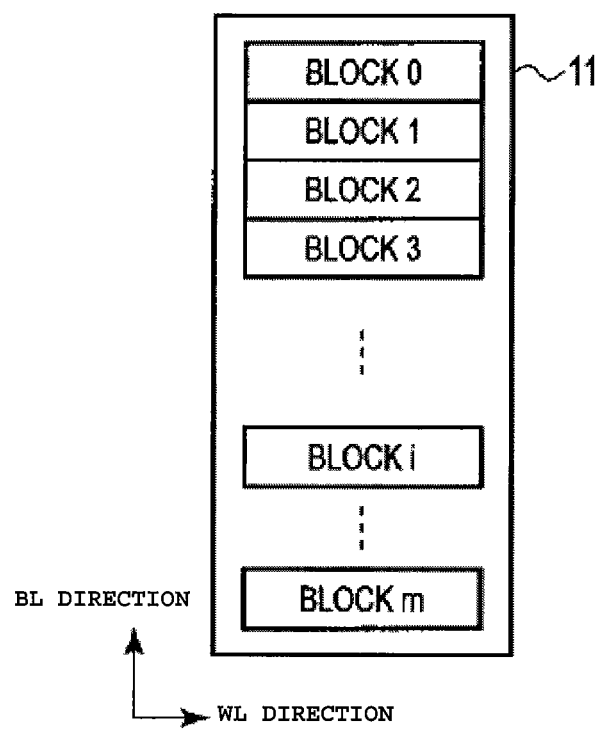
FIG. 2 is a schematic block diagram illustrating the basic components of a memory cell array according to a first embodiment.
Figure 3:
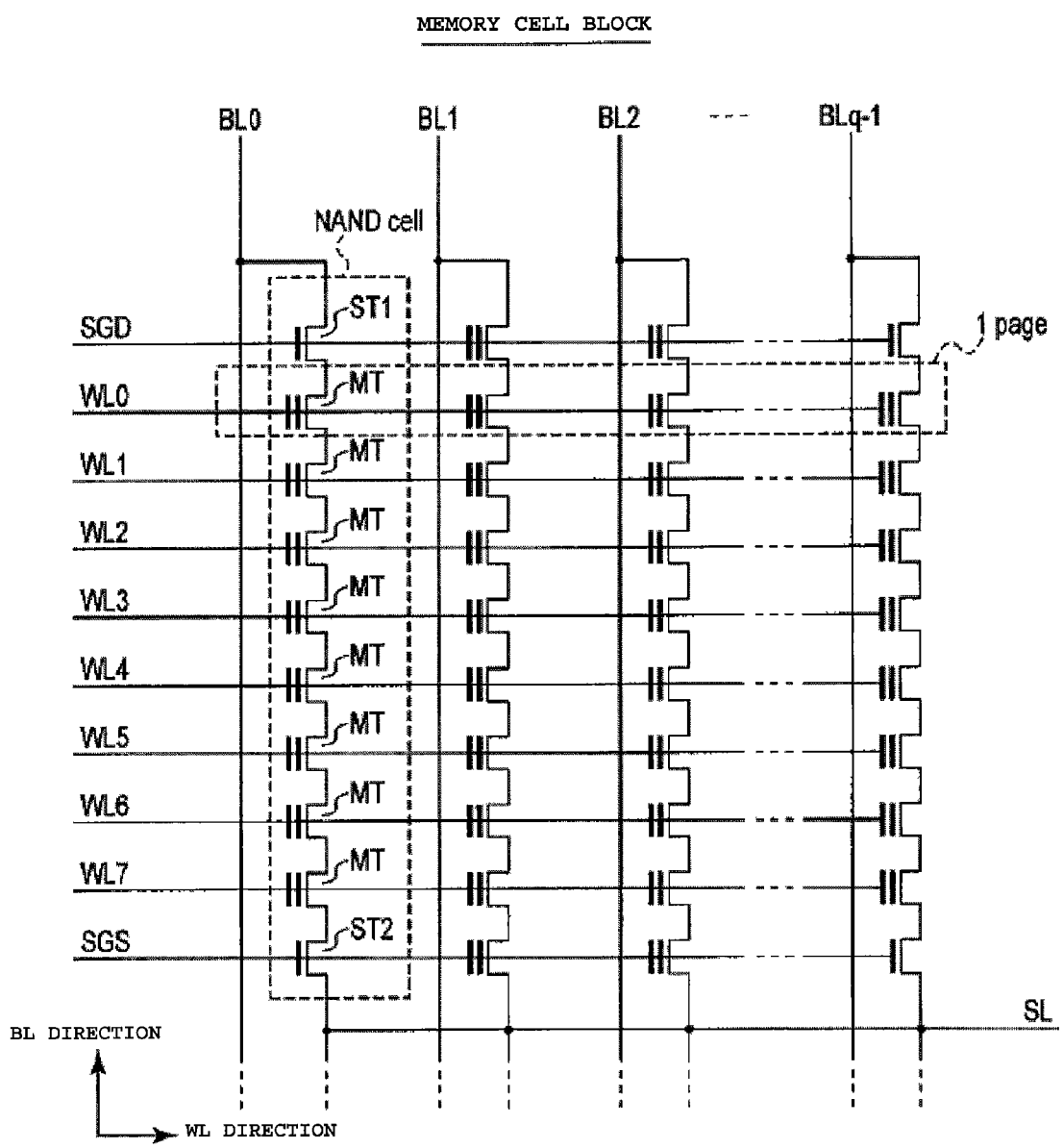
FIG. 3 is a diagram illustrating an example circuit of one of the memory blocks shown in FIG. 2.

In the following, a brief account of the basic components of the memory cell array 11 related to Embodiment 1 will be presented. FIG. 2 is a schematic block diagram illustrating the basic components of the memory cell array 11 related to the embodiment. FIG. 3 shows an example of the circuit of one memory block among the plural memory blocks shown in FIG. 2.

As shown in FIG. 2, the memory cell array 11 is composed of plural memory blocks BLOCK1 to BLOCKm (m is an integer of 1 or larger). The plural memory blocks BLOCK1 to BLOCKm are arranged side-by-side in the bit line BL direction (column direction).

As shown in FIG. 3, each memory block contains plural NAND cells (also known as cell units, or NAND strings, etc.) arranged side-by-side in the word line WL direction (row direction).

Each NAND cell includes plural memory cell transistors MT (also known as memory cells) connected in source-to-drain in series, a selecting gate transistor ST1 connected to the drain of the memory cell transistor MT at one end of the series-connected memory cell transistors, and a selecting gate transistor ST2 connected to the source of the memory cell on the other end of the series connected memory cell transistors.

Each of the memory cell transistors MT has a charge storage layer formed on a gate insulating film on the semiconductor substrate, a gate insulating layer formed on the charge storage layer, and a control gate electrode formed on the gate insulating film. Here, the number of the memory cell transistors MT is not limited to 8. The number may also be 16, 32, 64, 128, 256, etc. There is no specific restriction on this number. The adjacent memory cell transistors MT share a common source and drain with each other. The current route of the series-connected memory transistors is between the selecting gate transistors ST1, ST2. The drain region on one end of the series-connected chain of the memory cell transistors MT is connected to the source region of selecting gate transistor ST1, and the source region on the other end of the chain of series-connected memory transistors is connected to the drain region of selecting gate transistor ST2.

A bit line BL0 to BLq−1 (q is an integer of 1 or larger) is connected to the drain of each selecting gate transistor ST1. The source line SL is connected to the source of each selecting gate transistor ST2. For the bit lines BL0 to BLq−1, they may also be called en bloc as bit lines BL without distinguishing between them. In addition, it is not a necessity to have the selecting gate transistors ST1, ST2 on the two sides. As long as the NAND cell can be selected, they may also be set only on one side.

The word lines WL0 to WLn−1 (n is an integer of 1 or larger) extend in the WL direction, and they are commonly connected for the memory cells adjacent in the WL direction. In order to simplify explanation, in the following, when there is no need to distinguish the word lines WL0 to WL7 from each other, they are en bloc called word lines WL.

The select gate lines SGD, SGS are commonly connected at the gate electrodes of the selecting gate transistors ST1, ST2 of the memory cells.

Also, the data may be written en bloc to the plural memory cell transistors MT connected to the same word line WL, and this unit is called a page. In addition, data are erased en bloc for the plural NAND cells on the same row, and this unit is called a memory block.

In the following, memory cell array 11 will be explained with reference to FIG. 4, a plane view of the memory cell array.

Figure 4:
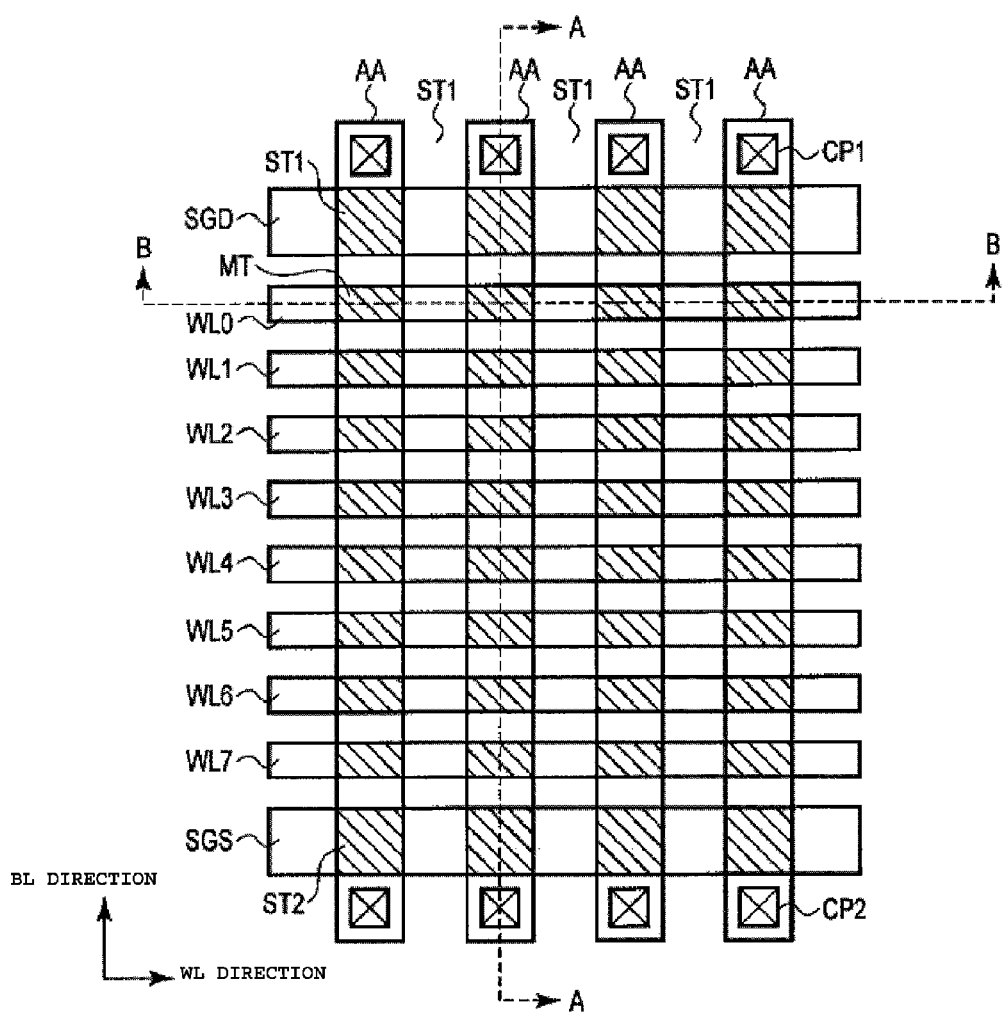
FIG. 4 is a plane view illustrating the memory cell array of the first embodiment.

As shown in FIG. 4, plural stripe-shaped element regions AA (active areas) extend in the bit line BL direction in a p type semiconductor substrate and are arranged in a strip pattern in the word line WL direction orthogonal to the bit line BL direction. Between the adjacent element regions AA, element isolating region STI (shallow trench isolation) extending in the bit line BL direction is formed. With this element isolating region STI, the element regions AA are electrically isolated from each other.

On the semiconductor substrate, word lines WL and select gate lines SGD, SGS are formed in the word line WL direction such that they stride the plural element regions AA. Next, in the regions crossing the word lines WL and element regions AA, memory cell transistors MT are arranged and, in the regions where the select gate lines SGD, SGS and the element regions AA cross each other, the selecting gate transistors ST1, ST2 are formed.

In the element regions AA between the word lines WL, between the select gate lines, and between the word lines WL and the select gate line, an impurity diffusion layer is formed as the source regions or drain regions of the memory cell transistors MT and the selecting gate transistors ST1, ST2.

The impurity diffusion layer formed on the element regions AA between the adjacent select gate lines SGD in the bit line BL direction serves as the drain region of the selecting gate transistor ST1. On the drain region, the contact plug CP1 is formed. The contact plug CP1 is connected to the stripe-shaped bit lines BL (not shown in the figure) arranged in the bit line BL direction.

The impurity diffusion layer formed on the element regions AA between the adjacent common selecting gate lines SGS in the bit line BL direction works as the source region of the selecting gate transistor ST2. On this source region, contact plug CP2 is formed. The contact plug CP2 is connected to the source line SL not shown in the figure.

1.1.3 A Brief Account of the Power Supply Generating Circuit

In the following, the voltage generating circuit 16-1 will be explained. Here, the first voltage driver 16-1a generates voltage VPGM in a data write operation, then it sends the voltage VPGM to the word line WL. The voltage VPGM causes the transition of the memory cell transistor MT to another level as the charge of the channel in the memory cell transistor MT is injected into the charge storage layer.

The second voltage driver 16-1b then generates voltage VPASS, and sends the voltage VPASS to the non-selected word line WL. The voltage VPASS is a voltage for setting the memory cell transistor MT to on.

The third voltage, driver 16-1c then generates voltage VERA, and sends the voltage to the well control circuit 19. That is, the third voltage driver 16-1c applies the voltage VERA on the well control circuit 19 when data erasure is carried out.

When there is no need to distinguish the first voltage driver 16-1a, second voltage driver 16-2b and third voltage driver 16-1c from each other, they may be referred to simply as voltage drivers.

1.1.4 A Brief Account of the Power Supply Drivers

Figure 5:
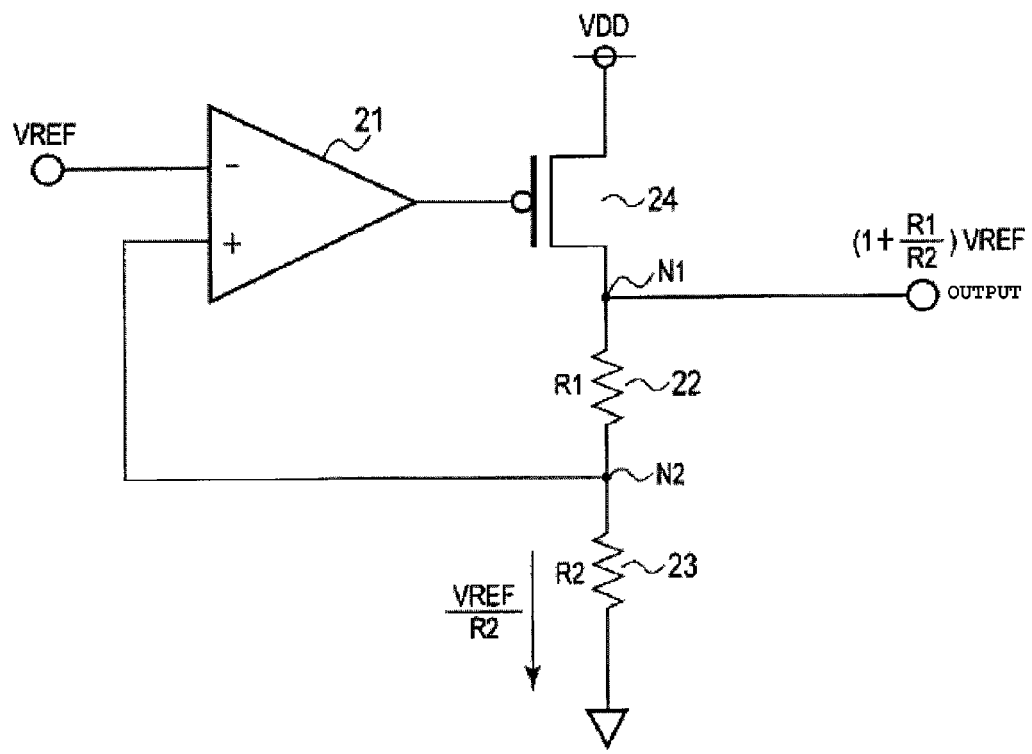
FIG. 5 is a schematic circuit diagram illustrating the basic components of a voltage driver.

In the following, a schematic description will be presented for the basic components of a first voltage driver 16-1a with reference to FIG. 5. Here, FIG. 5 is a schematic circuit diagram illustrating the basic components of the voltage driver. The configuration explained here may also be used in other voltage drivers.

As shown in FIG. 5, the first voltage driver 16-1a has comparator 21, resistance elements 22, 23, and n type transistor 24. More specifically, the first voltage driver 16-1a has the following parts: an n type transistor 24, which has VDD (power supply voltage) applied on one terminal of the current route and has the other terminal of the current route connected to the node N1, a resistance element 22, which has one terminal connected to the node N1 and has the other terminal connected to node N2, and also has a resistance value of R1, a resistance element 23, which has one terminal connected to node N2 and has the other terminal connected to the ground, and which has a resistance value of R2, and a comparator 21, which has reference voltage VREF input to its inverted input terminal and has node N2 connected to its non-inverted input terminal, and which also outputs the result of arithmetic and logic operation to the gate of the transistor 24.

The potential at node N1 is divided at the node N2 by the resistance elements 22 and 23. That is, one terminal of the resistance element 22 is connected to node N1, and the other terminal is connected to one terminal of the resistance element 23 via node N2. The other terminal of the resistance element 23 is grounded. Here, the voltage at node N2 is VM1. The comparator 21 then compares the reference voltage VREF with the voltage VM1 at the node N2, and it outputs the comparison result as L level or H level to the gate of the transistor 24. That is, if the potential at node N2 is lower than the reference voltage VREF, the comparator 21 outputs the H level. That is, until the potential at the node N2 reaches a prescribed potential, the comparator 21 outputs the H level signal to the gate of the transistor 24.

On the other hand, if the potential at the node N2 is higher than the reference voltage VREF, the comparator 21 outputs the L level. That is, at the time point when the potential at the node N1 reaches the prescribed voltage, the comparator 21 outputs the L level signal to the gate of the transistor 24. The output potential $(1+R1/R2)VREF$ is sent via node N1 to the word line WL.

When a current is generated in the current driver, in the resistance element 23, current VREF/R2 flows to the ground. Here, as the resistance value R2 of the resistance element 23 is increased, it is possible to decrease the current consumption. Also, in order to maintain a steady output voltage at node N1, it is preferred that the resistance value R1 of the resistance element 22 be increased while the resistance value R2 of the resistance element 23 is increased. When there is no need to distinguish the resistance element 22 and resistance element 23 from each other, they may simply be referred to as resistance elements.

1.1.5 Relationship Between the Memory Cell Array and the Resistance Elements

In a semiconductor device, layers or the like may be defined, and transistors and wiring, etc., are formed in the defined layers.

Figure 6:
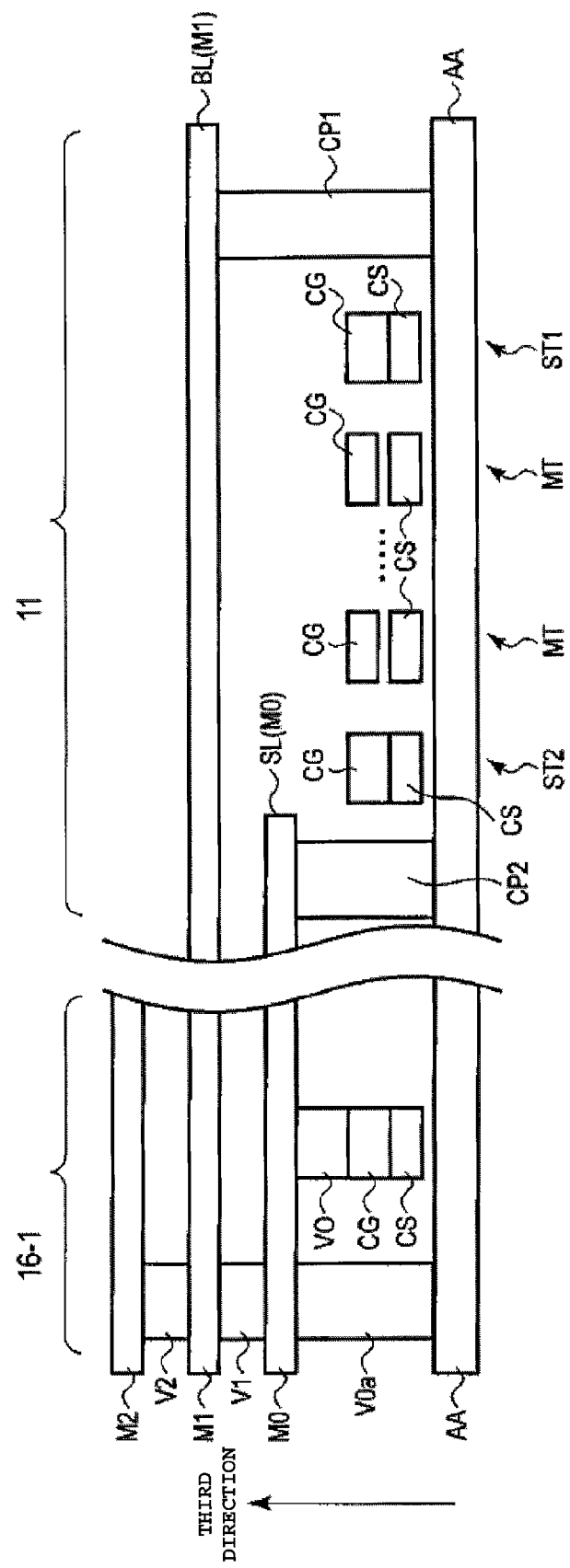
FIG. 6 is a cross-sectional view illustrating the position relationship of the memory cell array and wiring of the resistance elements in the first voltage driver.

In the following, a brief account will be given on the relationship between the memory cell array 11 and the peripheral circuit (the wiring of the resistance element of the first voltage driver 16-1a) with reference to FIG. 6. FIG. 6 is a cross-sectional view taken along the bit line direction for the wiring of the resistance elements of the memory cell array 11 and the first voltage driver 16-1a. The structure shown in FIG. 6 is a schematic image illuminating the positional relationships between the various wiring layers and the transistors, etc., especially in the Z-direction (the third direction), and the actual wiring structure may be different from it in some respects.

As shown in FIG. 6, the memory cell array 11 has memory cell transistors MT having charge storage layer CS and control gate electrode CG, as well as selecting transistors ST above the element regions AA of the semiconductor substrate. Also, contact plugs CP1, CP2 are formed on the impurity diffusion region of the selecting transistors ST. Here, the contact plug CP1 is connected to the bit line BL (M1) arranged above the memory cell transistors MT and selecting transistors ST. Also, the contact plug CP2 is connected to the source line SL (M0) arranged above the memory cell transistors MT and the selecting transistors ST.

As shown in FIG. 6, in the resistance-element-forming region of the voltage generating circuit 16-1, a transistor structure having charge storage layer CS and control gate electrode CG may be formed above the element regions AA of the semiconductor substrate. Also, the control gate electrode CG may be connected to the wiring layer M0 via contact part V2. The wiring layer M0 may be connected to the element regions AA via contact part V0a. In addition, the wiring layer M0 may be connected to the wiring layer M1 via the contact part V1. Besides, the wiring layer M1 may be connected to the wiring layer M2 via contact part V2. Here, wiring layer M0 is on the same layer as the source line SL, and wiring layer M1 is on the same layer as the bit lines BL.

1.1.6 About the First Wiring Structure

Figure 7B:
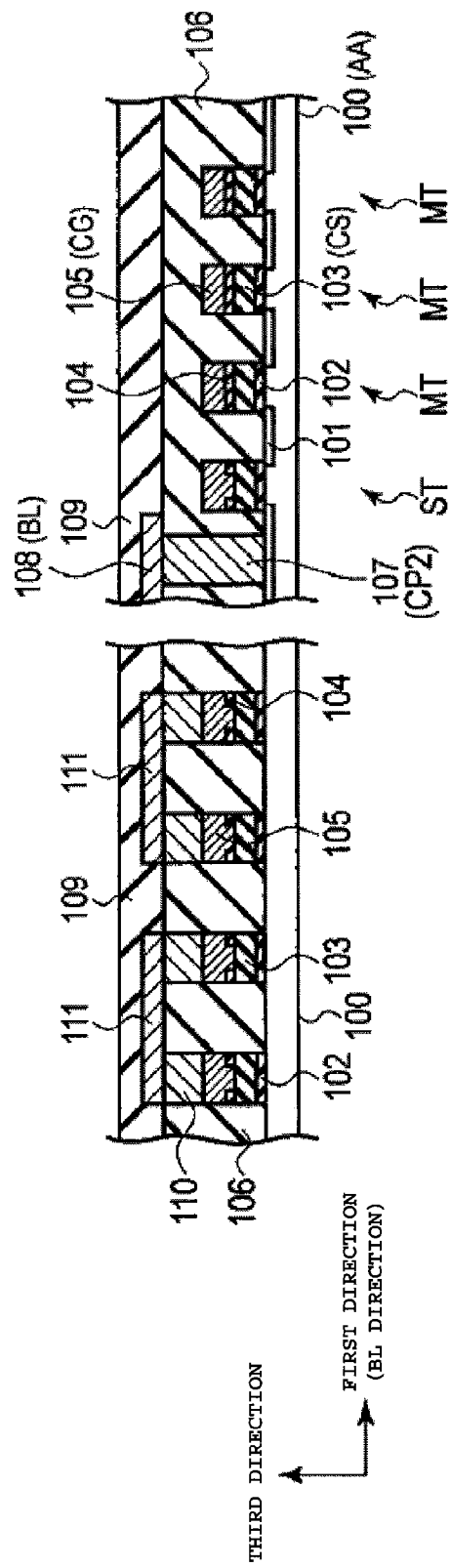
FIG. 7B is a cross-sectional view taken across A-A of FIG. 7A.

In the following, the components of the memory cell array 11 and the first wiring structure 31 of the resistance element of the voltage generating circuit 16-1 will be explained with reference to FIGS. 7A and 7B. FIG. 7A is a plane view illustrating the memory cell array 11 and the first wiring structure 31. FIG. 7B is a cross-sectional view taken across A-A of FIG. 7A.

As shown in FIGS. 7A and 7B, in the memory cell array 11 formation region, n type well region (n-well) (not shown in the figure) is formed on the surface region of the p type semiconductor substrate (p-substrate), and, p type well region (p-well) (not shown in the figure) is formed on the n type well region. Here, the p type semiconductor substrate 100, the n type well region and the p type well region together are simply called semiconductor substrate 100.

On the element regions AA of the p type well region 100, for example, a silicon oxide film is formed as a tunnel insulating film 102 and, on the tunnel insulating film 102, memory cell transistors MT and the gate structure of selecting gate transistor ST1 and selecting gate transistor ST2 are formed. On the memory cell transistors MT, the tunnel insulating film 102 works as a tunnel film where electrons may tunnel through.

The gate structure of the memory cell transistors MT is a laminated structure. That is, it has a charge storage film 103 formed on the tunnel insulating film 102, an insulating film 104 formed on the charge storage film 103, and an electrode film 105 formed on the insulating film 104. Here, the charge storage film 103 stores the electric charge, and the insulating film 104 encloses the electric charge in the charge storage film 103. The electrode film 105 works as a control gate (word line WL).

In the following, the charge storage film 103, insulating film 104 and electrode film 105 in the memory cell transistors MT will be called charge storage film 103, gate insulating film 104 and control gate electrode 105, respectively. The charge storage film 103 is isolated for each of the memory cell transistors MT, and the gate insulating film 104, and control gate electrode 105 are commonly connected between the memory cell transistors MT adjacent in the word line WL direction. That is, the control gate electrode 105 of each memory cell transistor MT strides the adjacent element isolating region and is commonly connected between the adjacent element regions AA.

The gate structure of the selecting gate transistor ST1 and selecting gate transistor ST2 has a charge storage film 103 formed on the tunnel insulating film 102, an insulating film 104 formed on a portion of the charge storage film 103, and electrode film 105 formed on the insulating film 104 and on a portion of the charge storage film 103. In the gate structure of the selecting gate transistor ST2, a portion of the charge storage film 103 is connected to the electrode film 105. However, it may also be separated by the insulating film 104. Here, for convenience, the electrode film 105 is also called gate electrode 105. In the selecting gate transistor ST1 and selecting gate transistor ST2, the gate electrodes 105 adjacent to each other in the word line WL direction are commonly connected. Here, gate electrode 105 works as the select gate lines SGD or the select gate line SGS.

Within the outer surface of the p type semiconductor substrate 100 located between the gate electrodes, n+ type impurity diffusion layer 101 is formed. Here, the n+ type impurity diffusion layer 101 is shared by the adjacent transistors, and it works as the source (S) or drain (D). The region between the adjacent source and drain (the region right below the gate electrode) works as the channel region that becomes the electron movement region. With the gate electrodes, n+ type impurity diffusion layer 101, and channel regions, the memory cell transistors MT and the selecting gate transistors ST1 and ST2 are formed.

In addition, on the p type semiconductor substrate 100, an interlayer insulating film 106 is formed to cover the memory cell transistors MT and the selecting gate transistors ST1, ST2. In the interlayer insulating film 106, a contact plug CP1 (not shown in the figure) that reaches the impurity diffusion layer (drain) 101 of the selecting gate transistor ST1 on the drain side is formed. In addition, in the interlayer insulating film 106, a contact plug CP2 (107) that reaches the impurity diffusion layer (source) 101 of the selecting gate transistor ST2 on the source side is formed.

Also, on the interlayer insulating film 106, wiring 108 as the source line SL is formed, and it is in contact with the upper surface of the contact plug 107. The insulating film 109 is then formed on the wiring 108.

In addition, as shown in FIGS. 7A and 7B, in the region where the first wiring structure 31 is formed, on the element regions AA of the semiconductor substrate 100, tunnel insulating film 102 is formed. On the tunnel insulating film 102, the same gate structure for contact as the selecting transistors ST is formed.

The gate structure for contact has the following parts: a charge storage film 103 formed on the tunnel insulating film 102, an insulating film 104 formed on a portion of the charge storage film 103, and the electrode film 105 formed on the insulating film 104 and a portion of the charge storage film 103. For the gate structure for contact, a portion of the charge storage film 103 is connected to the electrode film 105. Here, for convenience, the electrode film 105 is also called resistance film 105. On the first wiring structure 31, the resistance film 105 extends in the second direction (in the word line WL direction).

In addition, the interlayer insulating film 106 is formed to cover the gate structure for contact. On the first wiring structure 31 and in the interlayer insulating film 106, contact plug 110 (CP) is formed.

On the contact plug 110 and the interlayer insulating film 106, a wiring layer 111 for connecting two contact plugs 110 adjacent to each other in the first direction (in the bit line direction) is formed. An insulating film 109 is then formed to cover the wiring layer 111.

More specifically, the contact plug 110 is formed on the first end of the resistance film 105 and the second end of resistance film 105. The contact wiring 111 then connects the contact plug 110 formed on the first end of the resistance film

105 and the contact plug 110 formed on the first end of another resistance film 105 adjacent to the contact plug in the second direction. The other contact wiring layer 111 connects the contact plug 110 formed on the second end of the resistance film 105 and the second end of another resistance film 105 adjacent to the resistance film in the second direction. Consequently, as shown in FIG. 7A, the first wiring structure 31 has a zigzag shape.

The resistance film 105 has the same width (the length in the first direction) as the control gate of the memory cell transistors MT or selecting transistors ST Resistance film 105 extends longitudinally in the second direction. Here, one end of the resistance film 105 is connected to another resistance film 105 adjacent in the first direction via the contact plug 110 and the wiring layer 111; the other end of the resistance film 105 is connected to yet another resistance film 105 adjacent in the first direction via the contact plug 110 and the wiring layer 111. The alternating end connections using wiring layer 11 results in a zigzag current path in the layer of resistance films 105.

As explained above, the first wiring structure 31 has a resistance film 105, a contact plug 110, and a contact wiring 111. Here, the first wiring structure 31 is used as the resistance element 22 or resistance element 23 of the voltage driver. By adjusting the number and length of the pieces of the resistance film 105, the desired resistance value can be realized.

In FIG. 6, the resistance film 105 corresponds to the control gate electrode CG, the contact plug 110 corresponds to the contact part V0, and the contact wiring layer 111 corresponds to the wiring layer M0.

1.2 Manufacturing Method of the First Wiring

Figure 8:
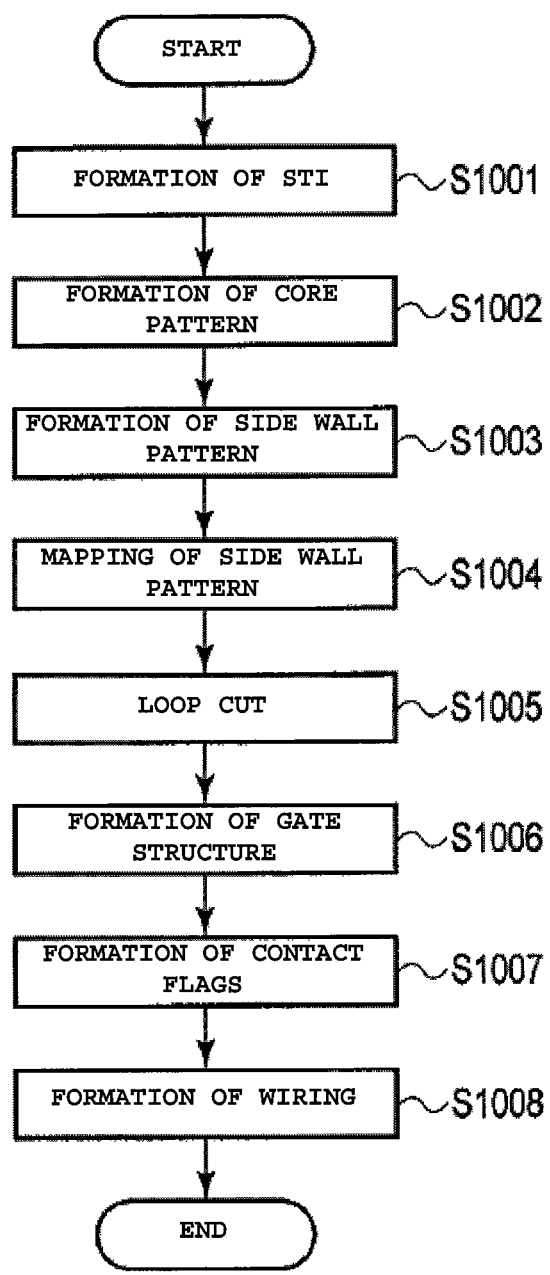
FIG. 8 is a flow chart illustrating a manufacturing method of the semiconductor device of the first embodiment.

In the following, with reference to FIG. 7A through FIG. 19B, a brief account will be given of a basic method for manufacturing a first wiring structure 31 and a memory cell array 11. FIG. 8 is a flowchart illustrating the manufacturing method of the semiconductor device related to Embodiment 1. FIG. 9A through FIG. 19A are schematic plane views illustrating the basic manufacturing method of the semiconductor device related to Embodiment 1. FIG. 9B through FIG. 19B are cross-sectional views taken across A-A in FIG. 4 and FIG. 9A through FIG. 19A. In the following, the manufacturing method of the first semiconductor device will be explained with reference to the flow chart shown in FIG. 8. Here, an explanation will be made of the case in which the first wiring structure forms the resistance elements in voltage generating circuit 16-1 and the first wiring structure is formed at the same time as memory cell transistors MT and selecting transistors ST are formed in the memory cell array 11.

(Step S1001) Formation of ST1

Figure 9A:
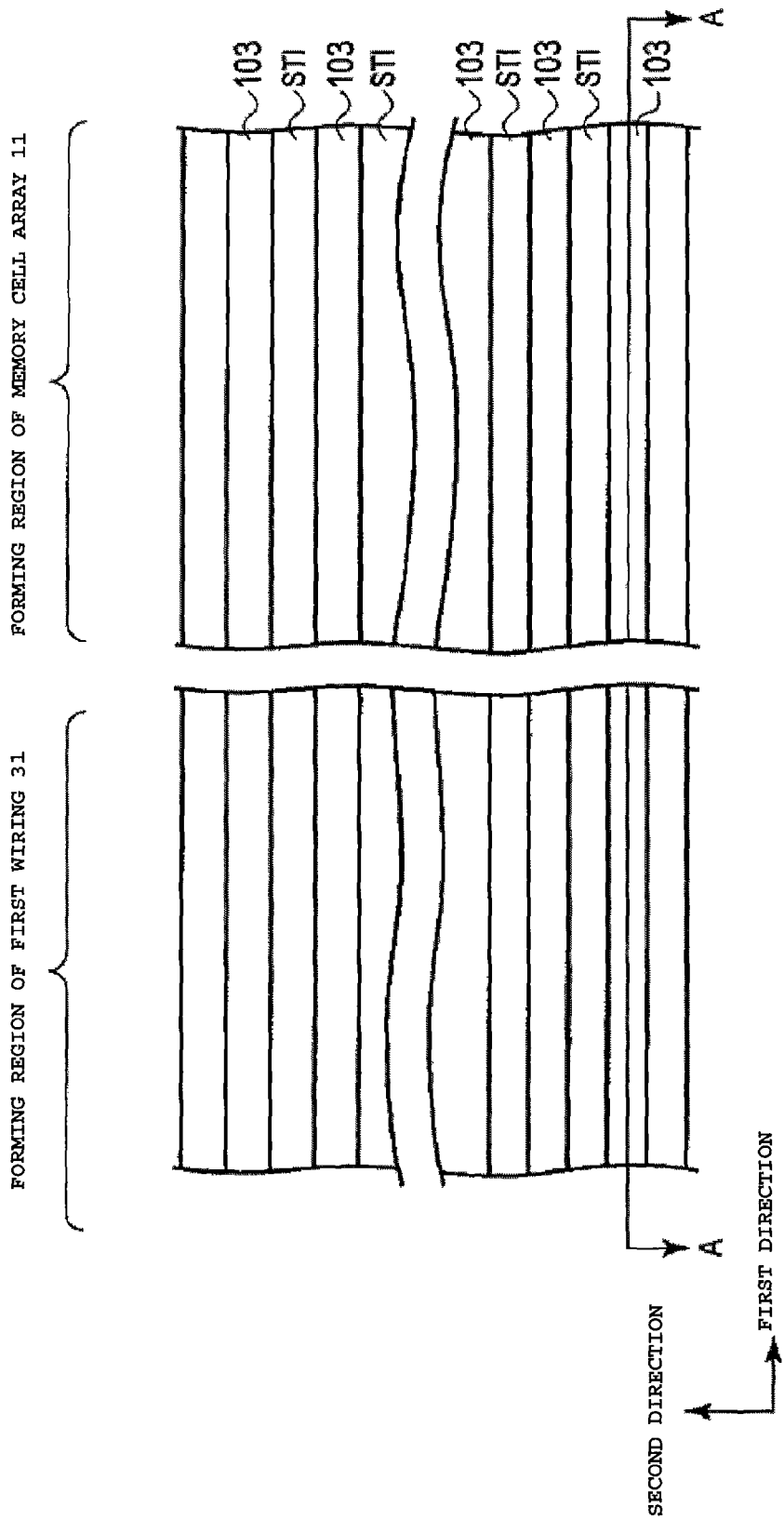
FIG. 9A is a schematic plane view illustrating the semiconductor device of the first embodiment during manufacturing.

As shown in FIGS. 9A and 9B, on the semiconductor substrate 100, an insulating film 102 made of, e.g., a silicon oxide film is formed. On the insulating film 102, a charge storage film 103 made of silicon nitride is formed. The charge storage film 103, insulating film 102 and semiconductor substrate 100 are then partially removed and trenches extending in the bit line direction are formed so that the charge storage film 103 and the element regions AA formed in the later operation are cut and divided in the word line direction (the second direction). An insulating film is then filled in the trenches, forming the element isolating region STI.

(Step S1002) Formation of the Core Pattern

As shown in FIGS. 10A and 10B, on charge storage film 103, an insulating film 104 is formed. On the insulating film 104, an electrode film 105 is formed. Here, in the selecting transistors ST formed on the region where the memory cell array 11 is formed, a portion of the insulating film 104 may be removed so that the charge storage film and the electrode film are connected with each other. Next, on the electrode film 105, an insulating film 112 and an insulating film 113 are formed. On the insulating film 113, by means of a resist or the like not shown in the figure, the core pattern is formed, and mapping is carried out to the insulating film 113. As a result, on the insulating film 112 of the region where the memory cell array 11 is formed, the core pattern 113*a* is formed and, on the insulating film 112 of the region where the first wiring structure 31 is formed, the core pattern 113*b* is formed. The core pattern 113*a* formed on the region where the memory cell array 11 is formed extends in the second direction, and it has width W1 in the first direction and the portions of the core pattern are formed every width W2, parallel with each other. The core pattern 113*b* formed on the insulating film 112 of the region where the first wiring structure 31 is formed extends in the second direction, it has width W3 in the first direction, and the portions of the core pattern are formed every width W4, parallel with each other.

(Step S1003) Formation of Side Wall Pattern

Figure 11B:
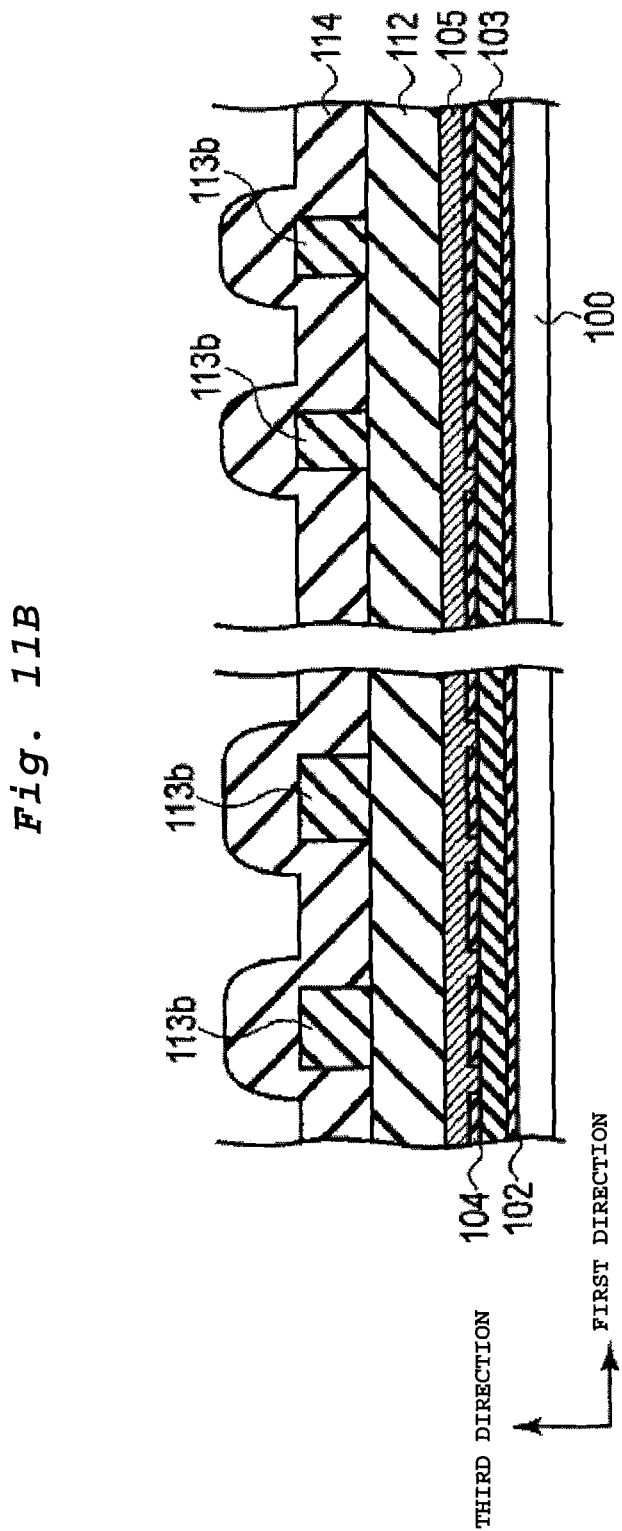
FIG. 11B is a cross-sectional view taken across A-A of FIG. 11A.

As shown in FIGS. 11A and 11B, for the core pattern 113*a* and core pattern 113*b*, thinning or the like is carried out to reduce the width in the first direction for the core pattern 113*a* and core pattern 113*b*. As a result, the width of the core pattern 113*a* in the first direction becomes W1*a*, and the width of the core pattern 113*b* in the first direction becomes W2*a*. However, it is not a necessity to carry out thinning and such process is optional. On the insulating film 112, side wall film 114 is formed on the top surface and side surface of the core pattern 113*a* and core pattern 113*b*.

Figure 12B:
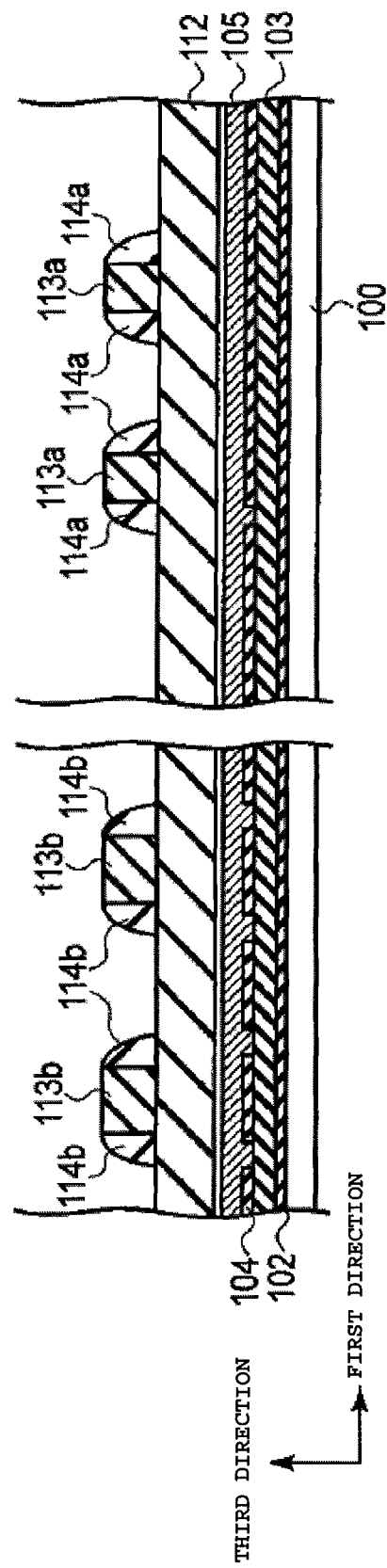
FIG. 12B is a cross-sectional view taken across A-A of FIG. 12A.

As shown in FIGS. 12A and 12B, by etch-back of the side wall film 114, a loop-shaped side wall pattern 114*a* is formed on the side wall of the core pattern 113*a*. On the side wall of the core pattern 113*b*, a loop-shaped side wall film pattern 114*b* is formed. The width of the side wall pattern 114*a* in the first direction is width W1*b*. The spacing between it and the adjacent side wall pattern 114*a* in the first direction is width W2*a*. Also, the width of the side wall film pattern 114*b* in the first direction is width W3*b*. The spacing with the adjacent side wall film pattern 114*b* in the first direction is width W4*a*.

As shown in FIGS. 13A and 13B, the core pattern 113*a* is removed, the side wall pattern 114*a* remains on the insulating film 112 of the region where the memory cell array 11 is formed, and the core pattern 113*b* is removed so that the side wall film pattern 114*b* remains on the insulating film 112 in the region where the first wiring structure 31 is formed.

(Step S1004) Mapping of the Side Wall Pattern

As shown in FIGS. 14A and 14B, with the side wall pattern 114*a* and side wall film pattern 114*b* taken as a mask, RIE or the like is carried out to etch the insulating film 112. As a result, in the region where the memory cell array 11 is formed, the side wall pattern 114*a* is mapped to the insulating film 112, forming a pattern 112*a*. On the other hand, in the region where the first wiring structure 31 is formed, the side wall film pattern 114*b* is mapped to the insulating film 112, forming pattern 112*b*. The pattern 112*a* and pattern 112*b* are formed in a loop shape, and the two patterns extending in the second direction are connected with each other at the end.

(Step S1005) Loop Cut

As shown in FIGS. 15A and 15B, for the loop-shaped pattern 112*a* and pattern 112*b* as patterns extending in the second direction, in order to separate them from each other in the first direction, the ends in the second direction are removed. More specifically, an insulating film (not shown in the figure) is deposited on the entire surface, and the portions of the insulating film deposited on the end 112*c* of the pattern 112*a* and the end 112*d* of the pattern 112*b* are removed. The insulating film is then used as a mask to carry out RIE or the like to remove the end 112c and the end 112d. The insulating film used as a mask is then removed, so that pattern 112e is formed in the region where the memory cell array 11 is formed, and pattern 112f is formed in the region where the first wiring structure 31 is formed. The patterns 112e and 112f extend in the second direction, and they have a shape that is cut and divided in the first direction.

(Step S1006) Formation of the Gate Structure

Figure 16A:
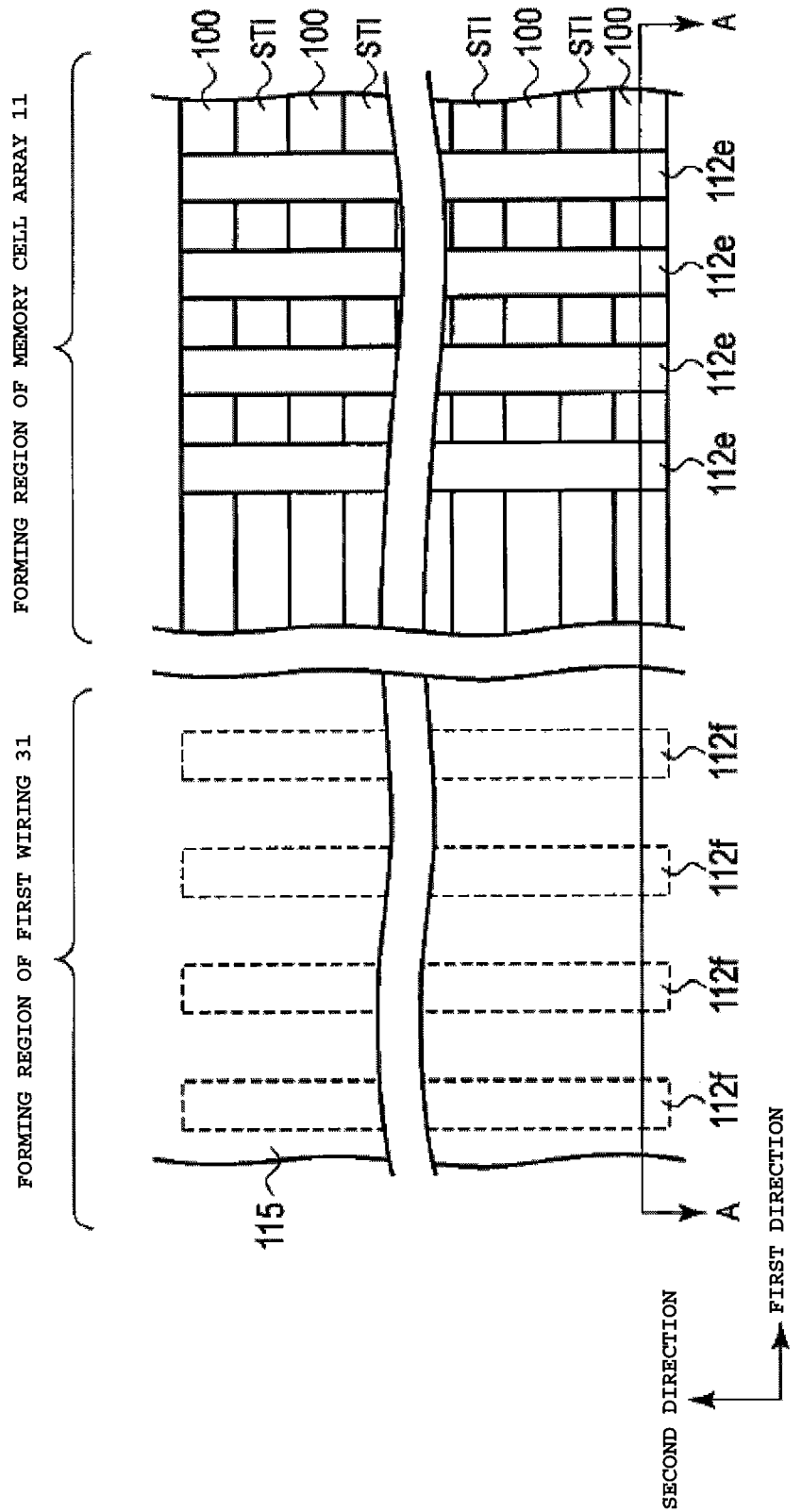
FIG. 16A is a schematic plane view illustrating the semiconductor device of the first embodiment during manufacturing.

As shown in FIGS. 16A and 16B, with the patterns 112e and 112f used as a mask, RIE or the like is carried out to etch the electrode film 105, insulating film 104, charge storage film 103, and insulating film 102, forming a gate structure.

Next, as shown in FIGS. 17A and 17B, an insulating film 115 is formed on the regions on the semiconductor substrate 100 other than the sites where the impurity diffusion region is formed. Ion implanting is then carried out on the entire surface, so that the impurity is implanted into the semiconductor substrate, forming the impurity diffusion region 101.

(Step S1007) Formation of Contact Plugs

Figure 18A:
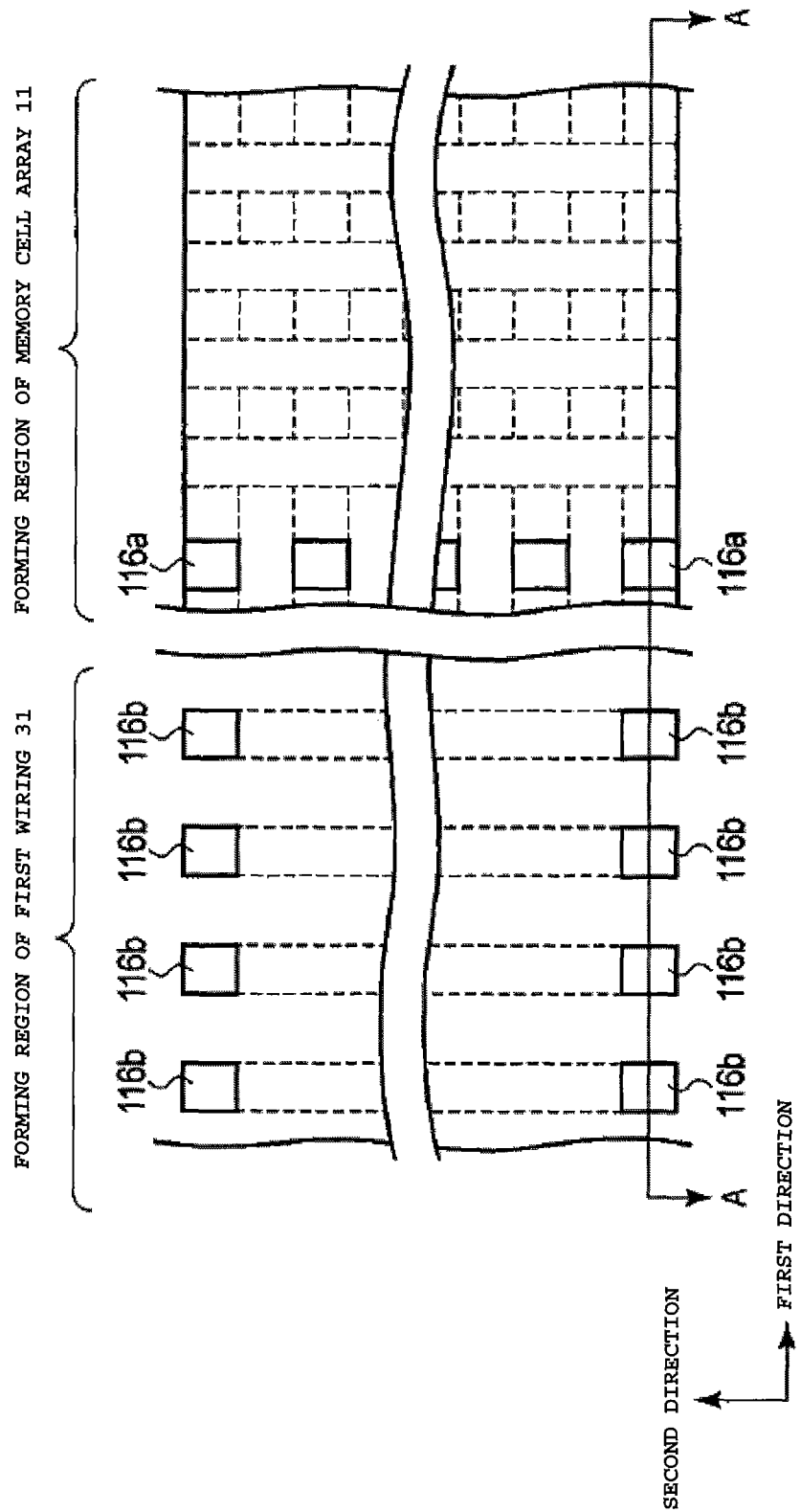
FIG. 18A is a schematic plane view illustrating the semiconductor device of the first embodiment during manufacturing.

As shown in FIGS. 18A and 18B, an interlayer insulating film 106 is formed on the entire surface. A contact hole is then formed in the region where the contact plugs are to be formed. More specifically, in the region where the memory cell array 11 is formed, a contact hole 116a is formed above the impurity diffusion region 101 of the selecting transistors ST. In the region where the first wiring structure 31 is formed, contact holes 116b are then formed at the two ends in the second direction on the electrode film 105.

(Step S1008) Formation of Wiring

Figure 19B:
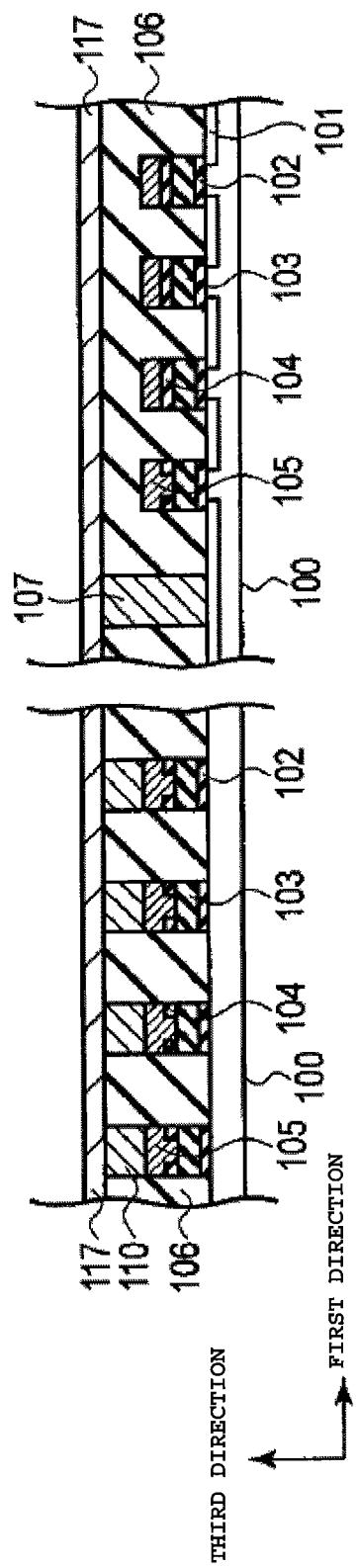
FIG. 19B is a cross-sectional view taken across A-A of FIG. 19A.

As shown in FIGS. 19A and 19B, a metal film is formed on the entire surface. As a result, the metal film fills the inside the contact holes 116a and 116b, forming contact plugs 107 and 110, interlayer insulating film 106 and forming metal film 117 on the contact plugs 107 and 110.

As shown in FIGS. 7A and 7B, in the region where memory cell array 11 is formed, the metal film 117 is patterned in the shape of the source line SL. At the same time, in the region where first wiring structure 31 is formed, the metal film 117 is patterned in the shape of contact wiring 111 so that the contact plugs 110 formed on the two adjacent wiring portions 105 in the first direction are connected with each other.

In this way, by the side-wall processing operation, the first wiring structure 31 is processed at the same time as the gate structure of the memory cell transistors MT and the selecting transistors ST in the memory cell array 11 The first wiring structure thus has the same fine line width as that of the gate structure of the memory cell transistors MT and selecting transistors ST.

1.3 Operation and Effects of Embodiment 1

For the semiconductor device related to Embodiment 1, there are the following parts: a nonvolatile storage region 11 (memory cell array), a voltage generating circuit 16-1 that generates the voltage for erasing the data kept in the storage region 11, and a control circuit 16 that sends the voltage generated by the voltage generating circuit 16-1 to the storage region 11 when the data kept in the memory cell array 11 are to be erased. Here, the voltage generating circuit has an n type transistor 24, which has the power supply voltage applied on one terminal of the current route, a resistance element 22, which has one terminal connected to the other terminal of the first resistance element 22, a second resistance element 23, which has one terminal connected to the other terminal of the first resistance element 22 and has the other terminal connected to the ground potential, and a comparator 21, which compares the reference potential with the potential at the other terminal of the first resistance element 22 and outputs the comparison result to the gate of the transistor 24. Here, the first resistance element 22 and the second resistance element 23 have a wiring structure for resistance (first wiring structure) 31. Here, the wiring structure 31 has resistance wiring 105, which has plural portions arranged in the first direction and which extends in the second direction orthogonal to the first direction, as well as contact plug 110 and contact wiring 111 for electrically connecting the end region of each resistance wiring 105 and the end region of its adjacent resistance wiring 105 in the first direction. The resistance wiring 105 has a line width equal to the finest line width among the wirings formed in the memory region 11. Here, the memory region 11 has the following parts: plural memory cell transistors MT, which are arranged in a matrix configuration including columns and rows perpendicular to the columns, and which has a gate structure containing the first insulating film 102 formed on the semiconductor substrate 100, a charge storage film 103 formed on the first insulating film 102, a second insulating film 104 formed on the charge storage film 103, and a control electrode 105 formed on the second insulating film 104, a first selecting gate transistor ST arranged between one terminal of the memory cell transistor MT arranged in the column direction and the source line SL, a second selecting gate transistor ST arranged between the other terminal of the memory cell transistor MT arranged in the column direction and the bit line BL, and bit lines BL each connected to the second selecting gate transistor and extending in the column direction. In Embodiment 1, the control wiring 105 has the same line width as that of the control electrode 105.

As explained above, in order to generate various voltages, many resistance elements are arranged in the voltage generating circuit 16-1. Consequently, the circuit area needed for the resistance elements becomes larger. On the other hand, for example, when the resistance elements are reduced in size, the current consumption increases when the voltages are generated. Consequently, reduction of the resistance elements is not a preferable scheme. In addition, in recent years, the use of the MONOS type memory cell transistors that do not use a floating gate in the charge storage layer in the NAND flash memory has been proposed. Consequently, the use of the floating gate also cannot lead to high-resistance resistance elements.

Here, as explained above, there is a scheme whereby a wiring structure having resistance wiring of the same wiring width as that of the minimum dimension defined for the semiconductor storage device, such as the control gate electrode, is used. In addition, for the NAND flash memory, by carrying out side wall processing, the various gate structures are formed. Consequently, the resistance wiring is formed together with these processes, so that it is possible to suppress the increase in the number of operations, while it is possible to form the resistance wiring with a high resistance value.

As mentioned previously, by forming the resistance elements with a fine wiring width using the side wall processing scheme, it is possible to realize a high resistance value with a small area. As a result, it is possible to obtain a semiconductor storage device equipped with a high quality power supply generating circuit. Here, it is preferred that the first wiring structure 31 be used as the resistance elements for which the delay is of no concern.

(Embodiment 2)

In the following, the semiconductor device related to Embodiment 2 will be explained. In the explanation of Embodiment 2, it is assumed that the second wiring 32 of the resistance elements that can be used in the various voltage drivers of voltage generating circuit 16-1 has the same line width as that of the bit lines of the memory cell array 11. The basic components and the basic operation of the semiconductor storage device related to Embodiment 2 are the same as those of Embodiment 1. Consequently, the features that have been explained with regard to Embodiment 1 and the features that can be easily derived from Embodiment 1 will not be explained again.

In the following, the second wiring 32 of the resistance elements of voltage generating circuit 16-1 will be explained with reference to FIGS. 20A and 20B. FIG. 20A is a plane view illustrating the memory cell array 11 and the second wiring 32. FIG. 20B is a cross-sectional view taken across B-B in FIG. 20A.

As shown in FIGS. 20A and 20B, in the region where the memory cell array 11 is formed, n type well region (nonwoven fabric) is formed in the surface region of the p type semiconductor substrate (silicon substrate) 100, and p type well region (not shown in the figure) is formed on the n type well region. Between the p type well regions, tunnel insulating film 102 and charge storage film 103 of the memory cell transistors MT adjacent to each other in the channel width direction (in the word line WL direction), PSZ (polysilazane) or the like is formed as the STI (shallow trench isolation)-type element isolating insulating films (element isolating regions) 118, 119.

The gate insulating film 104 is formed on the charge storage film 103 and element isolating insulating film 119. On the insulating film 104, the control gate electrode 105 is formed. On the control gate electrode 105, the interlayer insulating film 106 is then formed. After that, on the interlayer insulating film 106, the source line SL (not shown in the figure) is formed. On the source line SL, the insulating film 109 is formed. On the insulating film 109, the bit lines BL (120*a*) are formed. On the bit lines BL, the insulating film 123 is formed. Here, the insulating film 123 electrically cuts and divides the wiring layer 120*a* into portions corresponding to the adjacent NAND cells, respectively, in the word line direction.

In the region where the second wiring 32 is formed, on the insulating film 109, plural resistance wiring portions 120 are formed extending in the first direction. The plural resistance wiring portions 120 are arranged parallel with each other in the second direction. The width of each of the plural resistance wiring portions 120 in the second direction is equal to the width of the bit lines BL in the second direction. Contact plugs 121 are then formed in the insulating film 123 and on the ends of the resistance wiring portions 120. On the insulating film 123, contact wiring 122 is formed for connecting the two contact plugs 121 adjacent to each other in the second direction. On the contact wiring 122 and insulating film 123, the insulating film 122*a* is then formed.

More specifically, the contact plugs 121 are formed on the first end and the second end of each of the resistance wiring portions 120. The contact wiring 122 has the contact plug 121 formed on the first end of the resistance wiring portion 120 and the contact plug 121 formed on the first end of another resistance wiring portion 120, adjacent to the contact plug 121 in the second direction, connected with each other. Another contact wiring 122 has the contact plug 121 formed on the second end of the resistance wiring portion 120 and the contact plug 121 formed on the second end of yet another resistance wiring portion 120, adjacent in the second direction, connected with each other. Consequently, as shown in FIG. 20A, the second wiring 32 has a zigzag shape.

That is, the resistance wiring portions 120 each have the same width (the length in the second direction) as that of the bit lines BL, and they extend in the first direction. One terminal of each of the resistance wiring portions 120 is connected to another resistance wiring portion 120 adjacent to the resistance wiring portion in the second direction via the contact plug 121, and the other end of the resistance wiring portion 120 is connected to yet another resistance wiring portion 120 adjacent in the second direction via the contact plug 121.

Here, although not described in detail, a structure in which the resistance wiring portions 120 are formed at the same time as the bit lines BL and may have the same line width. By using the method explained with reference to FIG. 10A through FIG. 15B, it is possible to have a wiring structure with resistance wiring portions 120 as fine of a line width as the bit lines BL.

(Embodiment 3)

In the following, the semiconductor device in Embodiment 3 will be explained. Embodiment 3 relates to a three-dimensional laminated NAND flash memory that uses the various voltage drivers of the voltage generating circuit 16-1 and thus uses resistance wiring elements.

3.0 Explanation of the Semiconductor Integrated Circuit with a Three-Dimensional Laminated Structure For the semiconductor integrated circuit with a three-dimensional laminated structure, the three-dimensional structure is realized by laminating plural electroconductive layers made of electroconductive polysilicon on semiconductor substrate. Usually, when a NAND flash memory is used in the semiconductor integrated circuit with a three-dimensional laminated structure (hereinafter to be referred to as three-dimensional laminated NAND flash memory), while the memory cell array is formed in three-dimensional structure, the peripheral circuits (such as the voltage generating circuit) are formed in a two-dimensional structure.

Figure 21:
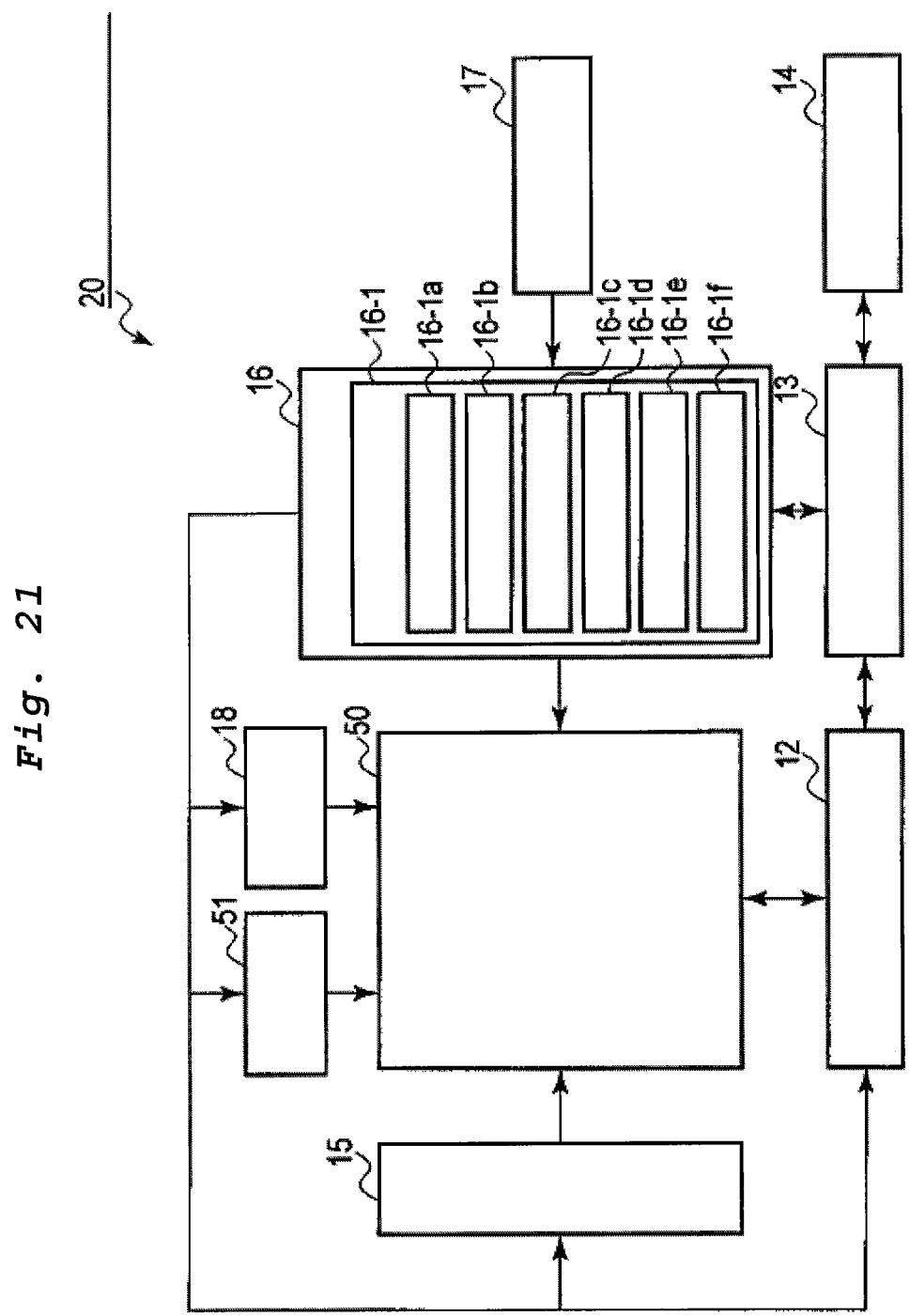
FIG. 21 is a schematic block diagram illustrating the basic components of a three-dimensional laminated NAND flash memory according to a third embodiment.

3.1 Structure 3.1.1 Overall Structure of the Nonvolatile Semiconductor Storage Device In the following, a brief account will be given on the components of the nonvolatile semiconductor storage device (three-dimensional laminated NAND flash memory) 20 related to Embodiment 3 with reference to FIG. 21. FIG. 21 is a schematic block diagram illustrating the basic components of the three-dimensional laminated NAND flash memory 20 related to Embodiment 3. It differs from the NAND type flash memory 10 explained with reference to Embodiment 1 in that the memory cell transistors are formed with a three-dimensional structure. In addition, the three-dimensional laminated NAND flash memory 20 differs from the NAND type flash memory 10 explained with reference to Embodiment 1 in that it has no well control circuit 19, and has the following parts added: a back gate control circuit 51, a fourth voltage driver 16-1*d*, a fifth voltage driver 16-1*e*, and a sixth voltage driver 16-1*f*. Here, in order to simplify the explanation, the features that have been explained for the NAND type flash memory 10 with respect to Embodiment 1 will not be explained again.

As shown in FIG. 21, the three-dimensional laminated NAND flash memory 20 has a memory cell array 50, a column decoder 12, a data input/output buffer 13, a data input/output terminal 14, a row decoder 15, a control circuit 16, a control signal input terminal 17, a source line control circuit 18, and a back gate control circuit 51.

The back gate control circuit 51 is connected to the back gate BG in the memory cell transistor-forming region 50, and it controls the voltage applied on the back gate BG.

The control circuit 16 controls the memory cell array 50, column decoder 12, data input/output buffer 13, row decoder 15, source line control circuit 18 and back gate control circuit 51. For example, the control circuit 16 contains a voltage generating circuit 16-1 for boosting the power supply voltage. The control circuit 16 operates so that the voltage generating circuit 16-1 boosts the power supply voltage as needed, and the boosted voltage is applied on the column decoder 12, data input/output buffer 13, row decoder 15, source line control circuit 18 and back gate control circuit 51.

The control circuit 16 carries out the control operation corresponding to the control signals input from the outer side via the control signal input terminal 17 (command latch enable signal CLE, address latch enable signal ALE, ready/busy signal RY/BY, etc.) and the command input from data input/output terminal 14 via the data input/output buffer 13. That is, corresponding to the control signals and the command, the control circuit 16 generates the desired voltages and feds them to the various parts of the memory cell array 50 in the operation of data program, verify, read and erasure.

The voltage generating circuit 16-1 has the first voltage driver 16-1a, the second voltage driver 16-1b, the third voltage driver 16-1c, the fourth voltage driver 16-1d, the fifth voltage driver 16-1e, and the sixth voltage driver 16-1f for generating various voltages, respectively.

Figure 22:
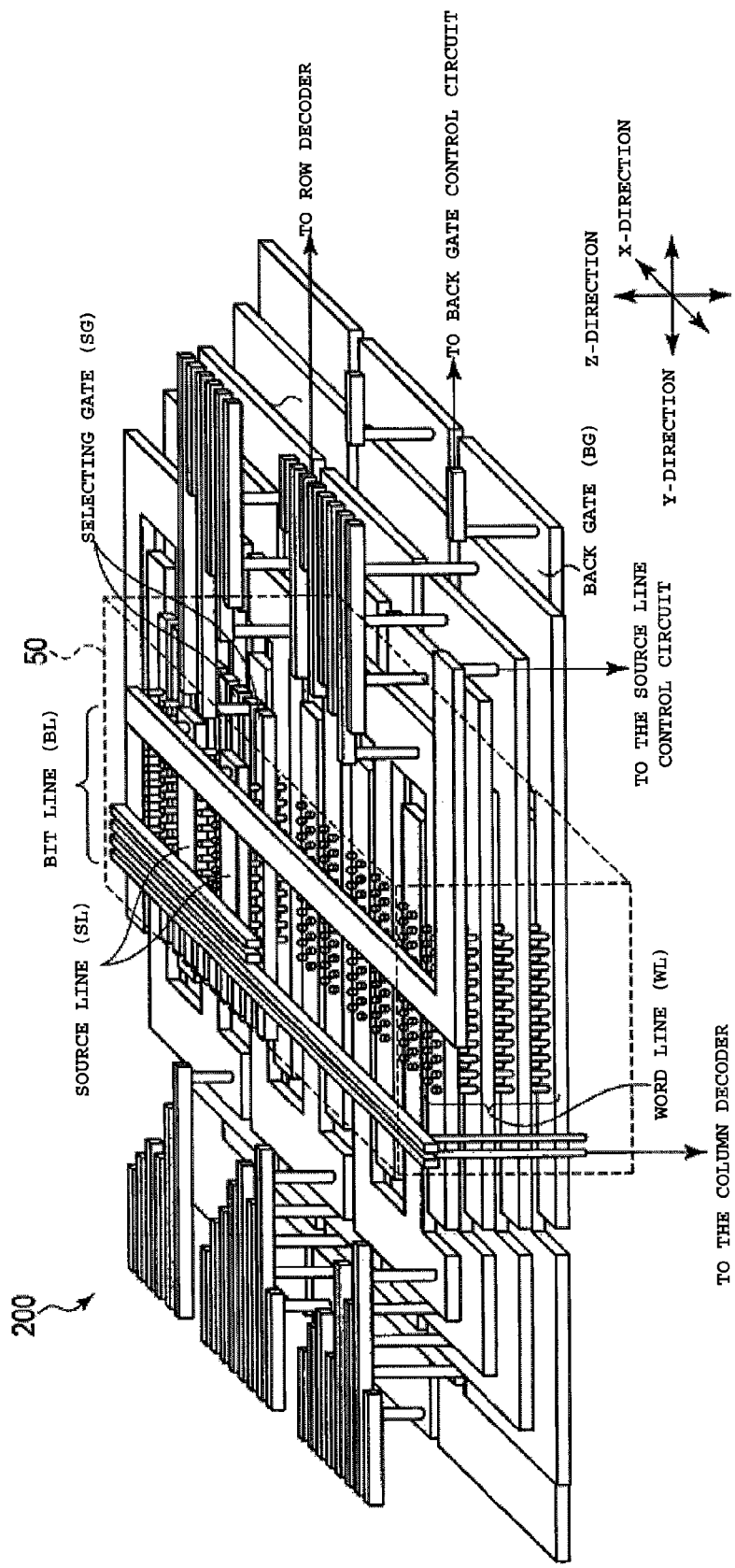
FIG. 22 is a bird's-eye view schematically illustrating the basic components of the three-dimensional laminated NAND flash memory of the third embodiment.

FIG. 22 is a schematic bird's-eye view illustrating the basic components of the nonvolatile semiconductor storage device related to Embodiment 3.

As shown in FIG. 22, the nonvolatile semiconductor storage device (three-dimensional laminated NAND flash memory) 20 has a memory cell transistor-forming region 50, plural word lines WL, plural selecting gates SG, plural source lines SL, and back gate BG, etc.

As an example of the present embodiment, a control circuit 16 is arranged on an outer side of the memory cell transistor-forming region 50 (memory cell array).

In the memory cell transistor-forming region 50, plural word lines WL, plural bit lines BL, plural source lines SL, back gate BG, and plural selecting gates SG are arranged. In the memory cell transistor-forming region 50, memory cell transistors are arranged at the various cross positions between the laminated plural word lines WL and the U-shaped silicon pillars to be explained later. Here, in FIG. 22, an example in which 4 layers of word lines WL are laminated is presented. However, the embodiment is not limited to this number of laminated word lines WL layers.

The row decoder 15 is connected to the word lines WL and controls the voltage applied on the word lines WL. Here, all of the wirings for connecting the row decoder 15 and the word lines WL are formed in the wiring layers on the same level. However, this embodiment is not necessarily limited to this configuration, and word lines WL may also be formed in wiring layers on different levels. Also, the column decoder 12 controls the voltage applied on the bit lines BL.

The source line control circuit 18 is connected to the source lines SL, and it controls the voltage applied on the source lines SL. The source line control circuit 18 is connected to all of the source lines SL. However, it is not limited to this scheme. One may also use a scheme in which one source line control circuit is arranged for each of the source lines SL.

The back gate control circuit 51 is connected to the back gate BG, and it controls the voltage applied on the back gate BG.

3.1.2 Components of the Memory Cell Transistor-Forming Region

In the following, the memory cell transistor-forming region 50 will be explained in more detail.

Figure 23:
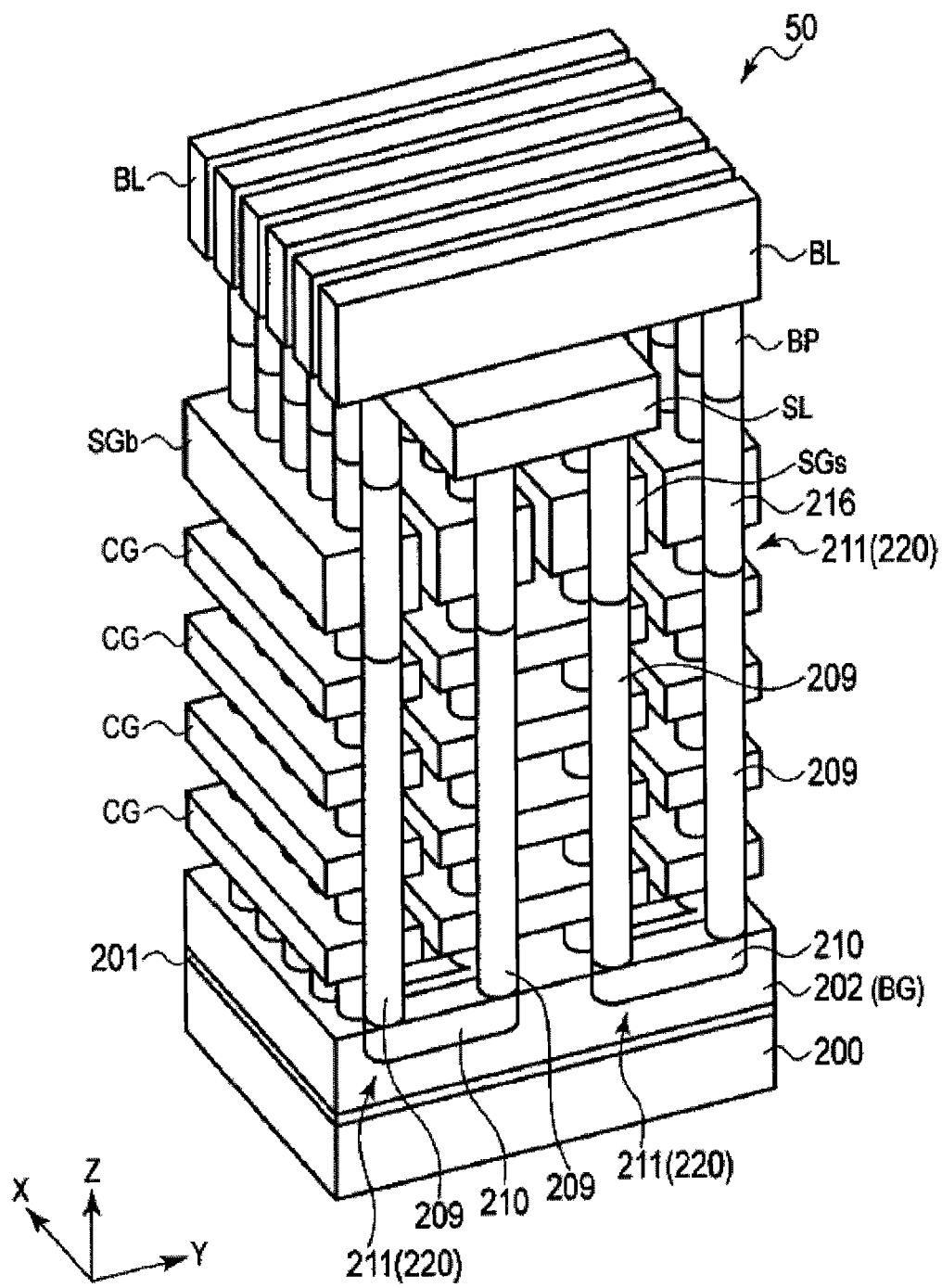
FIG. 23 is an oblique view illustrating an example of the three-dimensional laminated NAND flash memory of the third embodiment.
Figure 24:
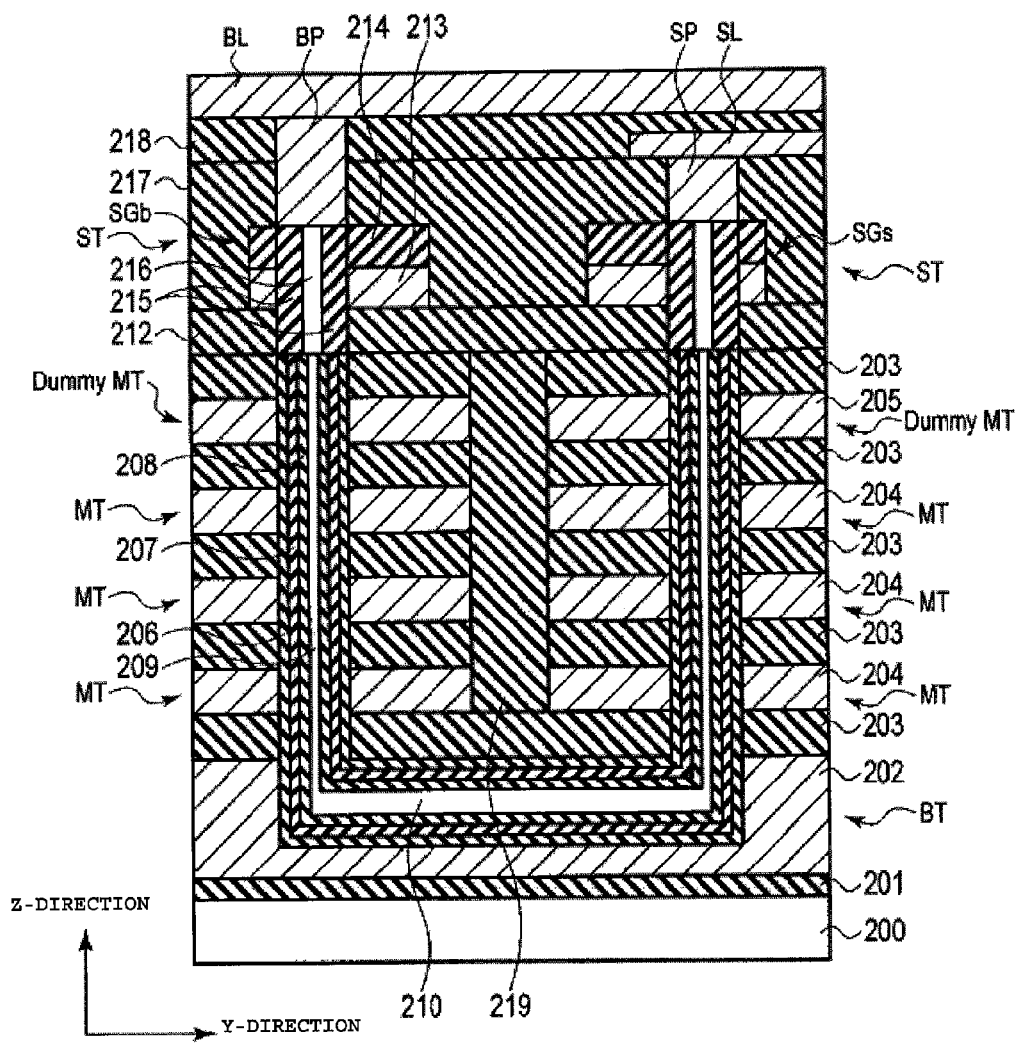
FIG. 24 is a cross-sectional view illustrating an example of the three-dimensional laminated NAND flash memory of the third embodiment.

FIG. 23 is an oblique view illustrating an example of the nonvolatile semiconductor storage device related to the present embodiment. FIG. 24 is a cross-sectional view illustrating an example of the nonvolatile semiconductor storage device related to the present embodiment. In addition, FIG. 25 is a circuit diagram illustrating an example of the nonvolatile semiconductor storage device related to the present embodiment.

Figure 25:
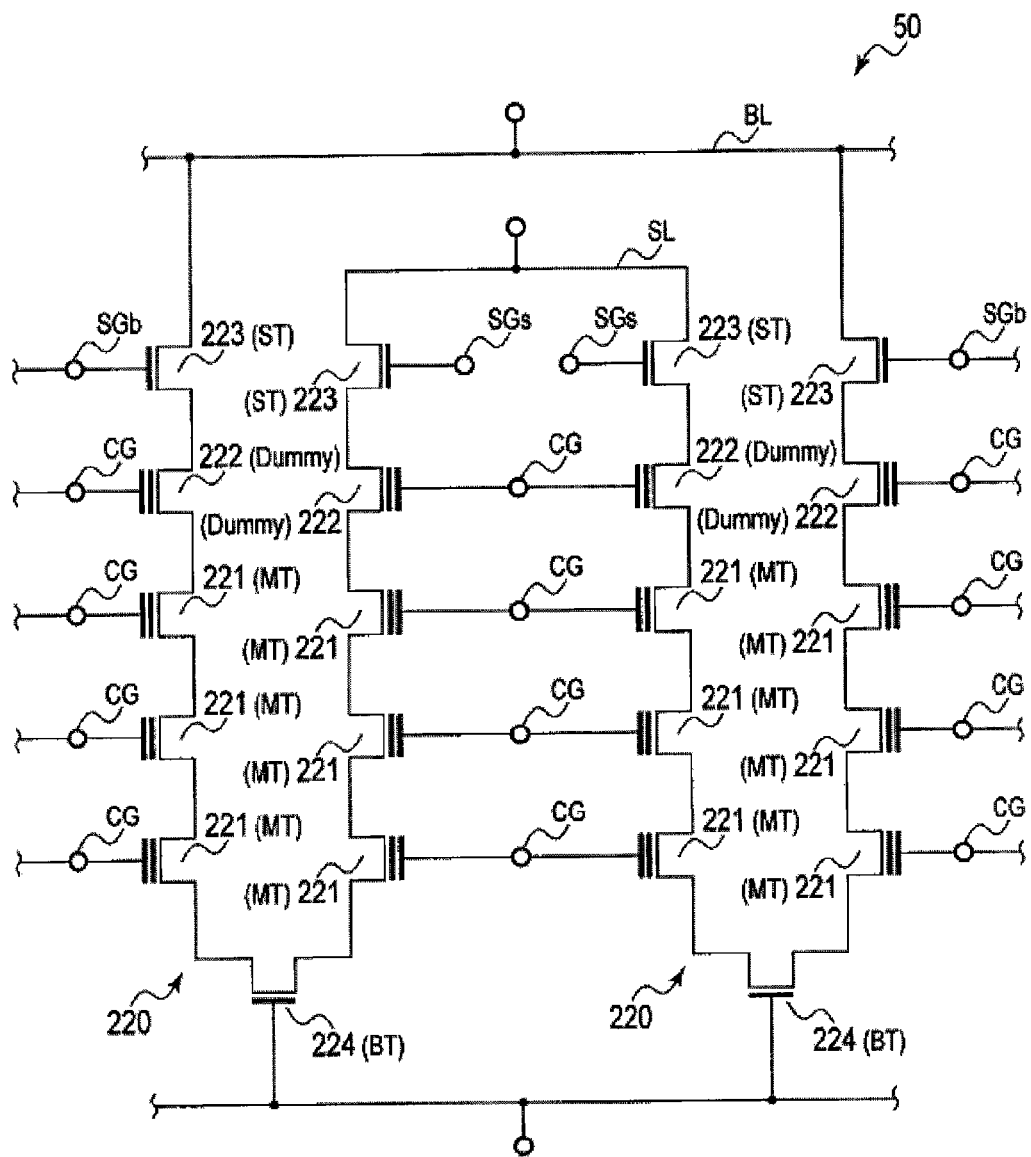
FIG. 25 is a circuit diagram illustrating an example of the three-dimensional laminated NAND flash memory of the third embodiment.

In FIG. 23 through FIG. 25, in order to facilitate viewing of the figures, only 4 layers of the control gate electrodes are shown. In addition, in FIG. 23 to facilitate viewing of the figure, only the silicon substrate and the electroconductive portions of the structure are presented and the insulating portions are not shown. In FIG. 25, a pair of memory strings sharing the control gate electrode is presented.

The nonvolatile semiconductor storage device related to the present embodiment is an en bloc processing type of three-dimensional laminated storage device, with memory transistors arranged at the cross portions between the silicon pillars and the control gate electrodes, respectively. A U-shaped pillar is formed from a pair of silicon pillars, and two columns of the silicon pillars go through each control gate electrode. In addition, the silicon pillars as a pair that form a U-shaped pillar go through different control gate electrodes, respectively, and the memory cell transistor-forming region 50 is divided into plural blocks. As a result, appropriate terminal processing is carried out at the block ends and between the blocks. In the following, the components of the nonvolatile semiconductor storage device will be explained in detail.

As shown in FIG. 23 and FIG. 24, for example, a silicon substrate 200 is arranged in the nonvolatile semiconductor storage device related to the present embodiment. Here, on the silicon substrate 200, a memory cell transistor-forming region 50 where the memory cell transistors are formed and a peripheral circuit region where the peripheral circuits are formed (not shown in the figure) are formed. The peripheral circuit region is arranged on the periphery of the memory cell transistor-forming region 50 in this example. However, it is not a necessity to arrange the peripheral circuit region on the periphery of the memory cell transistor-forming region 50. It may also be arranged below the memory cell transistor-forming region 50. In this case, the peripheral circuit region is formed on the silicon substrate 200, and the memory cell transistor-forming region 50 is formed on the peripheral circuit region.

For the memory cell transistor-forming region 50, an insulating layer 201 is arranged on the silicon substrate 200 and, for example, an electroconductive layer, such as a polysilicon film 202, is formed on the insulating layer; this layer becomes the back gate BG. On the back gate BG, plural insulating layers 203 and plural electrode layers 204 are laminated alternately. The top electrode layer 204 then functions as the electrode layer 205 of the dummy transistors (Dummy MT). The plural insulating layers 203, electrode layers 204, and electrode layer 205 form a laminated body ML.

In the following, in the present specification, in order to facilitate explanation, an XYZ coordinate system is introduced. In this coordinate system, the two directions orthogonal to each other and parallel with the upper surface of the silicon substrate 200 are taken as the X-direction and Y-direction, and the direction orthogonal to both the X-direction and Y-direction, that is, the direction of lamination of the various layers, is taken as the Z-direction.

For example, the electrode layers 204 and electrode layer 205 are made of polysilicon. In the central portion of the X-direction on the laminated body ML, the electrode layers 204 and electrode layer 205 are cut and divided in the Y-direction, forming plural control gate electrodes CG extending in the X-direction. As viewed from the above, that is, from the Z-direction, the electrode layers 204 and electrode layer 205 in the various layers are formed in the same pattern. As to be explained later, at the two ends of the laminated body ML in the X-direction, the electrode layers 204 and electrode layer 205 are not cut and divided in the Y-direction, and they form the shape of a pair of combs. On the other hand, for example, the insulating layers 203 are made of silicon oxide (SiO$_2$), and they work as an interlayer insulating layer for insulating electrode layers 204 from each other and for insulating electrode layers 204 and electrode layer 205 from each other.

On the laminated body ML, the insulating layer 212, electroconductive layer 213, and insulating layer 214 are formed in that order. For example, the electroconductive layer 213 is made of polysilicon, and it is cut and divided in the Y-direction to form plural selecting gate electrodes SG extending in the X-direction. Two of the selecting gate electrodes SG are formed as a group on each region right above the control gate electrodes CG as the top layer. That is, while the selecting gate electrodes SG extend in the same direction as that of the control gate electrodes CG (X-direction), the configuration period is only half. The selecting gate electrodes SG, bit-line-side selecting gate electrodes SGb and source-line-side selecting gate electrodes SGs are formed at the same time.

On the insulating layer 214, an insulating layer 217 is arranged. On the insulating layer 217, the source lines SL extending in the X-direction are arranged. The source lines SL are arranged in the region above every other control gate electrode CG in the Y-direction. Also, on the insulating layer 217, an insulating layer 218 covering the source lines SL is formed. On the insulating layer 218, plural bit lines BL extending in the Y-direction are arranged. Here, the source lines SL and bit lines BL are made of metal layers.

Plural via holes (not shown in the figure) extending in the laminating direction of the various layers (Z-direction) are then formed through the laminated body ML. Each via hole goes through the control gate electrodes CG of the various sections, and its lower end reaches the back gate BG. Here, the via holes are arranged in a matrix configuration in the X-direction and Y-direction. Because the control gate electrodes CG extend in the X-direction, the via holes arranged in the X-direction go through the same control gate electrode CG. The array period of configuration of the via holes in the Y-direction is half the period of configuration of the control gate electrodes CG. As a result, two via holes arranged in the Y-direction form a group, and the via holes belonging to the same group go through the same control gate electrode CG.

In the upper layer portion of the back gate BG, a connecting hole (not shown in the figure) is formed to connect the lower end of one via hole to the lower end of another via hole separated from the via hole by a distance corresponding to column 1 in the Y-direction. As a result, a pair of the via holes adjacent to each other in the Y-direction and the connecting hole that connects them with each other form a continuous U-shaped hole (not shown in the figure). Plural U-shaped holes are formed in the laminated body ML.

On the inner surface of each U-shaped hole, a 3-layer structure film including an oxide film, a nitride film and another oxide film is arranged. The three-layer structure is formed by laminating the following layers in order: an insulating intermediate insulating layer 206, a charge storage layer 207, and a tunnel insulating layer 208. The intermediate insulating layer 206 is in contact with the back gate BG, the control gate electrodes CG and the insulating layers 203. The intermediate insulating layer 206 and the tunnel insulating layer 208 may be made of silicon oxide. The charge storage layer 207 may be made of silicon nitride that traps electric charge.

Because the charge storage layer 207b works as a charge trap type charge storage layer, the intermediate insulating layer 206 works as a block insulating layer.

In the U-shaped hole, a semiconductor material (polysilicon, for example) doped with an impurity is buried. As a result, in the U-shaped hole, U-shaped silicon part 211 is formed. For the U-shaped silicon part 211, the portion located inside the via hole becomes the silicon pillar 209, and the portion located inside the connecting hole becomes connecting part 210. The shape of the silicon pillar 209 is a pole, such as a cylindrical shape, extending in the Z-direction. The shape of the connecting part 210 is a pole shape, such as a square pole, extending in the Y-direction. The two silicon pillars 209 and one connecting part 210 are integrated with each other to form a monolithic U-shaped silicon part 211. Consequently, the U-shaped silicon part 211 is formed continuously, free of cut slots in the longitudinal direction. In addition, the U-shaped silicon part 211 is insulated from the back gate BG and control gate electrodes CG by the 3-layer structure film. Here, the silicon pillar 209 and connecting part 210 are made of semiconductor materials doped with impurity. However, the embodiment is not limited to this scheme.

In addition, plural via holes (not shown in the figure) are formed on the insulating layer 212, selecting gate electrodes SG and electroconductive layer 213. Each via hole is in the region right above another via hole, and it is connected to the via hole below. Here, as the selecting gate electrodes SG extend in the X-direction, the via holes arranged in the X-direction go through the same selecting gate electrode SG. The array period of configuration of the via holes in the Y-direction is the same as the period of configuration of the selecting gate electrodes SG. The configuration phase of the via holes in the Y-direction is also the same as that of the selecting gate electrodes. Consequently, the plural via holes arranged in the Y-direction correspond to the selecting gate electrodes SG on a one-to-one basis, and they each go through different selecting gate electrodes.

On the inner surface of the via hole, a gate insulating layer 215 is formed. In the interior of the via hole, for example, polysilicon is buried, and it becomes the silicon pillar 216. The shape of the silicon pillar 216 is a pole shape, such as a cylindrical shape, extending in the Z-direction. The lower end of the silicon pillar 216 is connected to the upper end of the silicon pillar 209 formed in the region right below it. In addition, the silicon pillar 216 is insulated from the selecting gate electrodes SG by the gate insulating layer 215. The U-shaped silicon part 211 and a pair of silicon pillars 216 connected to its upper end form a U-shaped pillar 220.

In the following, the position relationship between the U-shaped pillar 220, control gate electrodes CG, selecting gate electrodes SG, source lines SL and bit lines BL will be explained.

The U-shaped pillar 220 is formed as a pair including silicon pillar 216 and silicon pillar 209 adjacent to each other in the Y-direction. Silicon pillar 216 and silicon pillar 209 are connected to each other by the connecting part 210. On the other hand, the control gate electrodes CG, selecting gate electrodes SG and source lines SL extend in the X-direction, and bit lines BL extend in the Y-direction. The period of configuration of the U-shaped pillars 220 in the Y-direction and that of the control gate electrodes CG are the same, yet their phases are shifted from each other by a half period. Consequently, a pair of the silicon pillars 209, that is, two silicon pillars 209 connected with each other by the connecting part 210 go through different control gate electrodes CG, respectively. On the other hand, the two silicon pillars 209 belonging to the two U-shaped pillars 220 adjacent to each other in the Y-direction, that is, the adjacent two silicon pillars 209, go through the common control gate electrode CG.

The plural silicon pillars 216 arranged in the Y-direction go through different selecting gate electrodes SG, respectively. Consequently, the silicon pillars 216 belonging to one of the U-shaped pillars 220 also go through different selecting gate electrodes SG, respectively. On the other hand, the plural U-shaped pillars 220 arranged in the X-direction go through a common pair of selecting gate electrodes SG.

Among the two silicon pillars 216 among a pair belonging to one of the U-shaped pillars 220, one silicon pillar 216 is connected to the source line SL via the source plug SP buried in the insulating layer 217, and the other silicon pillar 216 is connected to the bit line BL via the bit plug BP buried in the insulating layer 217 and insulating layer 218. Consequently, the U-shaped pillar 220 is connected between the bit line BL and the source line SL. The source plug SP and bit plug BP are made of n type polysilicon.

In FIG. 23 through FIG. 25, among the selecting gate electrodes SG where the U-shaped pillars 220 go through, the selecting gate electrodes SG arranged on the bit line side are denoted as selecting gate electrodes SGb, and the selecting gate electrodes SG arranged on the source line side are denoted as selecting gate electrodes SGs. Here, the U-shaped pillars 220 arranged in the X-direction are connected to the common source line, and they are connected to different bit lines BL, respectively. Here, the period of configuration of the U-shaped pillars 220 in the X-direction is the same as the period of configuration of the bit lines BL. Consequently, in the X-direction, the U-shaped pillars 220 and the bit lines BL have the one-to-one corresponding relationship. On the other hand, for the U-shaped pillars 220 arranged in the Y-direction, two of them as a group are connected to each source line SL, and they are connected to a common bit line BL.

As shown in FIG. 25, in the nonvolatile semiconductor storage device 20, the silicon pillars 209 work as channels and the control gate electrodes CG work as gate electrodes, so that the vertical memory transistors 221 are formed at the cross portions between the silicon pillars 209 and the control gate electrodes CG, respectively. Each of the memory transistors 221 works as a memory cell transistor MT by storing electrons in the charge storage layer 207 arranged between the silicon pillar 209 and the control gate electrode CG. In addition, at the cross portions between silicon pillars 209 and dummy control gate electrodes CG (205), the dummy memory transistors 222 (Dummy MT) are formed, respectively. Here, for convenience, the control gate electrodes CG may also be called word lines WL.

As shown in FIG. 23 and FIG. 24, in the laminated body ML, plural silicon pillars 209 are arranged in a matrix configuration in the X-direction and Y-direction. Consequently, plural memory transistors 221 are arranged in a three-dimensional configuration in the X-direction, Y-direction and Z-direction.

At the cross portions between the silicon pillars 216 and selecting gate electrodes SG, selecting transistors 223 are formed, with the silicon pillars 216 formed as the channels, the selecting gate electrodes SG formed as the gate electrodes, and the gate insulating layer 215 formed as the gate insulating layer. Just as the memory transistors 221, the selecting transistors 223 are also vertical transistors.

In addition, because a 3-layer film is included between the connecting part 210 and the back gate BG, a back gate transistor 224 is formed, with connecting part 210 as the channel, back gate BG as the gate electrode, and the 3-layer film as the gate insulating layer. Here, the back gate BG works as an electrode that controls the ON state of the connecting part 210 by the electric field.

As a result, as shown in FIG. 23, a memory string is formed connecting bit lines BL and source lines SL along the U-shaped pillars 220. For the memory string, selecting transistors 223 are arranged on its two ends, while back gate transistor 224 is arranged in the center. Between the selecting transistors 223 and the back gate transistor 224, memory transistors 221 in the same number as that of the laminated layers of the electrode layers 204 are connected in tandem. That is, in the laminated body ML, plural memory transistors 221 arranged in a three-dimensional configuration are arranged as a memory string for each U-shaped silicon part 211.

Figure 26:
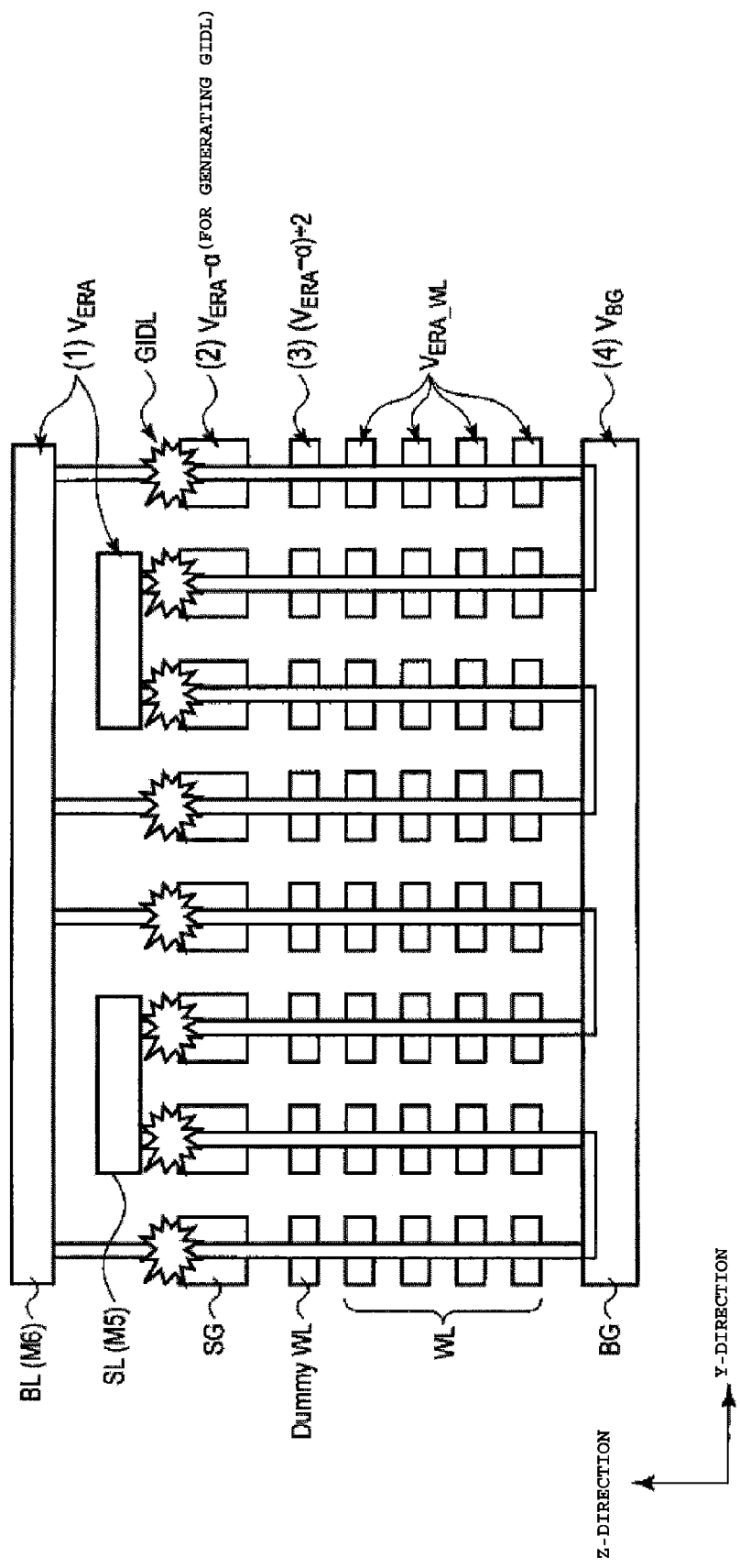
FIG. 26 is a diagram illustrating the voltages applied on the various electrodes in the erasure operation of the three-dimensional laminated NAND flash memory.

3.1.3 Voltage Needed for Erasure Operation of Three-Dimensional Laminated NAND Flash Memory In the following, with reference to FIG. 26, the voltage needed for the erasure operation of the three-dimensional laminated NAND flash memory will be explained. FIG. 26 is a diagram illustrating the voltages applied on the various electrodes in the erasure operation of the three-dimensional laminated NAND flash memory.

The memory cell transistors MT of the three-dimensional laminated NAND flash memory differ from the memory cell transistors MT of the planar type NAND type flash memory 10 in that it does not have a P-well. Consequently, when the charge held in the charge storage layer of the memory cell transistors MT is to be erased, it is necessary to intentionally feed holes into the silicon pillars 209.

Due to this feature, when erasure is to be carried out for the data held in the memory cell transistors MT of the three-dimensional laminated NAND flash memory, it is necessary to generate GIDL (gate induced drain leakage) at the interface between the silicon pillars 216 and the bit plug BP and at the interface between the silicon pillar 216 and the source plug SP. More specifically, GIDL can be generated by applying voltage VERA on the bit lines BL or source lines SL, and by applying voltage VERA-$\alpha$ on the selecting gate electrodes SG.

That is, when data held in the memory cell transistors MT are to be erased, voltage VERA is applied on the bit lines BL or source lines SL, voltage VERA-$\alpha$ is applied on the selecting gate electrodes SG, voltage (VERA-$\alpha$)/2 is applied on dummy word line WL (205), voltage VERA is applied on the word line WL (204), and voltage VBG is applied on the back gate BG. As a result, GIDL is generated at the interface between the silicon pillar 216 and the bit plug BP and at the interface between the silicon pillar 216 and the source plug SP, and holes are injected into the charge storage layer of the memory cell transistor MT. In addition, voltage (VERA-$\alpha$)/2 is applied on the dummy word line WL.

In the erasure operation of the planar type NAND type flash memory 10, if there is the voltage VERA, it is possible to carryout the erasure operation. On the other hand, in the operation of erasure of the three-dimensional laminated NAND flash memory, it is necessary to have the four specified types of high voltages (VERA, VERA-$\alpha$, (VERA-$\alpha$)/2, and VBG).

3.1.4 A Brief Account of the Power Supply Generating Circuit

In the following, the voltage generating circuit 16-1 will be explained. Since the first voltage driver 16-1$a$, second voltage driver 16-1$b$, and third voltage driver 16-1$c$ are the same as mentioned previously, they will not be explained in detail again.

As shown in FIG. 21, the fourth voltage driver 16-1$d$ generates voltage VERA-$\alpha$, then applies it on the selecting gate electrodes SG. Here, the voltage VERA-$\alpha$ is lower by a few volts than the voltage VERA.

The fifth voltage driver 16-1$e$ generates voltage (VERA-$\alpha$)/2, and applies it on the electrode 205 (dummy word line WL).

The sixth voltage driver 16-1*f* then generates the voltage VBG, and applies it on the back gate BG.

When there is no need to distinguish the first voltage driver 16-1*a* through sixth voltage driver 16-1*f*, they are simply referred to as voltage drivers. The components of each of the voltage drivers is the same as that explained with reference to Embodiment 1.

3.1.5 Relationship Between Memory Cell Array-Forming Region And Resistance Elements In the following, with reference to FIG. 27, a brief account will be given on the relationship between the memory cell transistor-forming region 50 and the peripheral circuit (wiring of the resistance elements of the voltage drivers). FIG. 27 is a cross-sectional view illustrating the semiconductor device related to Embodiment 3. The structure shown in FIG. 27 is just an example illustrating the position relationship between the various wiring layers and the transistors particularly in the Z-direction. It may be different from the actual wiring structure of specific embodiments.

As shown in FIG. 27, on the active region AA of the semiconductor substrate, there are transistors used in the peripheral circuit equipped with control gate electrodes CG. On the transistors, contact parts V3 are formed and are connected with the wiring layer M3 arranged above the transistors. Also, the wiring layer M3 may be connected with the active region AA via contact parts V3*a*. In addition, the wiring layer M3 may be connected with the wiring layer M4 via contact parts V4. Also, the wiring layer M4 may be connected with the wiring layer M5 via contact part V5. In addition, wiring layer M5 may also be connected with the wiring layer M6 via contact part V6. Besides, the wiring layer M6 may also be connected with the wiring layer M7 via contact part V7. In addition, the memory cell transistor-forming region 50 is located above the wiring layer M4. More specifically, the structure of the back gates BG to selecting gate electrodes SG of the memory cell transistor-forming region 50 (containing memory cell transistors MT, etc.) is arranged between the wiring layer M4 and the wiring layer M5. The selecting gate electrodes SG are then connected with the source lines SL via the contact plugs CP3 (SP). The source lines SL are wirings on the same layer as wiring layer M5. The selecting gate electrodes SG are connected with the bit lines BL via contact plugs CP4 (BP). The bit lines BL are on the same layer as wiring layer M6.

The wiring forming the resistance elements of the voltage drivers (wiring 105 explained in Embodiment 1) may be arranged on the same layer as the active region AA, control gate electrodes CG and wiring layers M3 to M7. In particular, when the bit lines BL of the memory cell transistor-forming region 50 are formed by side wall processing, as explained above with reference to Embodiment 2, it is possible to perform this process at the same time as the process for forming the wiring of the resistance elements of the voltage drivers.

In addition, the resistance wiring of the resistance elements of the voltage drivers in the three-dimensional laminated NAND flash memory 20 may have the minimum line width defined for the three-dimensional laminated NAND flash memory 20.

3.2 Operation and Effects of Embodiment 3

According to Embodiment 3, it is possible to use the same wiring structure as that of the second wiring 32 explained above with reference to Embodiment 2 as the resistance elements in the three-dimensional laminated NAND flash memory 20.

However, as explained above, in the three-dimensional laminated NAND flash memory, there are more types of voltages needed for the erasure of data held in the memory cell transistors MT than those of the planar NAND flash memory. Consequently, more resistance elements are needed for generating these voltages.

Also, because there is no floating gate in this resistance structure design, the resistance value is smaller than that of the resistance element that uses the floating gate. As a result, to realize the same resistance value as that of the resistance element using a floating gate, a larger circuit area is needed.

Here, by using the same wiring structure as that of the second wiring 32 and the wiring structure as the resistance element of the voltage driver in the three-dimensional laminated NAND flash memory, it is possible to significantly decrease the circuit area needed for the resistance element. As a result, it is possible to obtain a semiconductor storage device equipped with a high quality power supply generating circuit.

(Embodiment 4)

In the following, the semiconductor device related to Embodiment 4 will be explained. In Embodiment 4, the wiring structure of the resistance elements that can be used in the various voltage drivers in the voltage generating circuit 16-1 are explained with reference to Embodiment 1 and Embodiment 3 will be explained. The basic components and the basic operation of the semiconductor storage device related to Embodiment 4 are the same as those in Embodiment 1 and Embodiment 3. Consequently, the features that have been explained above with reference to Embodiment 1 and Embodiment 3 and the features that can be easily derived from Embodiment 1 and Embodiment 3 will not be explained again.

4.1 Third Wiring 33

4.1.1 A Brief Account of the Third Wiring 33

Figure 28A:
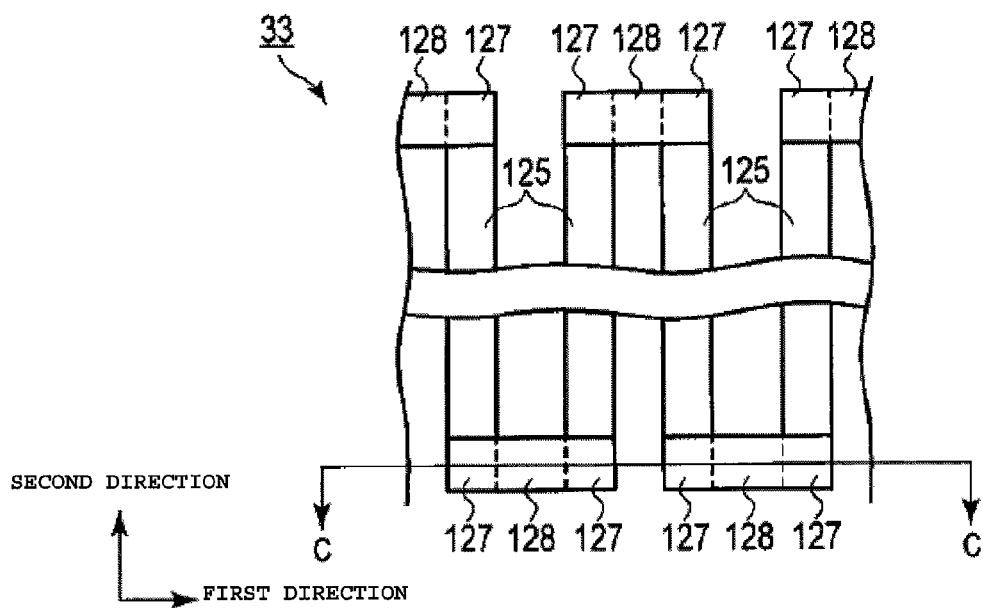
FIG. 28A is a schematic plane view illustrating the basic components of a semiconductor device according to a fourth embodiment.
Figure 28B:
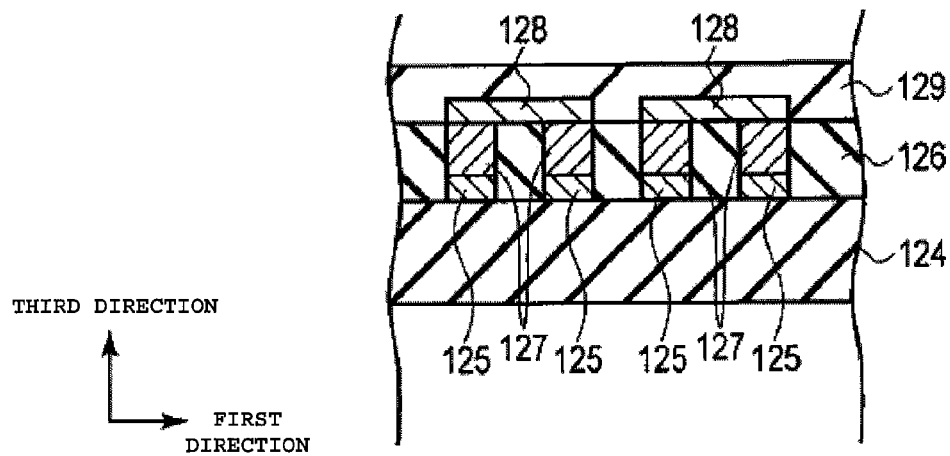
FIG. 28B is a cross-sectional view taken across C-C of FIG. 28A.

In the following, with reference to FIGS. 28A and 28B, a brief account will be given on the basic components of the third wiring 33. FIG. 28A is a plane view illustrating schematically the basic components of the semiconductor device related to Embodiment 4. FIG. 28B is a cross-sectional view taken across C-C in FIG. 28A.

As shown in FIGS. 28A and 28B, in the forming region for the third wiring 33, on the insulating film 124, plural resistance wiring portions 125 extending in the second direction are formed. The plural resistance wiring portions 125 are arranged parallel with each other in the first direction. The width of the plural resistance wiring portions 125 in the first direction is the minimum dimensional width defined for the semiconductor device. In addition, an insulating film 126 is formed on the resistance wiring portions 125 and the insulating film 124. On the ends of the resistance wiring portions 125 and in the insulating film 126, the contact plugs 127 are formed. On the insulating film 126, the contact wiring 128 connecting the two contact plugs 127 in the first direction is formed on the insulating film 126. Insulating film 129 is then formed on the contact wiring 128 and insulating film 126.

More specifically, the contact plugs 127 are formed on the first end and the second end of the resistance wiring portions 125. The contact wiring 128 connects the contact plug 127 formed on the first end of one resistance wiring portion 125 and the contact plug 127 formed on the second end of another resistance wiring portion 125 adjacent to the resistance wiring portion in the first direction. Another contact wiring 128 connects the contact plug 127 formed on the second end of the resistance wiring portion 125 and the contact plug 127 formed on the second end of yet another resistance wiring position 125 adjacent to the first direction. Consequently, as shown in FIG. 28A, the third wiring 33 has a zigzag shape.

The resistance wiring portions 125 have the minimum dimensional width defined for the semiconductor device, and they extend in the second direction. One end of the resistance wiring portion 125 is connected to another resistance wiring portion 125 adjacent to the resistance wiring portion in the first direction via the contact plug 127 and the contact wiring 128. The other end of the resistance wiring portion 125 is connected to yet another resistance wiring portion 125 adjacent in the first direction via the contact plug 127 and contact wiring 128.

4.1.2 Application Example of the Third Wiring 33

The third wiring 33 may be used in conjunction with the various wirings explained with reference to FIG. 6 and FIG. 27. More specifically, as shown in FIG. 6, with the resistance wiring portion 125 taken as the active region AA, the contact plug 127 taken as contact part V0$a$, and the contact wiring 128 taken as wiring M0, the third wiring 33 can be used in the configuration shown in FIG. 6. In this case, because the resistance wiring portions 125 are the semiconductor substrate 100 itself, there is no need to form the insulating film 124. Also, as shown in FIG. 6, with the resistance wiring portion 125 taken as the wiring M0, the contact plug 127 taken as the contact part V1, and the contact wiring 128 as the wiring M1, the third wiring 33 can be used in the configuration shown in FIG. 6. In addition, as shown in FIG. 6, with the resistance wiring portion 125 taken as wiring M1, the contact plug 127 taken as contact part V2, and the contact wiring 128 as the wiring M2, the third wiring 33 can be used in the configuration shown in FIG. 6.

As shown in FIG. 27, with the resistance wiring portion 125 taken as the active region AA, the contact plug 127 taken as the contact part V3$a$, and the contact wiring 128 taken as the wiring M3, the third wiring 33 can be used in the configuration shown in FIG. 27. In this case, because the resistance wiring portions 125 are the semiconductor substrate 200 itself, there is no need to form the insulating film 124. Also, as shown in FIG. 27, with the resistance wiring portion 125 taken as wiring M3, the contact plug 127 taken as the contact part V4, and the contact wiring 128 taken as the wiring M4, the third wiring 33 can be used in the configuration shown in FIG. 27. Also, as shown in FIG. 27, with the resistance wiring portion 125 taken as wiring M4, the contact plug 127 taken as the contact part V5, and the contact wiring 128 taken as the wiring M5, the third wiring 33 can be used in the configuration shown in FIG. 27. Also, as shown in FIG. 27, with the resistance wiring portion 125 taken as wiring M5, the contact plug 127 taken as the contact part V6, and the contact wiring 128 taken as the wiring M6, the third wiring 33 can be used in the configuration shown in FIG. 27. Also, as shown in FIG. 27, with the resistance wiring portion 125 taken as wiring M6, the contact plug 127 taken as the contact part V7, and the contact wiring 128 taken as the wiring M7, the third wiring 33 can be used in the configuration shown in FIG. 27.

Here, although not described in detail, the resistance wiring portions 125 can be formed with a wiring structure having a fine line width using the method explained with reference to FIG. 10A through FIG. 15B.

4.2 Fourth Wiring 34

4.2.1 A Brief Account of the Fourth Wiring 34

Figure 29A:
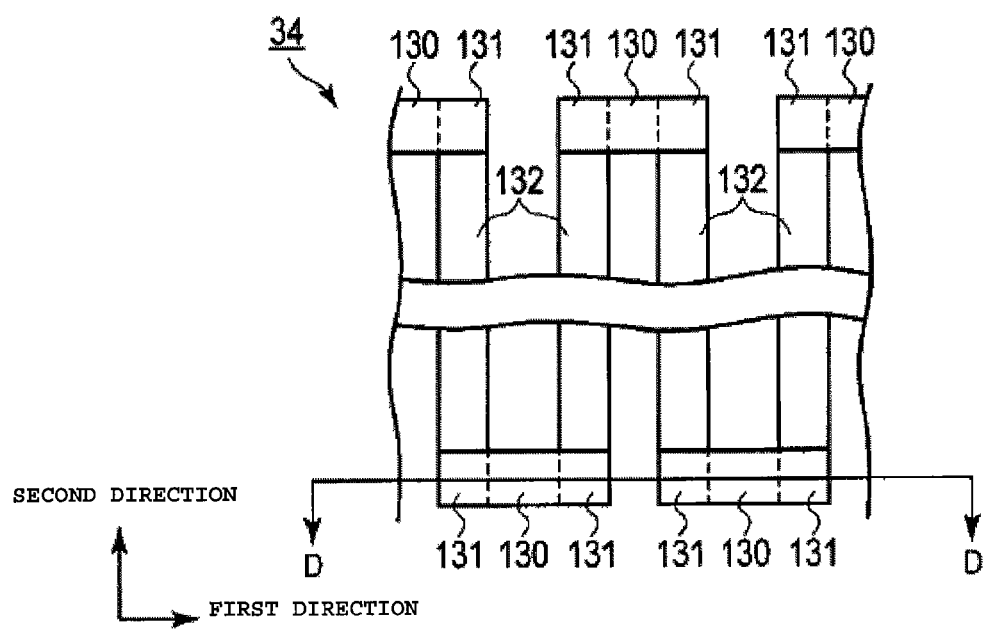
FIG. 29A is a schematic plane view illustrating the basic components of the semiconductor device of the fourth embodiment.
Figure 29B:
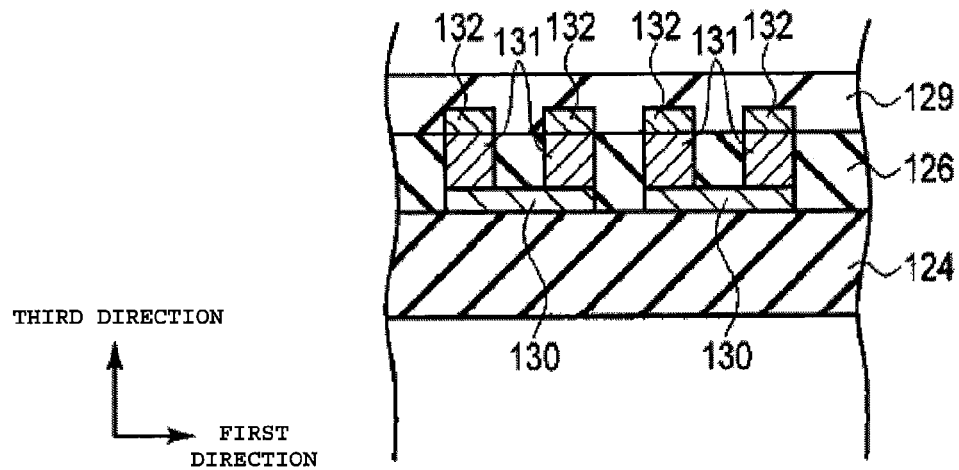
FIG. 29B is a cross-sectional view taken across D-D of FIG. 29A.

In the following, with reference to FIGS. 29A and 29B, the fourth wiring 34 will be explained. The fourth wiring 34 differs from the third wiring 33 in that the positions of the resistance wiring and the contact wiring in the third direction are swapped with each other. FIG. 29A is a schematic plane view illustrating the basic components of the semiconductor device related to Embodiment 4. FIG. 29B is a cross-sectional view taken across D-D in FIG. 29A.

As shown in FIGS. 29A and 29B, in the forming region of the fourth wiring 34, on the insulating film 124, contact wiring 130 is formed. In addition, an insulating film 126 is formed on the contact wiring 130 and the insulating film 124. On the two ends of the contact wiring 130 in the first direction and in the insulating film 126, two contact plugs 131 are formed respectively. On the insulating film 126, plural resistance wiring portions 132 extending in the second direction and for connecting the two contact plugs 131 adjacent to each other in the second direction are formed. Plural resistance wiring portions 132 are arranged parallel with each other in the first direction. The width of the plural resistance wiring portions 132 in the first direction is the minimum dimensional width defined for the semiconductor device. On the resistance wiring portions 132 and insulating film 126, the insulating film 129 is formed.

More specifically, the contact plugs 131 are formed beneath the first end of one resistance wiring portion 132 and the first end of another resistance wiring portion 132. The contact wiring 130 connects the contact plug 131 formed beneath the first end of a resistance wiring portion 132 and the contact plug 131 formed beneath the first end of another resistance wiring portion 132 adjacent in the first direction. Another contact wiring 130 connects the contact plug 131 formed beneath the second end of the resistance wiring portion 132 and the contact plug 131 formed beneath the second end of yet another resistance wiring portion 132 adjacent in the second direction. Consequently, as shown in FIG. 29A, the fourth wiring 34 has a zigzag shape.

The resistance wiring portions 132 have the minimum dimensional width defined for the semiconductor device, and they extend in the second direction. One end of the resistance wiring portion 132 is connected to another resistance wiring portion 132 adjacent to the resistance wiring portion in the first direction via the contact plug 131 and the contact wiring 130. The other end of the resistance wiring portion 132 is connected to yet another resistance wiring portion 132 adjacent in the first direction via the contact plug 131 and contact wiring 130.

4.2.2 Application Example of the Fourth Wiring 34

The fourth wiring 34 may be used with respect to the various wirings explained with reference to FIG. 6 and FIG. 27. More specifically, as shown in FIG. 6, with the contact wiring 130 taken as the active region AA, the contact plug 131 taken as contact part V0$a$, and the contact wiring 132 taken as wiring M0, the fourth wiring 34 can be used in the configuration shown in FIG. 6. In this case, because the contact wiring 130 is the semiconductor substrate 100 itself, there is no need to form the insulating film 124. Also, as shown in FIG. 6, with the contact wiring 130 taken as the wiring M0, the contact plug 131 taken as the contact part V1, and the resistance wiring portions 132 taken as the wiring M1, the fourth wiring 34 can be used in the configuration shown in FIG. 6. In addition, as shown in FIG. 6, with the contact wiring 130 taken as wiring M1, the contact plug 131 taken as contact part V2, and the resistance wiring portions 132 taken as the wiring M2, the fourth wiring 34 can be used in the configuration shown in FIG. 6.

As shown in FIG. 27, with the contact wiring 130 taken as the active region AA, the contact plug 131 taken as the contact part V3$a$, and the resistance wiring portions 132 taken as the wiring M3, the fourth wiring 34 can be used in the configuration shown in FIG. 27. In this case, because the contact wiring 130 is the semiconductor substrate 200 itself, there is no need to form the insulating film 124. Also, as shown in FIG. 27, with the contact wiring 130 taken as wiring M3, the contact plug 131 taken as the contact part V4, and the resistance wiring portions 132 taken as the wiring M4, the fourth wiring 34 can be used in the configuration shown in FIG. 27. Also, as shown in FIG. 27, with the contact wiring 130 taken as wiring M4, the contact plug 131 taken as the contact part V5, and the resistance wiring portions 132 taken as the wiring M5, the fourth wiring 34 can be used in the configuration shown in FIG. 27. Also, as shown in FIG. 27, with the contact wiring 130 taken as wiring M5, the contact plug 131 taken as the contact part V6, and the resistance wiring portions 132 taken as the wiring M6, the fourth wiring 34 can be used in the configuration shown in FIG. 27. Also, as shown in FIG. 27, with the contact wiring 130 taken as wiring M6, the contact plug 131 taken as the contact part V7, and the resistance wiring portions 132 taken as the wiring M7, the fourth wiring 34 can be used in the configuration shown in FIG. 27.

Here, although not described in detail, the resistance wiring portions 132 can be formed with a wiring structure having a fine line width using the method explained with reference to FIG. 10A through FIG. 15B.

Also, it is possible to make appropriate adjustment of the spacing between the resistance wiring portions adjacent to each other in the first direction.

Here, simplify the explanation, a description has been provided for the case in which the resistance wiring portions are arranged in the second direction. However, it is not a necessity to use this configuration. The first and second directions may be swapped as well.

(Embodiment 5)

In the following, the semiconductor device related to Embodiment 5 will be explained. In the explanation of the Embodiment 5, the wiring structure of the resistance elements that can be used in the various voltage drivers of the voltage generating circuit 16-1 explained with reference to Embodiment 1 and Embodiment 3 will be presented. The basic components and the basic operation of the semiconductor storage device related to Embodiment 5 are the same as those of Embodiment 1 and Embodiment 3. Consequently, the features that have been explained with regard to Embodiment 1 and Embodiment 3 and the features that can be easily derived from Embodiment 1 and Embodiment 3 will not be explained again.

5.1 Fifth Wiring 35

5.1.1 A Brief Account of Fifth Wiring 35

Figure 30A:
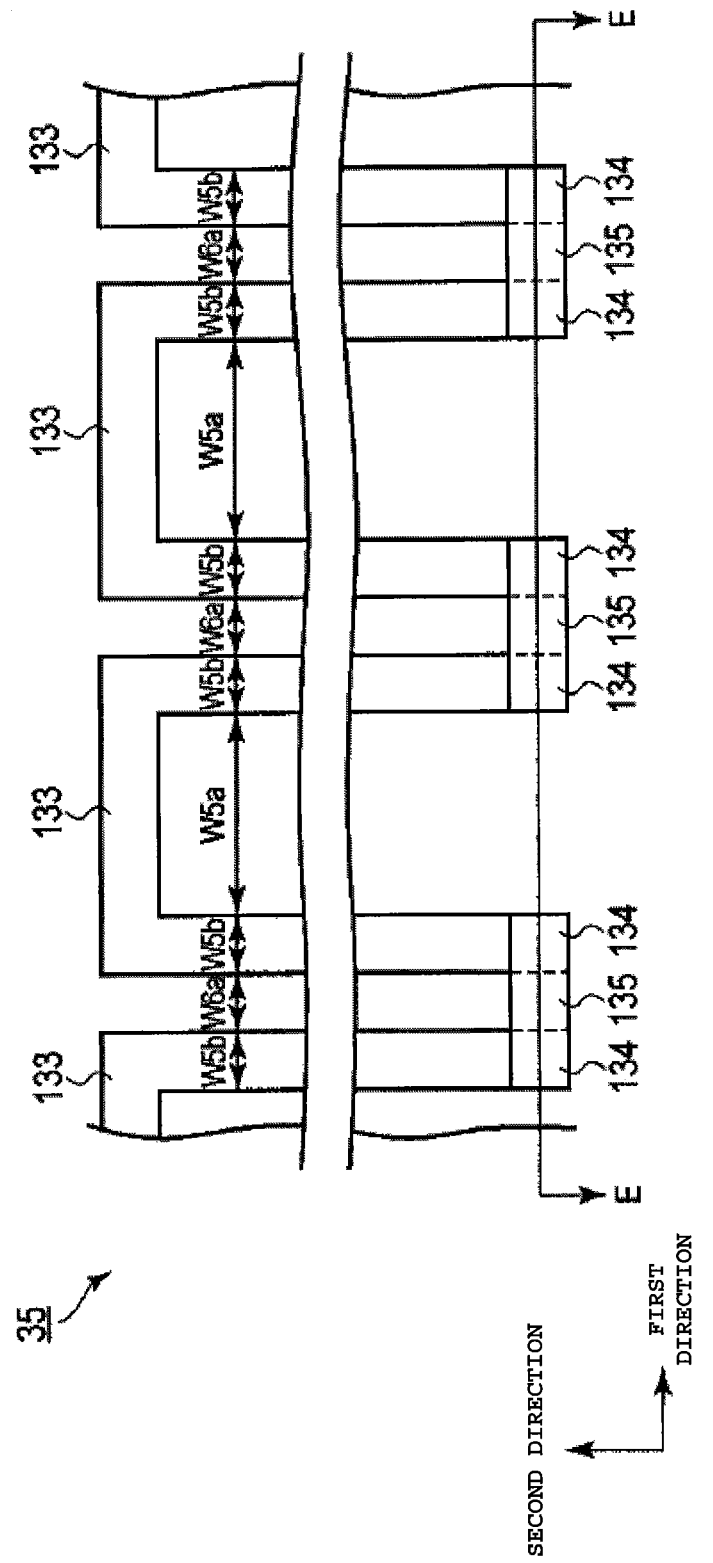
FIG. 30A is a schematic plane view illustrating the basic components of a semiconductor device according to a fifth embodiment.
Figure 30B:
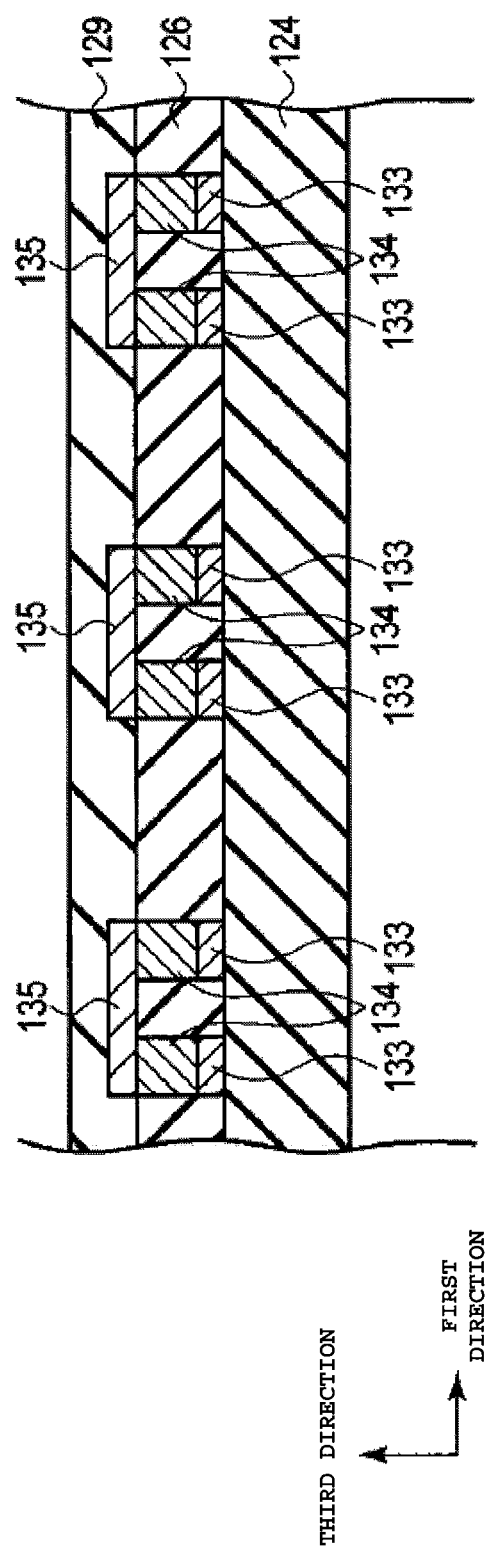
FIG. 30B is a cross-sectional view taken across E-E of FIG. 30A.

In the following, a brief account of the basic components of the fifth wiring 35 will be explained with reference to FIGS. 30A and 30B. Here, FIG. 30A is a schematic plane view illustrating the basic components of the semiconductor device related to Embodiment 5. FIG. 30B is a cross-sectional view taken across E-E in FIG. 30A.

As shown in FIGS. 30A and 30B, in the forming region of the fifth wiring 35, plural resistance wiring portions 133 in a U-shape and extending in the second direction are formed on the insulating film 124. The plural resistance wiring portions 133 are arranged parallel in the first direction. The line width of the resistance wiring portions 133 is width W5$b$, and it is the minimum dimensional width defined for the semiconductor device. More specifically, as the resistance wiring portions 133, two wiring portions extending in the second direction and separated from each other by a width W5$a$ (W5$a$>W5$b$) are arranged so that they are connected with each other on the end adjacent to each other in the first direction to form a U-shape. Consequently, the two ends of the resistance wiring portions 133 are adjacent in the first direction. Here, the resistance wiring portions 133 are arranged with a spacing of width W6$a$ (W6$a$≤W5$a$). In the resistance wiring portion 133 and on the end of the insulating film 124, an insulating film 126 is formed. In the insulating film 126 and on the ends of the resistance wiring portions 133, contact plugs 134 are formed. On the insulating film 126, a contact wiring 135 is formed, and it is connected with different resistance wiring portions 133 adjacent to each other in the first direction; it also connects the two contact plugs 134. On the contact wiring 135 and insulating film 126, an insulating film 129 is then formed.

More specifically, on the first end and the second end of the resistance wiring portion 133, the contact plugs 134 are formed. The contact wiring 135 connects the contact plug 134 formed on the first end of the resistance wiring portion 133 and the contact plug 134 formed on the second end of another resistance wiring portion 133 adjacent in the first direction. Another contact wiring 135 connects the contact plug 134 formed on the second end of the resistance wiring portion 133 and the contact plug 134 formed on the first end of yet another resistance wiring portion 133 adjacent in the first direction. Consequently, as shown in FIG. 30A, the fifth wiring 35 has a zigzag shape.

That is, the resistance wiring portions 133 have the minimum dimensional width defined for the semiconductor device, and they extend in the second direction. One end of the resistance wiring portion 133 is connected to another resistance wiring portion 133 adjacent in the first direction via the contact plug 134 and the contact wiring 135. The other end of the resistance wiring portion 133 is connected to yet another resistance wiring portion 133 adjacent in the first direction via the contact plug 134 and the contact wiring 135. Here, it is preferred that the width W5$a$ be significantly larger than the width W5$b$. One may also have width W5$b$=width W6$a$.

5.1.2 Application Example of Fifth Wiring 35

The fifth wiring 35 may be used in the various wirings explained with reference to FIG. 6 and FIG. 27. More specifically, as shown in FIG. 6, with the resistance wiring portion 133 taken as the active region AA, the contact plug 134 taken as contact part V0$a$, and the contact wiring 135 taken as wiring M0, the fifth wiring 35 can be used in the configuration shown in FIG. 6. In this case, because the resistance wiring portions 133 are the semiconductor substrate 100 itself, there is no need to form the insulating film 124. Also, as shown in FIG. 6, with the resistance wiring portion 133 taken as the wiring M0, the contact plug 134 taken as the contact part V1, and the contact wiring 135 as the wiring M1, the fifth wiring 35 can be used in the configuration shown in FIG. 6. In addition, as shown in FIG. 6, with the resistance wiring portion 133 taken as wiring M1, the contact plug 134 taken as contact part V2, and the contact wiring 135 as the wiring M2, the fifth wiring 35 can be used in the configuration shown in FIG. 6.

As shown in FIG. 27, with the resistance wiring portion 133 taken as the active region AA, the contact plug 134 taken as contact part V3$a$, and the contact wiring 135 taken as wiring M3, the fifth wiring 35 can be used in the configuration shown in FIG. 27. In this case, because the resistance wiring portions 133 are the semiconductor substrate 200 itself, there is no need to form the insulating film 124. Also, as shown in FIG. 27, with the resistance wiring portion 133 taken as the wiring M3, the contact plug 134 taken as the contact part V4, and the contact wiring 135 as the wiring M4, the fifth wiring 35 can be used in the configuration shown in FIG. 27. In addition, as shown in FIG. 27, with the resistance wiring portion 133 taken as wiring M4, the contact plug 134 taken as contact part V5, and the contact wiring 135 as the wiring M5, the fifth wiring 35 can be used in the configuration shown in FIG. 27. In addition, as shown in FIG. 27, with the resistance wiring portion 133 taken as wiring M5, the contact plug 134 taken as contact part V6, and the contact wiring 135 as the wiring M6, the fifth wiring 35 can be used in the configuration shown in FIG. 27. In addition, as shown in FIG. 27, with the resistance wiring portion 133 taken as wiring M6, the contact plug 134 taken as contact part V7, and the contact wiring 135 as the wiring M7, the fifth wiring 35 can be used in the configuration shown in FIG. 27.

5.1.3 Manufacturing Method of Fifth Wiring 35

In the following, with reference to FIG. 30A through FIG. 38B, the basic manufacturing method of the fifth wiring 35 will be explained schematically. FIG. 31A through FIG. 38A are schematic plane views illustrating the basic manufacturing method of the semiconductor device related to Embodiment 5. FIG. 31B through FIG. 38B are cross-sectional views taken across E-E in FIG. 31A through FIG. 38A.

Figure 31A:
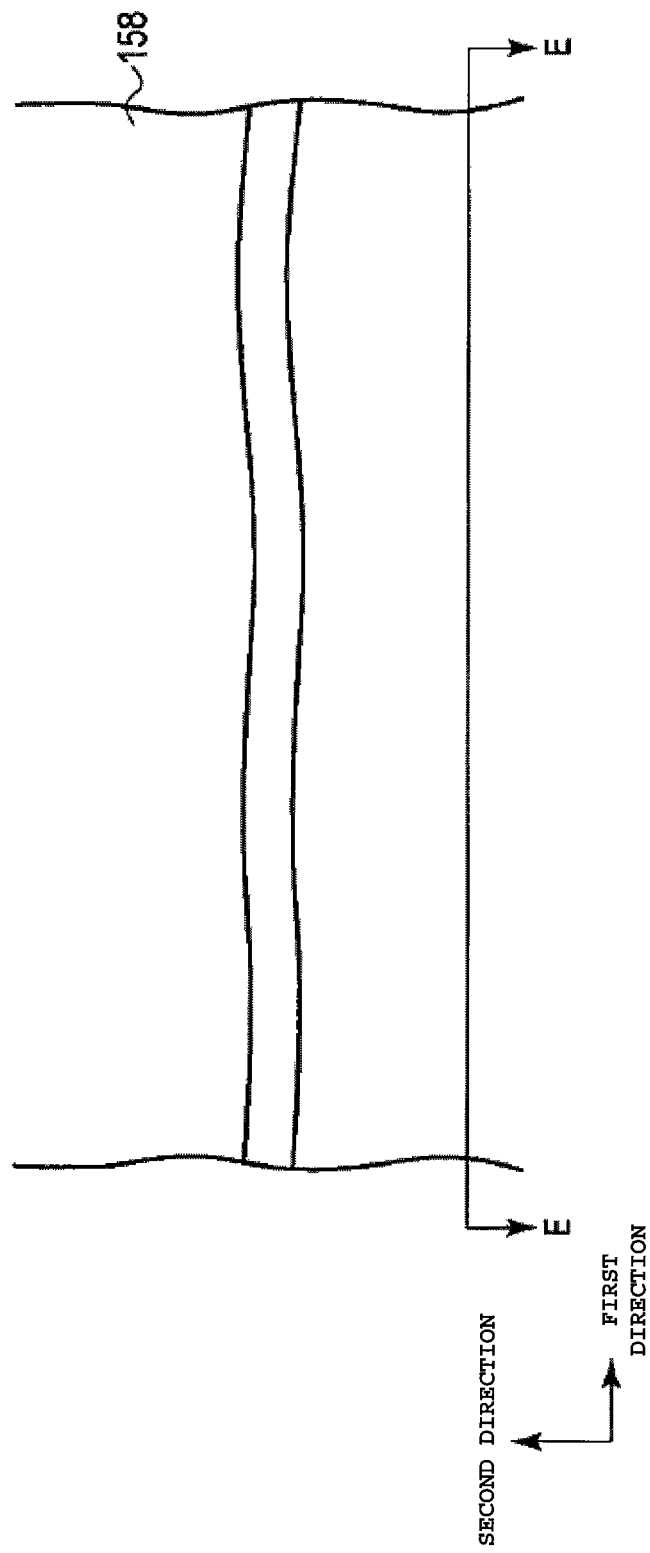
FIG. 31A is a schematic plane view illustrating the basic components of the semiconductor device of the fifth embodiment.
Figure 31B:
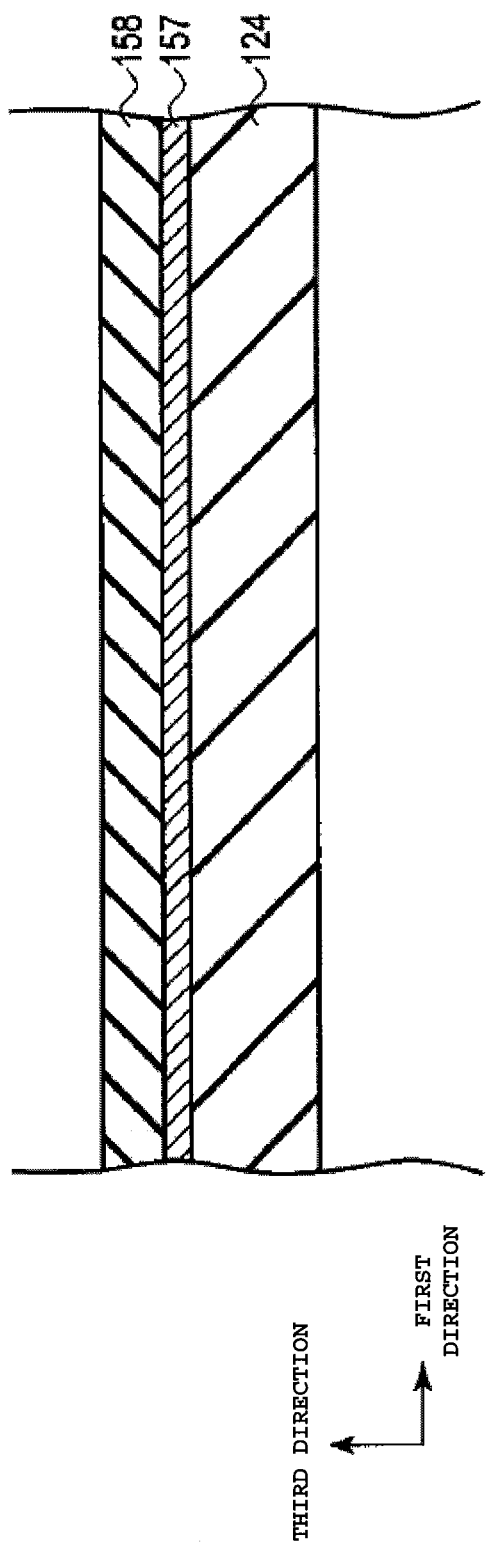
FIG. 31B is a cross-sectional view taken across E-E of FIG. 31A.

As shown in FIGS. 31A and 31B, on the semiconductor substrate 100, an insulating film 124 is formed. On the insulating film 124, a metal film 157 is formed. Next, on the metal film 157, an insulating film 158 is formed as a mask.

Figure 32A:
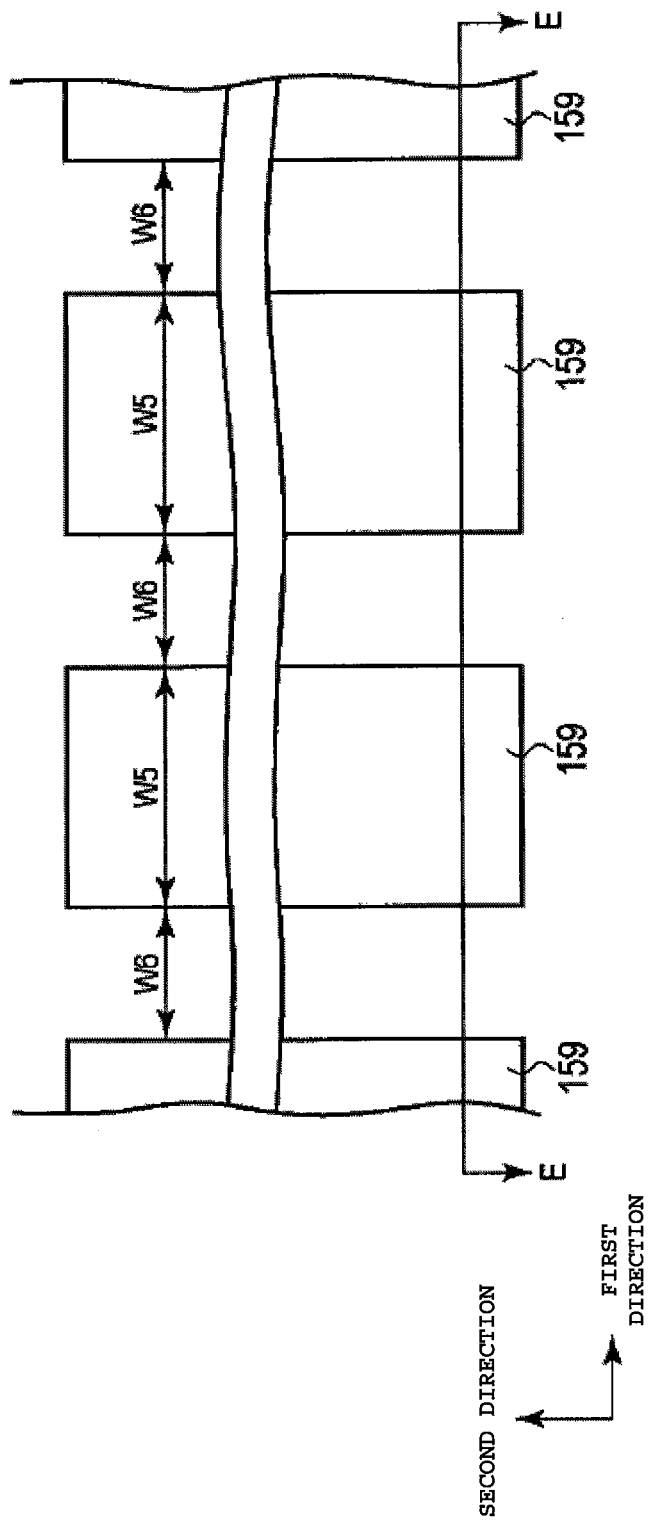
FIG. 32A is a schematic plane view illustrating the basic components of the semiconductor device of the fifth embodiment.

As shown in FIGS. 32A and 32B, on the insulating film 158, an insulating film is formed as the core part. Using the resist, not shown in the figure, on the insulating film, a core pattern is formed, and it is mapped to the insulating film. As a result, a core pattern 159 is formed on the insulating film 158. The core pattern portions 159 extend in the second direction with a width in the first direction of W5, and they are arranged parallel with each other one portion every width W6 (W6<W5).

Figure 33A:
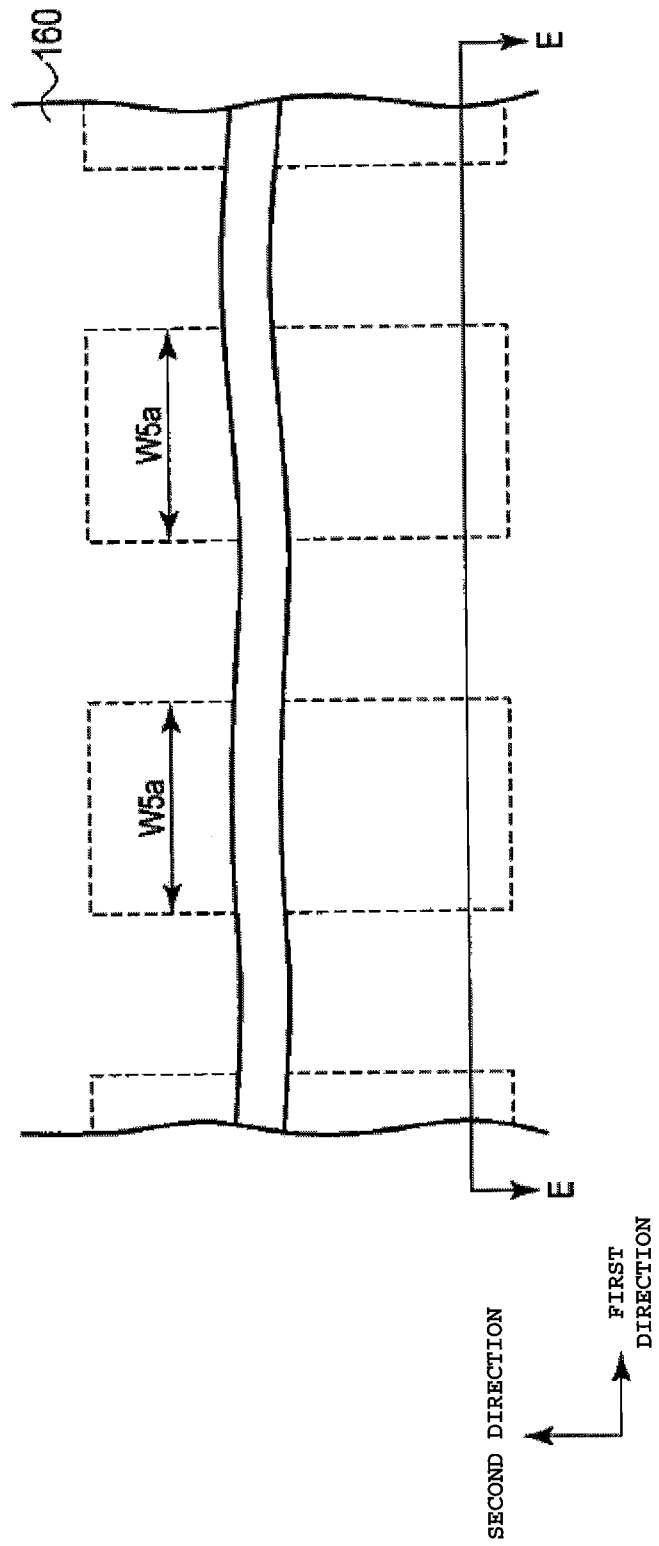
FIG. 33A is a schematic plane view illustrating the basic components of the semiconductor device of the fifth embodiment.
Figure 33B:
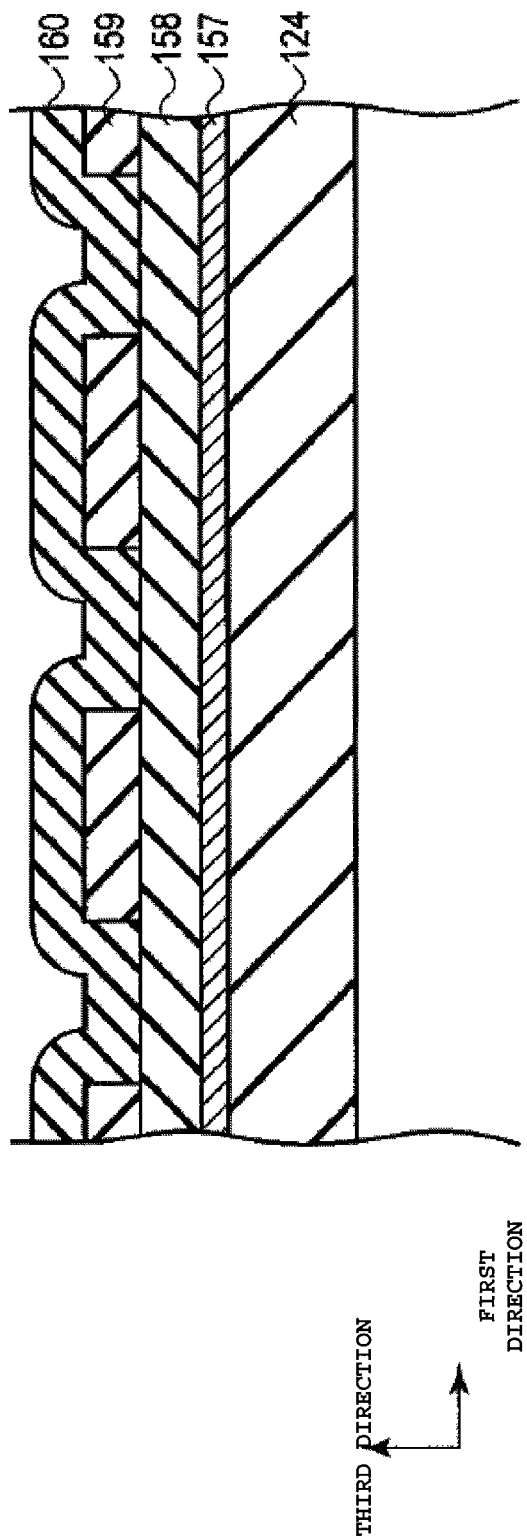
FIG. 33B is a cross-sectional view taken across E-E of FIG. 33A.

As shown in FIGS. 33A and 33B, for the core pattern 159, thinning or the like is carried out to reduce the width in the first direction for the core pattern 159. As a result, the width of the core pattern 159 in the first direction becomes W5a. However, it is not a necessity to carry out thinning. On the insulating film 158, side wall film 160 is formed on the top surface and side surface of the core pattern 159.

Figure 34A:
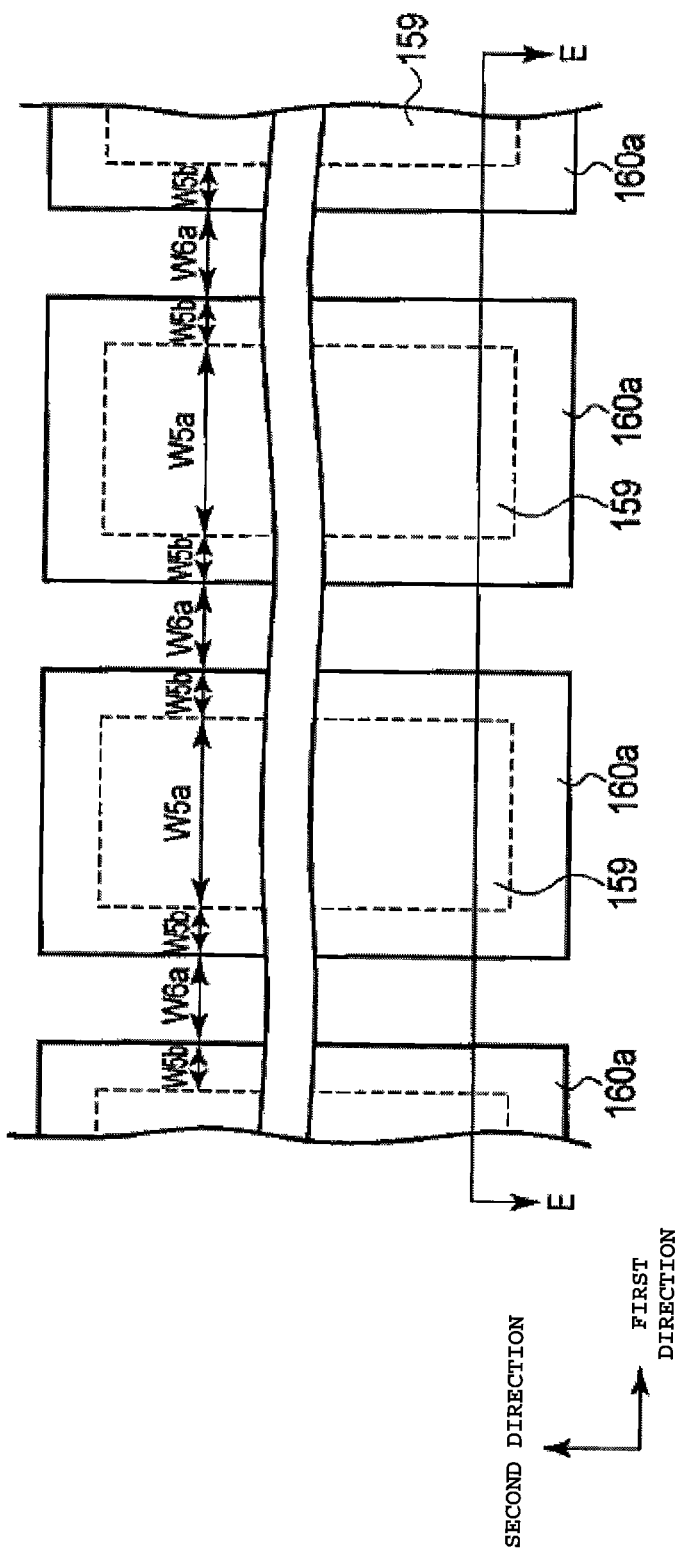
FIG. 34A is a schematic plane view illustrating the basic components of the semiconductor device of the fifth embodiment.

As shown in FIGS. 34A and 34B, by etch-back of the side wall film 160, a loop-shaped side wall pattern 160a is formed on the side wall of the core pattern 159. On the side wall of the core pattern 160a, the line width is W5b, and the spacing between it and the adjacent side wall pattern 160a in the first direction is width W6a. The spacing between the two edges adjacent to each other in the first direction on the same side wall pattern 160a is width W5a.

Figure 35A:
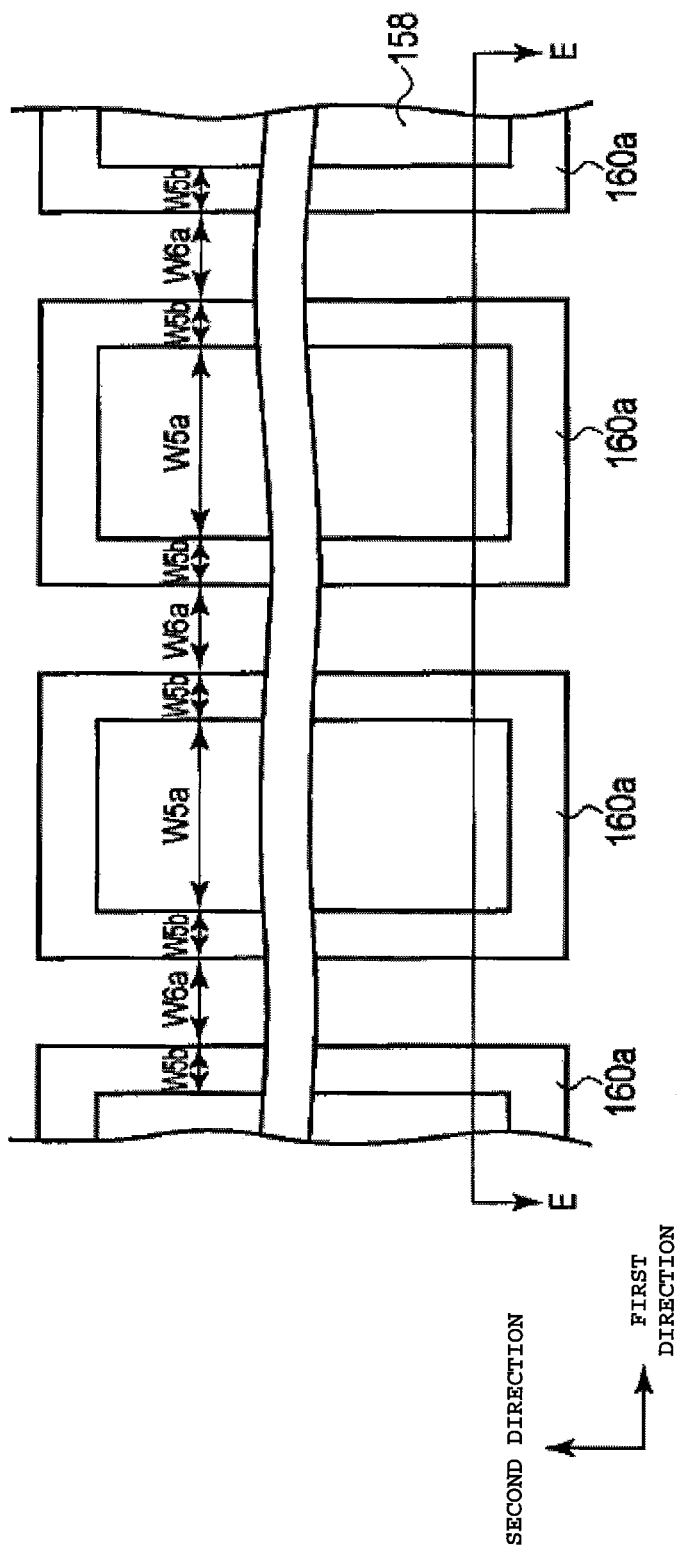
FIG. 35A is a schematic plane view illustrating the basic components of the semiconductor device of the fifth embodiment.

As shown in FIGS. 35A and 35B, the core pattern 159 is removed, and only the side wall pattern 160a remains on the insulating film 158.

As shown in FIGS. 36A and 36B, with the side wall pattern 160a used as a mask, reactive ion etching (RIE) or the like is carried out to etch the insulating film 158. As a result, the side wall pattern 160a is mapped to the insulating film 158 to form pattern 133a. This pattern 133a has the same shape as that of the side wall pattern 160a.

As shown in FIGS. 37A and 37B, for the pattern 133a in a loop shape, one edge (indicated by the broken line in the figure) extending in the first direction is removed. More specifically, an insulating film (not shown in the figure) is deposited on the entire surface, and the excess amount deposited on the end 133b on one edge extending in the first direction of the pattern 133a is removed. With the insulating film used as a mask, RIE or the like is used to remove the end 133b. The insulating film that has been used as a mask is then removed, and it is possible to form a pattern 133. The pattern 133 formed in this case is a U-shaped pattern having two edges extending in the second direction.

Figure 38B:
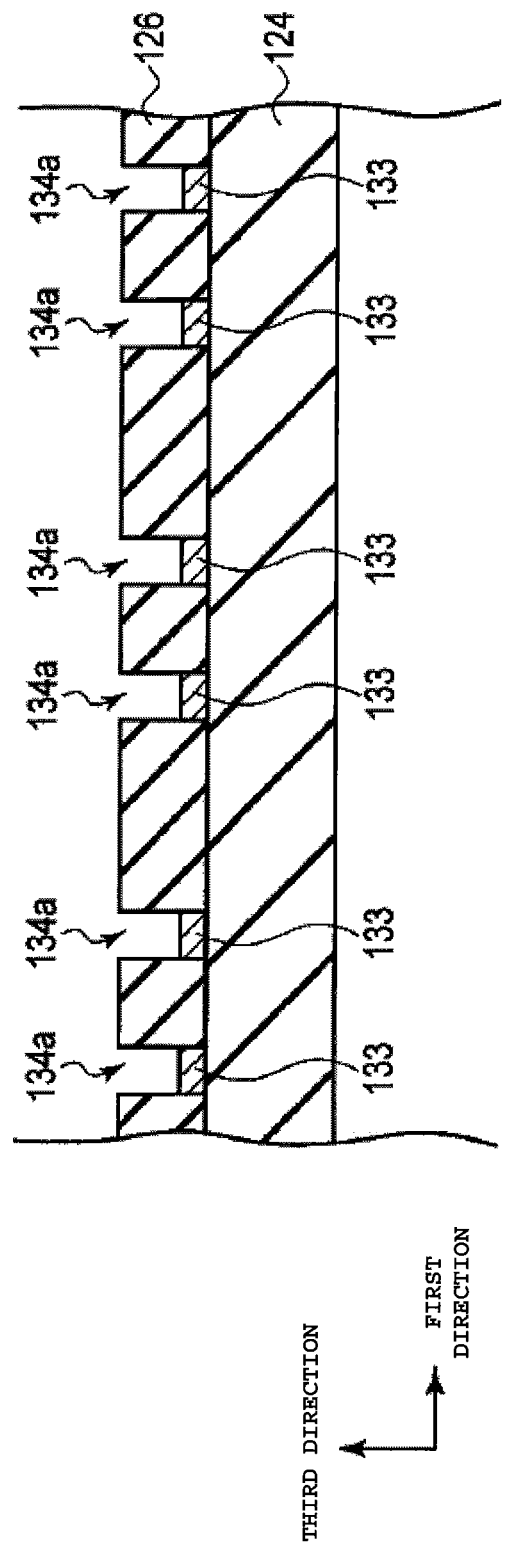
FIG. 38B is a cross-sectional view taken across E-E of FIG. 38A.

As shown in FIGS. 38A and 38B, an insulating film 126 is formed on the entire surface. In the regions where the contact plugs are formed, contact holes 134a are formed. More specifically, at the two ends on the pattern 133, the contact holes 134a are formed, respectively.

As shown in FIGS. 30A and 30B, a metal film is formed over the entire surface. As a result, a metal film is buried in the contact holes 134a, and contact plugs 134 are formed. On the insulating film 126 and contact plugs 134, a metal film 135 is formed.

The metal film 135 is patterned to the shape of contact wiring 135 so that the contact plugs 134 formed on the two resistance wiring portions 133 adjacent in the first direction are connected.

5.2 Sixth Wiring 36

5.2.1 A Brief Account of Sixth Wiring 36

Figure 39A:
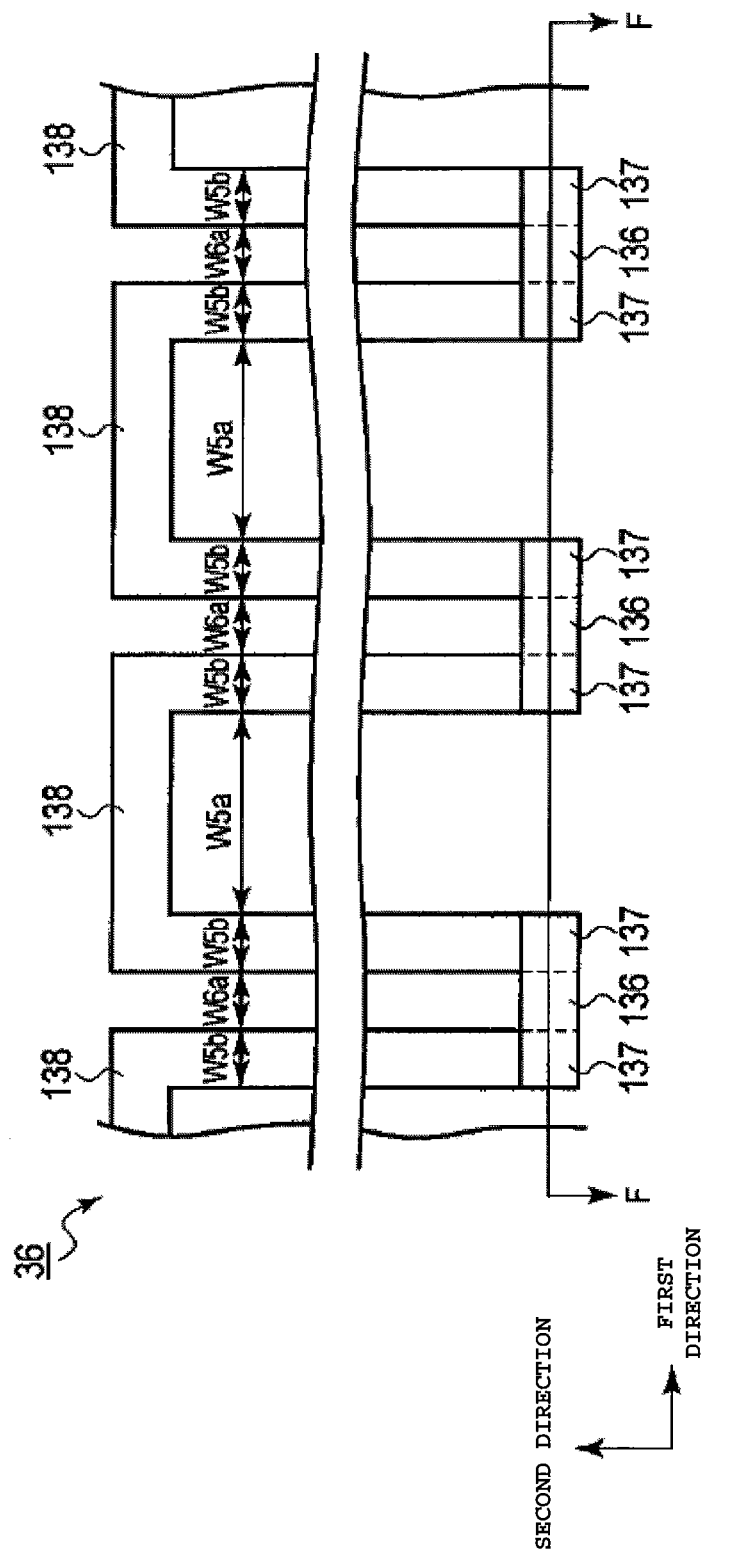
FIG. 39A is a schematic plane view illustrating the basic components of the semiconductor device of the fifth embodiment.
Figure 39B:
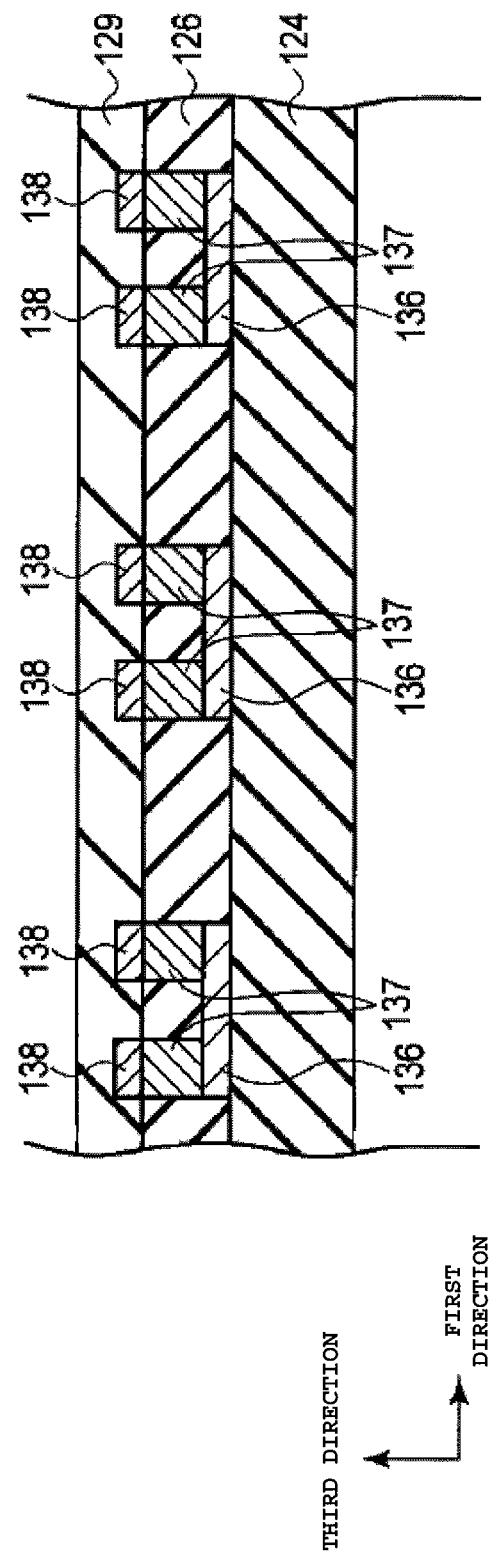
FIG. 39B is a cross-sectional view taken across F-F of FIG. 39A.

In the following, with reference to FIGS. 39A and 39B, the sixth wiring 36 will be explained. The sixth wiring 36 differs from the fifth wiring 35 in that the positions of the resistance wiring and the contact wiring in the third direction are swapped with each other. Namely, the resistance wiring portion 133 and the resistance wiring portion 138 are the same in shape. FIG. 39A is a schematic plane view illustrating the basic components of the semiconductor device related to Embodiment 5. FIG. 39B is a cross-sectional view taken across F-F in FIG. 39A.

As shown in FIGS. 39A and 39B, in the forming region of the sixth wiring 36, contact wiring 136 is formed on the insulating film 124. In addition, an insulating film 126 is formed on the contact wiring 136 and the insulating film 124. On the two ends of the contact wiring 136 in the first direction and in the insulating film 126, two contact plugs 137 are formed, respectively. Then, on the insulating film 126, plural resistance wiring portions 138 in a U-shape and connected to the contact plugs 137 belonging to different contact wiring portions 136 are formed. The width of the plural resistance wiring portions 138 is width W5b, the minimum dimensional width defined for the semiconductor device. More specifically, for each of the resistance wiring portions 138, a U-shape is formed as two wiring portions extending in the second direction and separated from each other by width W5a are connected with each other on one end where they are adjacent to each other in the first direction. Consequently, the two ends of the resistance wiring portions 138 are adjacent to each other in the first direction. Also, the resistance wiring portions 138 are arranged such that one portion is spaced every width W6a. On the resistance wiring portions 138 and insulating film 126, the insulating film 129 is formed.

The resistance wiring portions 138 have the minimum dimensional width defined for the semiconductor device, and they extend in the second direction. One end of each of the resistance wiring portions 138 is connected to another resistance wiring portion 138 adjacent to it in the first direction via contact plug 137 and contact wiring portion 136. The other end of the resistance wiring portion 138 is connected to yet another resistance wiring portion 138 adjacent to it in the first direction via contact plug 137 and contact wiring portion 136.

5.2.2 Application Example of the Sixth Wiring 36

The sixth wiring 36 may be used with respect to the various wirings explained with reference to FIG. 6 and FIG. 27. More specifically, as shown in FIG. 6, with the contact wiring portions 136 taken as the active region AA, the contact plug 137 taken as contact part V0a, and the contact wiring 138 taken as wiring M0, the sixth wiring 36 can be used in the configuration shown in FIG. 6. In this case, because the contact wiring 136 is the semiconductor substrate 100 itself, there is no need to form the insulating film 124. Also, as shown in FIG. 6, with the contact wiring 136 taken as the wiring M0, the contact plug 137 taken as the contact part V1, and the resistance wiring portions 138 taken as the wiring M1, the sixth wiring 36 can be used in the configuration shown in FIG. 6. In addition, as shown in FIG. 6, with the contact wiring 136 taken as wiring M1, the contact plug 137 taken as contact part V2, and the resistance wiring portions 138 taken as the wiring M2, the sixth wiring 36 can be used in the configuration shown in FIG. 6.

As shown in FIG. 27, with the contact wiring 136 taken as the active region AA, the contact plug 137 taken as the contact part V3*a*, and the resistance wiring portions 138 taken as the wiring M3, the sixth wiring 36 can be used in the configuration shown in FIG. 27. In this case, because the contact wiring 136 is the semiconductor substrate 200 itself, there is no need to form the insulating film 124. Also, as shown in FIG. 27, with the contact wiring 136 taken as wiring M3, the contact plug 137 taken as the contact part V4, and the resistance wiring portions 138 taken as the wiring M4, the sixth wiring 36 can be used in the configuration shown in FIG. 27. Also, as shown in FIG. 27, with the contact wiring 136 taken as wiring M4, the contact plug 137 taken as the contact part V5, and the resistance wiring portions 138 taken as the wiring M5, the sixth wiring 36 can be used in the configuration shown in FIG. 27. Also, as shown in FIG. 27, with the contact wiring 136 taken as wiring M5, the contact plug 137 taken as the contact part V6, and the resistance wiring portions 138 taken as the wiring M6, the sixth wiring 36 can be used in the configuration shown in FIG. 27. Also, as shown in FIG. 27, with the contact wiring 136 taken as wiring M6, the contact plug 137 taken as the contact part V7, and the resistance wiring portions 138 taken as the wiring M7, the sixth wiring 36 can be used in the configuration shown in FIG. 27.

Here, although not described in detail, the resistance wiring portions 138 can be formed with a wiring structure having a fine line width using the method explained with reference to FIG. 31A through FIG. 38B, so that it is possible to form a wiring structure with a fine line width.

Here, in order to simplify the explanation, a description has been provided for the case in which the resistance wiring portions are arranged in the second direction. However, it is not a necessity to use this configuration. The first and the second directions may be swapped as well.

5.3 Operation and Effects of Embodiment 5

According to Embodiment 5, the resistance wirings 133, 138 have two edges, which extend in the first or second direction and are separated from each other by the first width W5*a* larger than the line width W5*b* of the resistance wirings 133, 138; these two edges are connected with each other on one end to form a U-shape.

By removing the portion on only one side of the loop shape formed in side wall processing, a U-shaped pattern can be obtained. As a result, it is possible to reduce the sites of connection of wiring portions formed in the side wall processing, and it is thus possible to alleviate the influence of the parasitic resistance of the other wiring different from the contact plug and the resistance wiring.

The spacing between the two edges extending in the second direction of the resistance wiring is wider than the wiring width of the resistance wiring. Consequently, it is easy to form the contact plugs at the ends of the resistance wiring using lithography.

(Embodiment 6)

In the following, the semiconductor device related to Embodiment 6 will be explained. In the explanation of Embodiment 6, the wiring structure of the resistance elements that can be used in the various voltage drivers of the voltage generating circuit 16-1 will be explained with reference to Embodiment 1 and Embodiment 3. The basic components and the basic operation of the semiconductor storage device related to Embodiment 6 are the same as those of Embodiment 1 and Embodiment 3. Consequently, the features that have been explained with regard to Embodiment 1 and Embodiment 3 and the features that can be easily derived from Embodiment 1 and Embodiment 3 will not be explained again.

6.1 Seventh Wiring 37

6.1.1 A brief account of seventh wiring 37

Figure 40A:
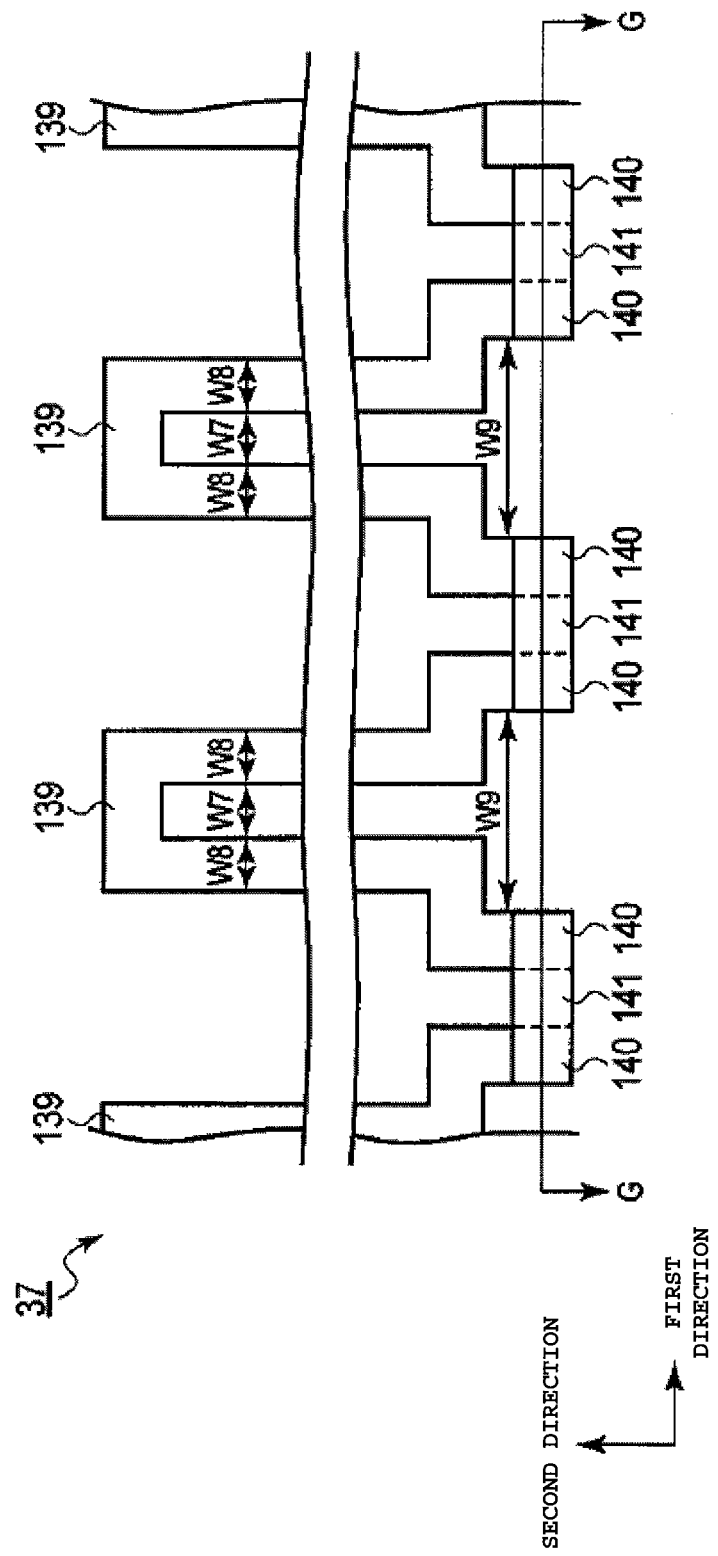
FIG. 40A is a schematic plane view illustrating the basic components of a semiconductor device according to a sixth embodiment.
Figure 40B:
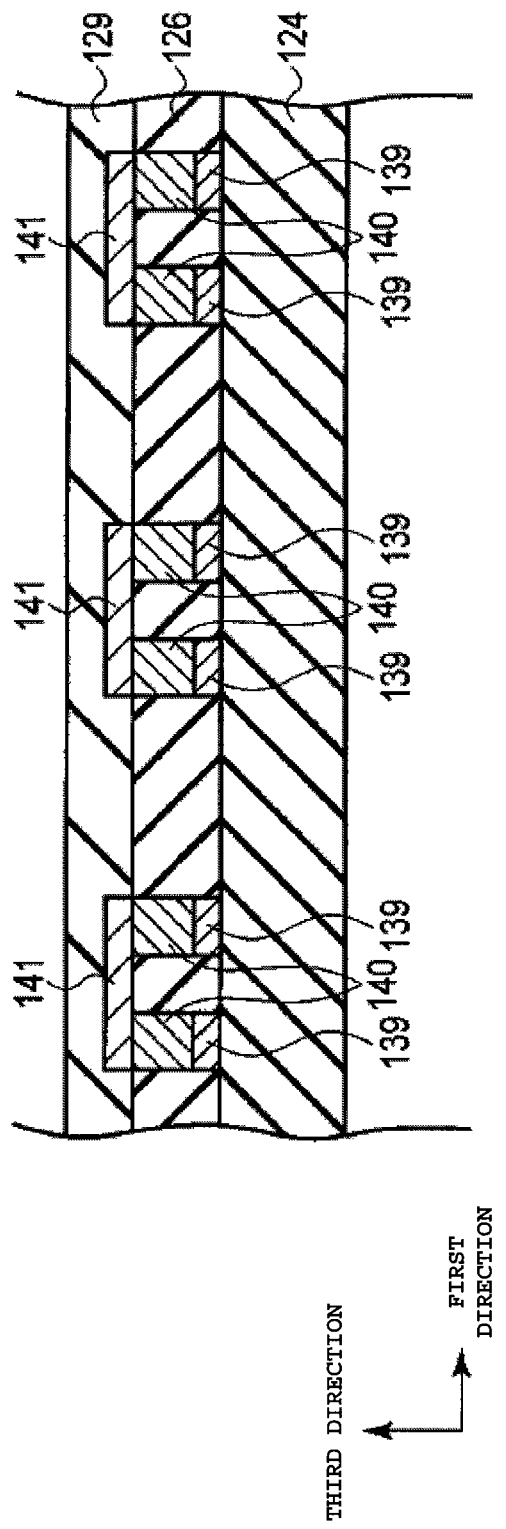
FIG. 40B is a cross-sectional view taken across G-G of FIG. 40A.

In the following, a brief account of the basic components of the seventh wiring 37 will be explained with reference to FIGS. 40A and 40B. Here, FIG. 40A is a schematic plane view illustrating the basic components of the semiconductor device related to Embodiment 6. FIG. 40B is a cross-sectional view taken across G-G in FIG. 40A.

As shown in FIGS. 40A and 40B, in the forming region of the seventh wiring 37, plural resistance wiring portions 139 in a U-shape and extending in the second direction are formed on the insulating film 124. The plural resistance wiring portions 139 are arranged parallel in the first direction. The line width of the resistance wiring portions 139 is width W8, and it is the minimum dimensional width defined for the semiconductor device. More specifically, as the resistance wiring portions 139, two wiring portions extending in the second direction and separated from each other by a width W7 are arranged so that they are connected with each other on the end adjacent to each other in the first direction to form a U-shape. Here, the ends of the resistance wiring portions 139 are separated from each other by a width W9 (W9>W7) along the first direction. Consequently, the distance between the two edges of the resistance wiring portions 139 extending in the second direction is larger near the end where the contact plug 140 is formed. In addition, on the resistance wiring portions 139 and insulating film 124, the insulating film 126 is formed. In the insulating film 126 and on the end of the resistance wiring portions 139, contact plugs 140 are formed. Next, on the insulating film 126, a contact wiring 141 is formed which connects the two contact plugs 140 connected with different resistance wiring portions 139 adjacent to each other in the first direction. On the contact wiring 141 and insulating film 126, an insulating film 129 is then formed.

More specifically, on the first end and the second end of the resistance wiring portion 139, the contact plugs 140 are formed. The contact wiring 141 connects the contact plug 140 formed on the first end of the resistance wiring portion 139 and the contact plug 140 formed on the second end of another resistance wiring portion 139 adjacent in the first direction. Another contact wiring 141 connects the contact plug 140 formed on the second end of the resistance wiring portion 139 and the contact plug 140 formed on the first end of yet another resistance wiring portion 139 adjacent in the first direction. Consequently, as shown in FIG. 40A, the seventh wiring 37 has a zigzag shape.

The resistance wiring portions 139 have the minimum dimensional width defined for the semiconductor device, and they extend in the second direction. One end of the resistance wiring portion 139 is connected to another resistance wiring portion 139 adjacent in the first direction via the contact plug 140 and the contact wiring 141. The other end of the resistance wiring portion 139 is connected to yet another resistance wiring portion 139 adjacent in the first direction via the contact plug 140 and the contact wiring 141.

6.1.2 Application Example of Seventh Wiring 37

The seventh wiring 37 may be used in the various wirings explained with reference to FIG. 6 and FIG. 27. More specifically, as shown in FIG. 6, with the resistance wiring portion 139 taken as the active region AA, the contact plug 140 taken as contact part V0*a*, and the contact wiring 141 taken as wiring M0, the seventh wiring 37 can be used in the configuration shown in FIG. 6. In this case, because the resistance wiring portions 139 are the semiconductor substrate 100 itself, there is no need to form the insulating film 124. Also, as shown in FIG. 6, with the resistance wiring portion 139 taken as the wiring M0, the contact plug 140 taken as the contact part V1, and the contact wiring 141 as the wiring M1, the seventh wiring 37 can be used in the configuration shown in FIG. 6. In addition, as shown in FIG. 6, with the resistance wiring portion 139 taken as wiring M1, the contact plug 140 taken as contact part V2, and the contact wiring 141 as the wiring M2, the seventh wiring 37 can be used in the configuration shown in FIG. 6.

As shown in FIG. 27, with the resistance wiring portion 139 taken as the active region AA, the contact plug 140 taken as contact part V3a, and the contact wiring 141 taken as wiring M3, the seventh wiring 37 can be used in the configuration shown in FIG. 27. In this case, because the resistance wiring portions 139 are the semiconductor substrate 200 itself, there is no need to form the insulating film 124. Also, as shown in FIG. 27, with the resistance wiring portion 139 taken as the wiring M3, the contact plug 140 taken as the contact part V4, and the contact wiring 141 as the wiring M4, the seventh wiring 37 can be used in the configuration shown in FIG. 27. In addition, as shown in FIG. 27, with the resistance wiring portion 139 taken as wiring M4, the contact plug 140 taken as contact part V5, and the contact wiring 141 as the wiring M5, the seventh wiring 37 can be used in the configuration shown in FIG. 27. In addition, as shown in FIG. 27, with the resistance wiring portion 139 taken as wiring M5, the contact plug 140 taken as contact part V6, and the contact wiring 141 as the wiring M6, the seventh wiring 37 can be used in the configuration shown in FIG. 27. In addition, as shown in FIG. 27, with the resistance wiring portion 139 taken as wiring M6, the contact plug 140 taken as contact part V7, and the contact wiring 141 as the wiring M7, the seventh wiring 37 can be used in the configuration shown in FIG. 27.

Here, although not described in detail, as resistance wiring portions 139 are formed using the method described with reference to FIG. 31A through FIG. 38B, it is possible to form a wiring structure with a fine line width.

6.2 Eighth Wiring 38

6.2.1 A Brief Account of the Eighth Wiring 38

Figure 41B:
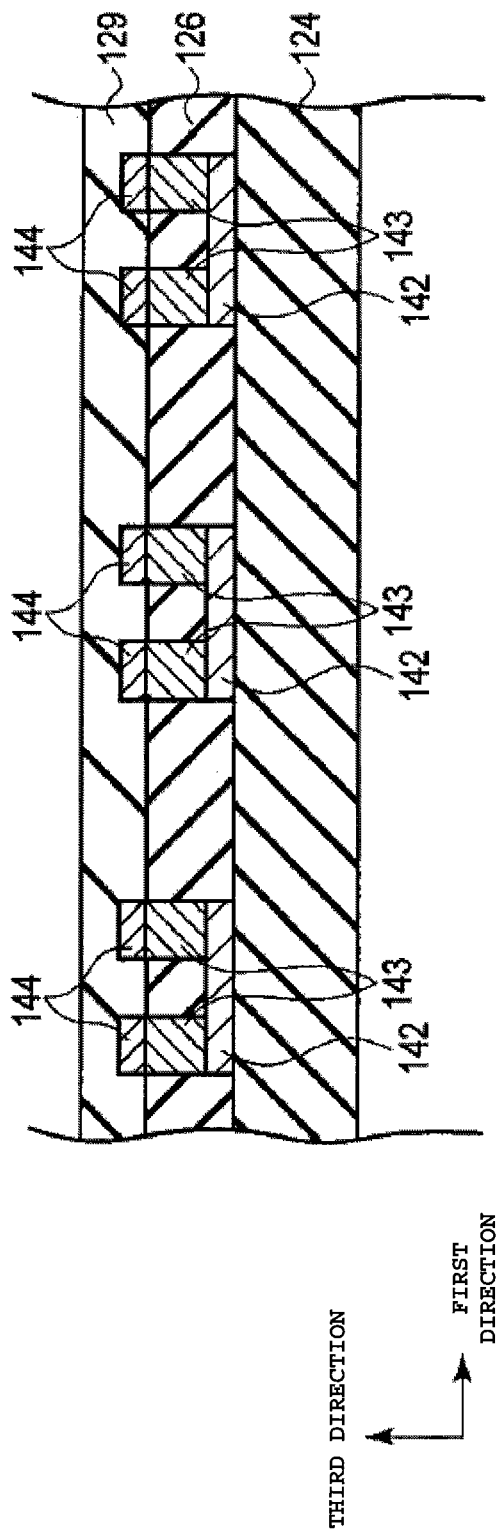
FIG. 41B is a cross-sectional view taken across H-H of FIG. 41A.

In the following, with reference to FIGS. 41A and 41B, the eighth wiring 38 will be explained. The eighth wiring 38 differs from the seventh wiring 37 in that the positions of the resistance wiring and the contact wiring in the third direction are swapped with each other. That is, resistance wiring 139 has the same shape as resistance wiring 144. FIG. 41A is a schematic plane view illustrating the basic components of the semiconductor device related to Embodiment 6. FIG. 41B is a cross-sectional view taken across H-H in FIG. 41A.

As shown in FIGS. 41A and 41B, in the forming region of the eighth wiring 38, on the insulating film 124, contact wiring 142 is formed. In addition, an insulating film 126 is formed on the contact wiring 142 and the insulating film 124. On the two ends of the contact wiring 142 in the first direction and in the insulating film 126, two contact plugs 143 are formed, respectively. Next, on the insulating film 126, plural resistance wiring portions 144 are formed in an U-shape and connected to the contact plugs 143 belonging to different contact wiring portions 142. On the resistance wiring portions 144 and the insulating film 126, an insulating film 129 is then formed.

The width of the plural resistance wiring portions 144 is the minimum dimensional width defined for the semiconductor device, and they extend in the second direction. One end of each of the resistance wiring portions 144 is connected to another resistance wiring portion 144 adjacent to it in the first direction via contact plug 143 and contact wiring portion 142. The other end of the resistance wiring portion 144 is connected to yet another resistance wiring portion 144 adjacent to it in the first direction via contact plug 143 and contact wiring portion 142.

6.2.2 Application Example of the Eighth Wiring 38

The eighth wiring 38 may be used with the various wirings explained with reference to FIG. 6 and FIG. 27. More specifically, as shown in FIG. 6, with the contact wiring portions 142 taken as the active region AA, the contact plug 143 taken as contact part V0a, and the contact wiring 144 taken as wiring M0, the eighth wiring 38 can be used in the configuration shown in FIG. 6. In this case, because the contact wiring 142 is the semiconductor substrate 100 itself, there is no need to form the insulating film 124. Also, as shown in FIG. 6, with the contact wiring 142 taken as the wiring M0, the contact plug 143 taken as the contact part V1, and the resistance wiring portions 144 taken as the wiring M1, the eighth wiring 38 can be used in the configuration shown in FIG. 6. In addition, as shown in FIG. 6, with the contact wiring 142 taken as wiring M1, the contact plug 143 taken as contact part V2, and the resistance wiring portions 144 taken as the wiring M2, the eighth wiring 38 can be used in the configuration shown in FIG. 6.

As shown in FIG. 27, with the contact wiring 142 taken as the active region AA, the contact plug 143 taken as the contact part V3a, and the resistance wiring portions 144 taken as the wiring M3, the eighth wiring 38 can be used in the configuration shown in FIG. 27. In this case, because the contact wiring 142 are the semiconductor substrate 200 itself, there is no need to form the insulating film 124. Also, as shown in FIG. 27, with the contact wiring 142 taken as wiring M3, the contact plug 143 taken as the contact part V4, and the resistance wiring portions 144 taken as the wiring M4, the eighth wiring 38 can be used in the configuration shown in FIG. 27. Also, as shown in FIG. 27, with the contact wiring 142 taken as wiring M4, the contact plug 143 taken as the contact part V5, and the resistance wiring portions 144 taken as the wiring M5, the eighth wiring 38 can be used in the configuration shown in FIG. 27. Also, as shown in FIG. 27, with the contact wiring 142 taken as wiring M5, the contact plug 143 taken as the contact part V6, and the resistance wiring portions 144 taken as the wiring M6, the eighth wiring 38 can be used in the configuration shown in FIG. 27. Also, as shown in FIG. 27, with the contact wiring 142 taken as wiring M6, the contact plug 143 taken as the contact part V7, and the resistance wiring portions 144 taken as the wiring M7, the eighth wiring 38 can be used in the configuration used in the configuration shown in FIG. 27.

Here, although not described in detail, the resistance wiring portions 144 can be formed with a wiring structure having a fine line width using the method explained with reference to FIG. 31A through FIG. 38B, so that it is possible to form a wiring structure with a fine line width.

Here, to simplify the explanation, a description has been provided for the case in which the resistance wiring portions are arranged in the second direction. However, it is not a necessity to use this configuration. The first and second directions may be swapped as well.

6.3 Operation and Effects of Embodiment 6

According to Embodiment 6, the resistance wirings 139, 144 have two edges extending in the first or second direction; the two edges are separated from each other by the first width W9 larger than the line width W8 of the resistance wirings 139, 144, and are connected with each other on one end. Consequently, the same effects as those of Embodiment 5 can be realized.

(Embodiment 7)

In the following, the semiconductor device related to Embodiment 7 will be explained. In the explanation of the Embodiment 7, the wiring structure of the resistance elements that can be used in the various voltage drivers of the voltage generating circuit 16-1 will be explained with reference to Embodiment 1 and Embodiment 3. The basic components and the basic operation of the semiconductor storage device related to Embodiment 7 are the same as those of Embodiment 1 and Embodiment 3. Consequently, the features that have been explained with regard to Embodiment 1 and Embodiment 3 and the features that can be easily derived from Embodiment 1 and Embodiment 3 will not be explained again.

7.1 Ninth Wiring 39

7.1.1 A Brief Account of Ninth Wiring 39

Figure 42A:
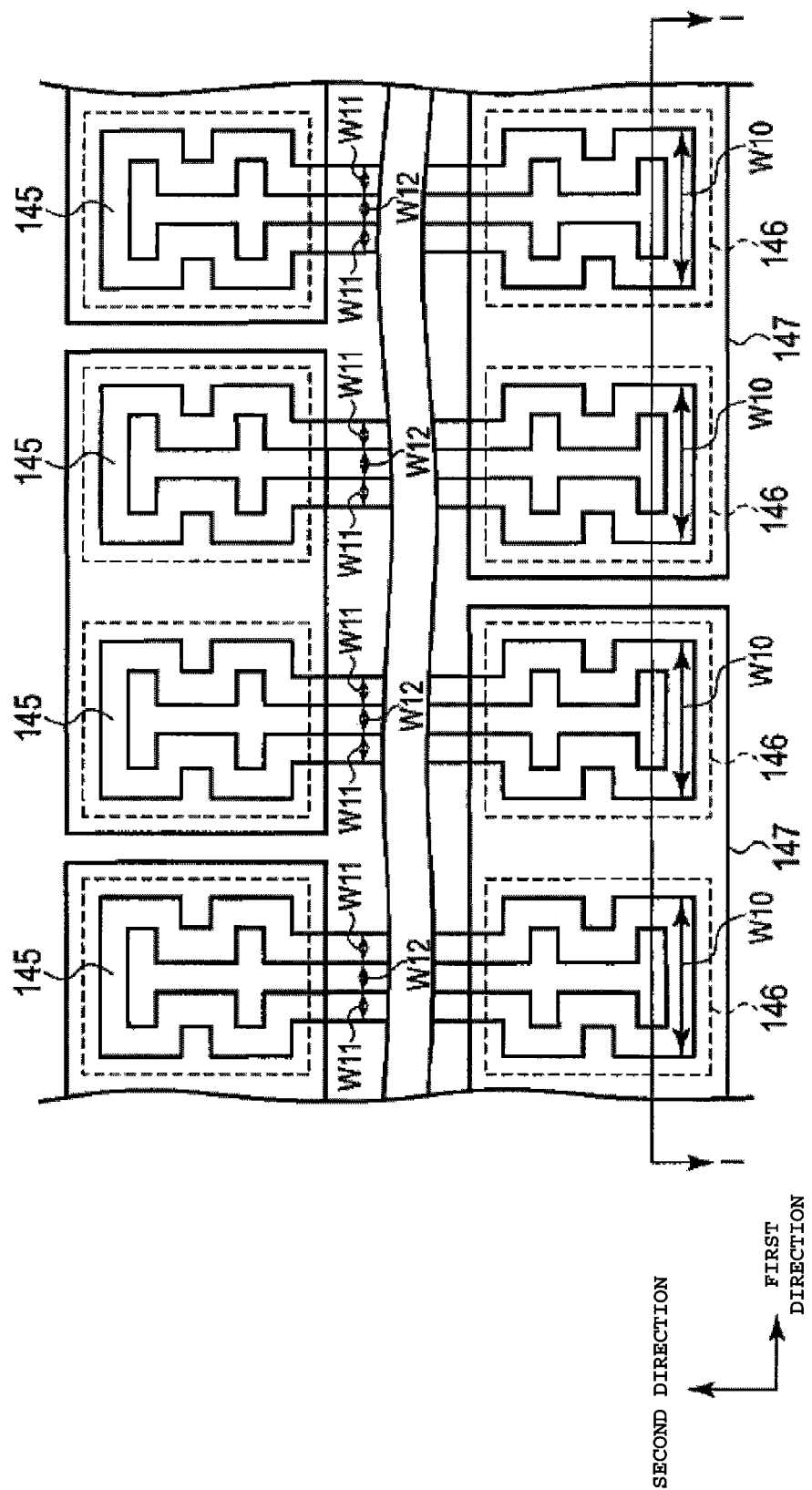
FIG. 42A is a schematic plane view illustrating the basic components of a semiconductor device according to a seventh embodiment.

In the following, a brief account of the basic components of the ninth wiring 39 will be explained with reference to FIGS. 42A and 42B. Here, FIG. 42A is a schematic plane view illustrating the basic components of the semiconductor device related to Embodiment 7. FIG. 42B is a cross-sectional view taken across I-I in FIG. 42A.

As shown in FIGS. 42A and 42B, in the forming region of the ninth wiring 39, plural resistance wiring portions 145 are formed on the insulating film 124 in a loop shape and extending in the second direction. The plural resistance wiring portions 145 are arranged parallel in the first direction. The line width of the resistance wiring portions 145 is width W11, and it is the minimum dimensional width defined for the semiconductor device. More specifically, as the resistance wiring portions 145, two edges extending in the second direction and separated from each other by a width W12 are connected with each other in the regions where the contact plugs 146 are formed to form a loop shape. They have a zigzag shape so that the contact area with the contact plug 146 is larger in the region where the contact plug 146 of the resistance wiring 145 is formed. The width of the resistance wiring 145 in the first direction is the largest width W10, which, for example, is about 4 times the width W11. This contact region is also called the zigzag wiring region. In addition, the insulating film 126 is formed on the resistance wiring portions 145 and insulating film 124. In the insulating film 126 and on the contact region of the resistance wiring portions 145, contact plugs 146 are formed. The width of the contact plug 146 in the first direction is preferably larger than the width W10, and it is preferred that it be formed to cover the zigzag wiring region of the resistance wiring 145. A contact wiring 147 is formed on the insulating film 126, and it connects the two contact plugs 146 connected to different resistance wiring portions 145 adjacent to each other in the first direction. An insulating film 129 is then formed on the contact wiring 147 and insulating film 126.

More specifically, the contact plugs 146 are formed on the first contact region of the resistance wiring portion 145 (the zigzag wiring region) and the second contact region. The contact wiring 147 connects the contact plug 146 formed on the first contact region of the resistance wiring portion 145 and the contact plug 146 formed on the second contact region of another resistance wiring portion 145 adjacent in the first direction. Another contact wiring 147 connects the contact plug 146 formed on the second contact region of the resistance wiring portion 145 and the contact plug 146 formed on the first contact region of yet another resistance wiring portion 145 adjacent in the first direction. Consequently, as shown in FIG. 30A, the ninth wiring 39 has a zigzag shape.

In the region extending in the second direction, the resistance wiring portions 145 have the minimum dimensional width defined for the semiconductor device. One end of the resistance wiring portion 145 is connected to another resistance wiring portion 145 adjacent in the first direction via the contact plug 146 and the contact wiring 147. The other end of the resistance wiring portion 145 is connected to yet another resistance wiring portion 145 adjacent in the first direction via the contact plug 146 and the contact wiring 147.

7.1.2 Application Example of Ninth Wiring 39

The ninth wiring 39 may be used in the various wirings explained with reference to FIG. 6 and FIG. 27. More specifically, as shown in FIG. 6, with the resistance wiring portion 145 taken as the active region AA, the contact plug 146 taken as contact part V0a, and the contact wiring 147 taken as wiring M0, the ninth wiring 39 can be used in the configuration used in the configuration shown in FIG. 6. In this case, because the resistance wiring portions 145 are the semiconductor substrate 100 itself, there is no need to form the insulating film 124. Also, as shown in FIG. 6, with the resistance wiring portion 145 taken as the wiring M0, the contact plug 146 taken as the contact part V1, and the contact wiring 147 as the wiring M1, the ninth wiring 39 can be used in the configuration shown in FIG. 6. In addition, as shown in FIG. 6, with the resistance wiring portion 145 taken as wiring M1, the contact plug 146 taken as contact part V2, and the contact wiring 147 taken as the wiring M2, the ninth wiring 39 can be used in the configuration shown in FIG. 6.

As shown in FIG. 27, with the resistance wiring portion 145 taken as the active region AA, the contact plug 146 taken as contact part V3a, and the contact wiring 147 taken as wiring M3, the ninth wiring 39 can be used in the configuration shown in FIG. 27. In this case, because the resistance wiring portions 145 are the semiconductor substrate 200 itself, there is no need to form the insulating film 124. Also, as shown in FIG. 27, with the resistance wiring portion 145 taken as the wiring M3, the contact plug 146 taken as the contact part V4, and the contact wiring 147 taken as the wiring M4, the ninth wiring 39 can be used in the configuration shown in FIG. 27. In addition, as shown in FIG. 27, with the resistance wiring portion 145 taken as wiring M4, the contact plug 146 taken as contact part V5, and the contact wiring 147 taken as the wiring M5, the ninth wiring 39 can be used in the configuration shown in FIG. 27. In addition, as shown in FIG. 27, with the resistance wiring portion 145 taken as wiring M5, the contact plug 146 taken as contact part V6, and the contact wiring 147 taken as the wiring M6, the ninth wiring 39 can be used in the configuration shown in FIG. 27. In addition, as shown in FIG. 27, with the resistance wiring portion 145 taken as wiring M6, the contact plug 146 taken as contact part V7, and the contact wiring 147 taken as the wiring M7, the ninth wiring 39 can be in the configuration shown in FIG. 27.

7.2 Tenth Wiring 40

7.2.1 A Brief Account of the Tenth Wiring 40

Figure 43B:
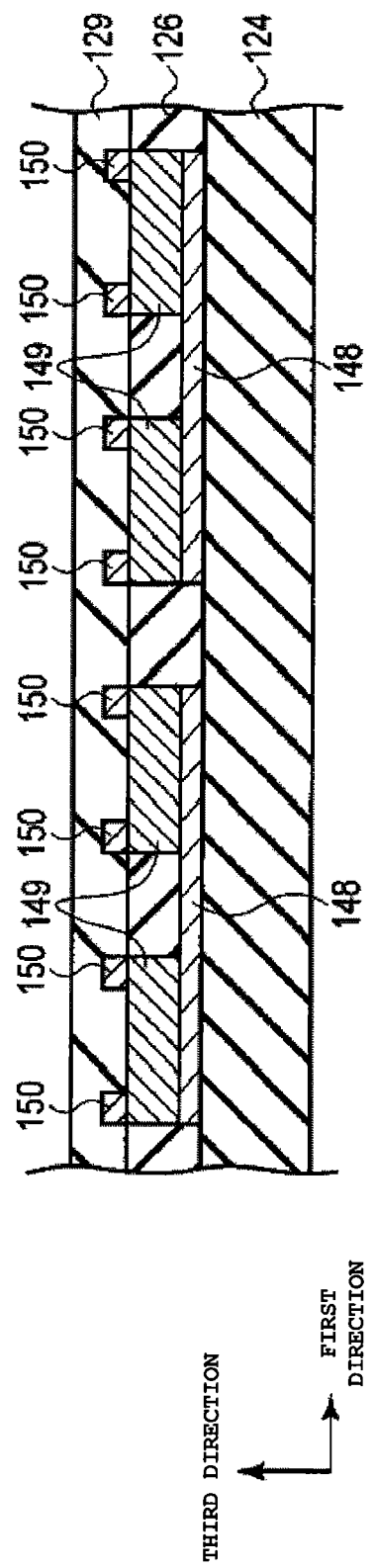
FIG. 43B is a cross-sectional view taken across J-J of FIG. 43A.

In the following, the tenth wiring 40 will be explained with reference to FIGS. 43A and 43B. The tenth wiring 40 differs from the ninth wiring 39 in that the positions of the resistance wiring and the contact wiring in the third direction are swapped with each other. That is, the resistance wiring 145 has the same shape as the resistance wiring 150. FIG. 43A is a schematic plane view illustrating the basic components of the semiconductor device related to Embodiment 7. FIG. 43B is a cross-sectional view taken across J-J in FIG. 43A.

As shown in FIGS. 43A and 43B, contact wiring 148 is formed in the forming region of the tenth wiring 40 on the insulating film 124. In addition, an insulating film 126 is formed on the contact wiring 148 and the insulating film 124. On the two ends of the contact wiring 148 in the first direction and in the insulating film 126, two contact plugs 149 are formed, respectively. On the insulating film 126, plural resistance wiring portions 150 are formed in a loop shape and connected to the contact plugs 149 belonging to different contact wiring portions 148. Next, an insulating film 129 is formed on the resistance wiring portions 150 and the insulating film 126.

The width of the plural resistance wiring portions 150 in the region where it extends in the second direction is the minimum dimensional width defined for the semiconductor device. The first contact region of each of the resistance wiring portions 150 is connected to another resistance wiring portion 150 adjacent to it in the first direction via contact plug 149 and contact wiring portion 148. The second contact region of the resistance wiring portion 150 is connected to yet another resistance wiring portion 150 adjacent to it in the first direction via contact plug 149 and contact wiring portion 148.

7.2.2 Application Example of the Tenth Wiring 40

The tenth wiring 40 may be used on the various wirings explained with reference to FIG. 6 and FIG. 27. More specifically, as shown in FIG. 6, with the contact wiring portions 148 taken as the active region AA, the contact plug 149 taken as contact part V0a, and the contact wiring 150 taken as wiring M0, the tenth wiring 40 can be used in the configuration shown in FIG. 6. In this case, because the contact wiring 148 is the semiconductor substrate 100 itself, there is no need to form the insulating film 124. Also, as shown in FIG. 6, with the contact wiring 148 taken as the wiring M0, the contact plug 149 taken as the contact part V1, and the resistance wiring portions 150 taken as the wiring M1, the tenth wiring 40 can be used in the configuration shown in FIG. 6. In addition, as shown in FIG. 6, with the contact wiring 148 taken as wiring M1, the contact plug 149 taken as contact part V2, and the resistance wiring portions 150 taken as the wiring M2, the tenth wiring 40 can be used in the configuration shown in FIG. 6.

As shown in FIG. 27, with the contact wiring 148 taken as the active region AA, the contact plug 149 taken as the contact part V3a, and the resistance wiring portions 150 taken as the wiring M3, the tenth wiring 40 can be used in the configuration shown in FIG. 27. In this case, because the contact wiring 148 are the semiconductor substrate 200 itself, there is no need to form the insulating film 124. Also, as shown in FIG. 27, with the contact wiring 148 taken as wiring M3, the contact plug 149 taken as the contact part V4, and the resistance wiring portions 150 taken as the wiring M4, the tenth wiring 40 can be used in the configuration shown in FIG. 27. Also, as shown in FIG. 27, with the contact wiring 148 taken as wiring M4, the contact plug 149 taken as the contact part V5, and the resistance wiring portions 150 taken as the wiring M5, the tenth wiring 40 can be used in the configuration shown in FIG. 27. Also, as shown in FIG. 27, with the contact wiring 148 taken as wiring M5, the contact plug 149 taken as the contact part V6, and the resistance wiring portions 150 taken as the wiring M6, the tenth wiring 40 can be used in the configuration shown in FIG. 27. Also, as shown in FIG. 27, with the contact wiring 148 taken as wiring M6, the contact plug 149 taken as the contact part V7, and the resistance wiring portions 150 taken as the wiring M7, the tenth wiring 40 can be used in the configuration shown in FIG. 27.

Here, although not described in detail, the resistance wiring portions 150 can be formed with a wiring structure having a fine line width using the method explained with reference to FIG. 31A through FIG. 38B.

Here, in order to simplify the explanation, a description has been provided for the case in which the resistance wiring portions are arranged in the second direction. However, it is not a necessity to use this configuration. The first and second directions may be swapped as well.

7.3 Operation and Effects of Embodiment 7

According to Embodiment 7, the contact resistance of the contact plugs connected with the contact wiring with a fine wiring width is lower, so that the contact area between the resistance wiring and contact wiring is larger. As a result, it is possible to decrease the parasitic resistance. In addition, the current flowing in the ninth wiring 39 and the tenth wiring 40 explained in Embodiment 7 is stable, so that this scheme is especially effective for the resistance elements for which delay should be taken into consideration and for the resistance elements for which dispersion in the current should be taken into consideration.

(Embodiment 8)

In the following, the semiconductor device related to Embodiment 8 will be explained. In the explanation of Embodiment 8, the contact layer of the various wirings explained previously with reference to Embodiment 2 through Embodiment 6 that can be used in the various voltage drivers of the voltage generating circuit 16-1 will be further explained. The basic components and the basic operation of the semiconductor storage device related to Embodiment 8 are the same as those of Embodiment 1 through Embodiment 6. Consequently, the features that have been explained with regard to Embodiment 1 through Embodiment 6 and the features that can be easily derived from Embodiment 1 through Embodiment 6 will not be explained again.

8.1 Shape of the Contact Plugs

Figure 44:
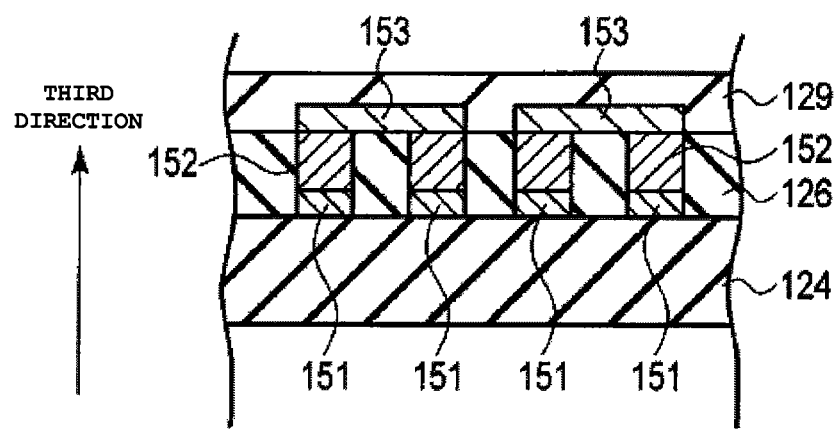
FIG. 44 is a schematic cross-sectional view illustrating the basic components of the contact layer according to an eighth embodiment.

In the following, the contact layers related to Embodiment 8 will be explained with reference to FIG. 44. FIG. 44 is a schematic cross-sectional view illustrating the basic components of the contact layer related to Embodiment 8.

As shown in FIG. 44, the resistance wiring portions 151 are formed on the insulating film 124. Here, the resistance wiring portions 151 are formed parallel in the first direction. On the resistance wiring portions 151 and the insulating film 124, the insulating film 126 is formed. In the insulating film 126 and on the end of the resistance wiring portions 125, contact plugs 152 are formed. Next, on the contact plugs 152, contact wiring 153 is formed. The insulating film 129 is formed on the contact wiring 153 and insulating film 126. The resistance wiring portions 151 correspond to the various resistance wirings explained with reference to Embodiment 2 through Embodiment 6.

Because the adjacent resistance wiring portions 151 are connected with each other by only the contact plugs 152, contact wiring 153 may not be formed on the contact plugs 152.

Figure 45:
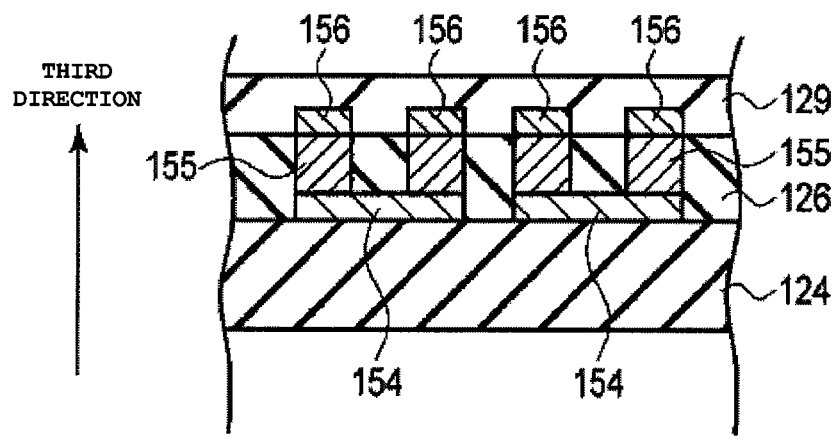
FIG. 45 is a schematic cross-sectional view illustrating the basic components of the contact layer of the eighth embodiment.

In the following, the contact layer related to Embodiment 8 will be explained with reference to FIG. 45. FIG. 45 is a schematic cross-sectional view illustrating the basic components of the contact layer related to Embodiment 8.

Also, as shown in FIG. 45, the contact wiring 154 is formed on the insulating film 124. On the contact wiring 154 and insulating film 124, the insulating film 126 is formed. In the insulating film 126 and on the contact wiring 130, the contact plugs 155 are formed. On the insulating film 126 and the contact plugs 155, two resistance wiring portions 156 are then formed. The resistance wiring portions 156 correspond to the various resistance wirings explained with reference to Embodiment 2 through Embodiment 6. The insulating film 129 is formed on the resistance wiring portions 156 and insulating film 126.

Because the adjacent resistance wiring portions 156 are connected with each other by only the contact plugs 155, the contact wiring 154 may be not formed.

8.2 Operation and Effects of Embodiment 8

According to Embodiment 8 explained above, two resistors formed by means of side wall processing are connected. As a result, compared with the contact plugs explained with reference to Embodiment 1 through Embodiment 6, the influence of the resistance of the contact plugs can be significantly reduced. Also, while the width of the resistance wiring by side wall processing is fine, contact plugs with a size larger than the wiring width of the resistance wiring are formed. As a result, even on the lithographic surface, merging can be carried out, and this is an advantage.

Modified examples, etc.

In addition, one may use combinations of the different embodiments. That is, the resistance elements described as various embodiments for use in the voltage generating circuit 16-1 can be combined for use.

According to Embodiment 1, the charge storage film 103 is cut and divided for each of the memory cell transistors MT in the second direction. However, it is not limited to the scheme. One may also use a scheme in which the memory cell transistors MT are connected with each other in the second direction.

There is no specific restriction on the methods for forming the various insulating films and the metal films. Various feed materials for the various insulating films and metal films may be used as long as the functions can be realized.

The extending direction of the resistance wirings may be either the first direction or the second direction.

When RIE is used to form the resistance wiring, it is possible to suppress dispersion in the wiring width and to reduce the dispersion in the resistance value. Consequently, this method is preferable.

The voltage generating circuit 16-1 may have a charge pump.

According to Embodiment 1, a silicon nitride film is used for the charge storage layer. However, it is not limited to this scheme. Various materials can be used as long as the electric charge can be stored.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a memory region including an array of memory cells connected via selection lines;
   a voltage generating circuit; and
   a control circuit that feeds a voltage generated by the voltage generating circuit to the memory region via selection lines;
   the voltage generating circuit including:
      a transistor with a gate electrode, a first terminal, and a second terminal, the transistor having a power supply voltage applied to the first terminal;
      a first resistance element with a first and a second end, the first resistance element connected on the first end to the second terminal of the transistor;
      a second resistance element with a third end and a fourth end, the third end being connected to the second end of the first resistance element and the fourth end being connected to a ground potential; and
      a comparator, having an inverted input terminal to which a reference potential is input and a non-inverted input terminal connected to a node between the second end of the first resistance element and the third end of the second resistance element, and configured to compare the reference potential with a potential at the node,
   the first resistance element and the second resistance element each comprising first and second conductive lines electrically interconnected by a U-shaped connector that is electrically connected to the first conductive line, a second conductive portion that is electrically connected to the second conductive line, and a third conductive portion that connects the first and second conductive portions.

2. The semiconductor memory device of claim 1, wherein the selection lines comprise bit lines, word lines, and source lines.

3. The semiconductor memory device of claim 2, wherein the first and second conductive lines have the same line width as the bit lines.

4. The semiconductor memory device of claim 1, wherein the first and second conductive lines are formed into loop structures, such that each end of the conductive lines are adjacent to one another.

5. The semiconductor memory device of claim 1, wherein the first and second resistance elements, each further comprise a plurality of conductive lines electrically connected in a zigzag pattern.

6. A method of fabricating a semiconductor device that includes a substrate, a memory region formed on the substrate, and peripheral circuits for supplying voltages to the memory region formed on the substrate, the peripheral circuits comprising one or more resistance elements, said method comprising a process of forming the resistance elements by:
   forming a first conductive line in a plane parallel with the substrate;
   forming a second conductive line in the plane of the first conductive line, the first and the second conductive lines being substantially parallel to each other;
   forming contact plugs on each end of the first and second conductive lines, such that a first contact plug is formed on one end of the first conductive line and a second contact plug is formed on one end of the second conductive line; and
   forming a contact wiring element, which bridges the first and second contact plug such that electrical connection is made between the first and second conductive lines,
   wherein the other end of the first conductive line is connected to a third conductive line that is substantially parallel to the first conductive line, and the other end of the second conductive line is connected to a fourth conductive line that is substantially parallel to the second conductive line.

7. The method of claim 6, wherein the first and the second conductive lines are formed using a thinning sidewall method.

8. The method of claim 6, wherein the first and the second conductive lines are formed at the same time.

9. The method of claim 6, wherein the first and the second conductive lines have the same line width.

10. The method of claim 6, wherein the first and second conductive lines are formed in a layer above the contact wiring element.

11. The method of claim 6, wherein the first and second conductive lines, the contact plugs, and the contact wiring element form a zig-zag shaped conductive path.

12. The method of claim 6, wherein the third and fourth conductive lines are U-shaped.

13. The method of claim 12, wherein the first to the fourth conductive lines are formed on the substrate via an insulating film.

14. A semiconductor memory device comprising:
- a memory region including an array of memory cells connected via selection lines;
- a first resistance element having first and second ends, and comprising first and second conductive lines disposed in a common plane and electrically interconnected by a U-shaped connector;
- a second resistance element having third and fourth ends, and comprising third and fourth conductive lines disposed in a common plane and electrically interconnected by a U-shaped connector;
- a first conductive portion that projects out of the common plane and is electrically connected to the first end of the first resistance element;
- a second conductive portion that projects out of the common plane and electrically connected to the second end of the second resistance element; and
- a third conductive portion that connects the first and second conductive portions.

15. The semiconductor memory device according to claim 14, wherein the first and the second conductive lines have a same line width.

16. The semiconductor memory device of claim 14, wherein the first and second conductive lines comprise polysilicon.

17. The semiconductor memory e device of claim 14, wherein the first and second resistance elements are positioned on an insulating film.

18. The semiconductor memory device of claim 16, wherein the first and second resistance elements are positioned on an insulating film.

\* \* \* \* \*